(12) United States Patent
Cho et al.

(10) Patent No.: US 12,328,921 B2
(45) Date of Patent: Jun. 10, 2025

(54) SEMICONDUCTOR DEVICE AND METHOD OF FABRICATING THE SAME

(71) Applicant: Samsung Electronics Co., Ltd., Suwon-si (KR)

(72) Inventors: Namkyu Cho, Yongin-si (KR); Sanggil Lee, Ansan-si (KR); Seokhoon Kim, Suwon-si (KR); Pankwi Park, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 511 days.

(21) Appl. No.: 17/874,945

(22) Filed: Jul. 27, 2022

(65) Prior Publication Data
US 2023/0207626 A1 Jun. 29, 2023

(30) Foreign Application Priority Data
Dec. 28, 2021 (KR) .......................... 10-2021-0189492

(51) Int. Cl.
| | |
|---|---|
| *H10D 62/13* | (2025.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ......... *H10D 62/151* (2025.01); *H10D 30/014* (2025.01); *H10D 30/43* (2025.01); *H10D 30/6735* (2025.01); *H10D 30/6741* (2025.01); *H10D 30/6757* (2025.01); *H10D 62/121* (2025.01); *H10D 64/01* (2025.01); *H10D 64/258* (2025.01); *H10D 84/0167* (2025.01);

(Continued)

(58) Field of Classification Search
CPC ..... H10D 62/151; H10D 30/014; H10D 30/43
See application file for complete search history.

(56) References Cited

U.S. PATENT DOCUMENTS

| | | |
|---|---|---|
| 6,831,292 B2 | 12/2004 | Currie et al. |
| 8,815,713 B2 | 8/2014 | Sung et al. |

(Continued)

FOREIGN PATENT DOCUMENTS

| | | | | |
|---|---|---|---|---|
| CN | 113130629 A | * | 7/2021 | ..... H01L 21/823412 |
| CN | 220121843 U | * | 12/2023 | ......... H01L 29/0673 |

(Continued)

*Primary Examiner* — Laura M Menz
(74) *Attorney, Agent, or Firm* — HARNESS, DICKEY & PIERCE, P.L.C.

(57) ABSTRACT

A semiconductor device may include a substrate including center and edge regions, active patterns on the substrate, channel patterns on the active patterns, source/drain patterns connected to the channel patterns, and gate electrodes on the channel patterns. Each of the source/drain patterns may include a buffer layer in contact with a corresponding one of the channel patterns and a main layer on the buffer layer. The main layer of each of the source/drain patterns may include first and second semiconductor layers, which may be sequentially stacked and contain germanium. A concentration of the germanium in the first semiconductor layer may be higher on the center region than on the edge region, and a concentration of the germanium in the second semiconductor layer may be lower on the center region than on the edge region.

20 Claims, 43 Drawing Sheets

(51) Int. Cl.
*H10D 64/01* (2025.01)
*H10D 64/23* (2025.01)
*H10D 84/01* (2025.01)
*H10D 84/03* (2025.01)
*H10D 84/85* (2025.01)

(52) U.S. Cl.
CPC ......... *H10D 84/017* (2025.01); *H10D 84/038* (2025.01); *H10D 84/85* (2025.01)

(56) References Cited

U.S. PATENT DOCUMENTS

| | | | |
|---|---|---|---|
| 8,828,850 | B2 | 9/2014 | Cheng et al. |
| 8,907,426 | B2 | 12/2014 | Shin et al. |
| 9,391,201 | B2 | 7/2016 | Huang et al. |
| 9,761,719 | B2* | 9/2017 | Kim ............... H10D 64/256 |
| 10,008,420 | B2 | 6/2018 | Zhou et al. |
| 10,008,600 | B2 | 6/2018 | Kim et al. |
| 11,367,784 | B2* | 6/2022 | More ............. H10D 64/017 |
| 11,393,898 | B2* | 7/2022 | Kuan ............. H10D 64/018 |
| 11,482,602 | B2* | 10/2022 | Song ............. H10D 84/017 |
| 11,688,778 | B2* | 6/2023 | Ha ............... H10D 62/151 |
| | | | 257/76 |
| 11,888,026 | B2* | 1/2024 | Choi ............. H10D 30/43 |
| 12,009,398 | B2* | 6/2024 | Song ............. H01L 23/5226 |
| 12,027,596 | B2* | 7/2024 | Ha ............... H10D 62/235 |
| 12,119,394 | B2* | 10/2024 | More ............. H01L 21/30604 |
| 12,148,794 | B2* | 11/2024 | Kuan ............. H10D 30/6735 |
| 12,154,988 | B2* | 11/2024 | Jung ............. H10D 64/017 |
| 12,159,911 | B2* | 12/2024 | Kim ............... H10D 30/031 |
| 2009/0258463 | A1 | 10/2009 | Kim et al. |
| 2014/0299918 | A1 | 10/2014 | Lee et al. |
| 2018/0366373 | A1 | 12/2018 | Li et al. |
| 2019/0067490 | A1* | 2/2019 | Yang ............. B82Y 10/00 |
| 2019/0081155 | A1* | 3/2019 | Xie ............... H10D 30/014 |
| 2020/0381547 | A1* | 12/2020 | Song ............. H10D 30/6757 |
| 2020/0381564 | A1* | 12/2020 | Kang ............. H10D 64/017 |
| 2020/0395482 | A1* | 12/2020 | Song ............. H10D 30/43 |
| 2021/0036122 | A1* | 2/2021 | Wong ............. H01L 21/764 |
| 2021/0098302 | A1* | 4/2021 | Ju ............... H10D 84/013 |
| 2021/0217860 | A1* | 7/2021 | Ha ............... H10D 30/43 |
| 2021/0217861 | A1* | 7/2021 | Song ............. H01L 23/5226 |
| 2021/0273047 | A1* | 9/2021 | Kuan ............. H10D 62/151 |
| 2021/0313322 | A1* | 10/2021 | Shin ............. H10D 62/121 |
| 2021/0391450 | A1* | 12/2021 | More ............. H10D 62/121 |
| 2022/0157969 | A1* | 5/2022 | Yin ............... H10D 30/6735 |
| 2022/0190109 | A1* | 6/2022 | Choi ............. H10D 30/014 |
| 2022/0320321 | A1* | 10/2022 | More ............. H10D 62/60 |
| 2022/0328621 | A1* | 10/2022 | Kuan ............. H10D 62/115 |
| 2022/0359678 | A1* | 11/2022 | Kim ............... H10D 30/6713 |
| 2022/0367622 | A1* | 11/2022 | Lin ............... H10D 30/6713 |
| 2022/0416082 | A1* | 12/2022 | Jung ............. H10D 64/251 |
| 2023/0011401 | A1* | 1/2023 | Song ............. H10D 84/0186 |
| 2023/0111579 | A1* | 4/2023 | Ha ............... H10D 30/6735 |
| | | | 257/30 |
| 2023/0135806 | A1* | 5/2023 | Kim ............... H10D 30/6729 |
| | | | 257/351 |
| 2023/0207626 | A1* | 6/2023 | Cho ............... H10D 64/256 |
| | | | 257/30 |
| 2023/0215930 | A1* | 7/2023 | Chung ........... H10D 84/85 |
| | | | 257/30 |
| 2023/0261090 | A1* | 8/2023 | Liaw ............. H10D 30/6735 |
| 2023/0268412 | A1* | 8/2023 | Jung ............. H10D 84/834 |
| | | | 257/288 |
| 2023/0326985 | A1* | 10/2023 | Ha ............... H10D 64/257 |
| | | | 257/76 |
| 2023/0386971 | A1* | 11/2023 | Yu ............... H01L 23/485 |
| 2023/0411478 | A1* | 12/2023 | Kao ............. H10D 30/014 |
| 2024/0006313 | A1* | 1/2024 | Anderson ......... H10D 62/121 |
| 2024/0006485 | A1* | 1/2024 | Yoon ............. H10D 62/121 |
| 2024/0072117 | A1* | 2/2024 | Kim ............... H10D 62/121 |
| 2024/0096945 | A1* | 3/2024 | Choi ............. H10D 62/151 |
| 2024/0113163 | A1* | 4/2024 | Kim ............... H10D 64/62 |
| 2024/0136425 | A1* | 4/2024 | Cho ............. H10D 64/017 |
| 2024/0145345 | A1* | 5/2024 | Kim ............... H10D 30/6735 |
| 2024/0162311 | A1* | 5/2024 | Oh ............... H10D 30/014 |
| 2024/0170372 | A1* | 5/2024 | Lee ............. H10D 62/121 |
| 2024/0178230 | A1* | 5/2024 | Hwang ........... H10D 84/0135 |
| 2024/0203989 | A1* | 6/2024 | Kim ............... H10D 30/6735 |
| 2024/0204068 | A1* | 6/2024 | Na ............... H10D 30/6735 |
| 2024/0234541 | A9* | 7/2024 | Cho ............. H10D 62/121 |
| 2024/0234551 | A1* | 7/2024 | Park ............. H10D 84/0109 |
| 2024/0250000 | A1* | 7/2024 | Yim ............. H10D 62/822 |
| 2024/0250001 | A1* | 7/2024 | Tang ............. H10D 64/258 |
| 2024/0266256 | A1* | 8/2024 | Lee ............. H10D 62/364 |
| 2024/0266402 | A1* | 8/2024 | Kim ............... H10D 62/151 |
| 2024/0297232 | A1* | 9/2024 | Song ............. H10D 84/038 |
| 2024/0312914 | A1* | 9/2024 | Seo ............. H01L 21/76898 |
| 2024/0332358 | A1* | 10/2024 | Cha ............. H01L 23/535 |
| 2024/0355883 | A1* | 10/2024 | Yoo ............. H10D 62/121 |
| 2024/0363701 | A1* | 10/2024 | Yoo ............. H10D 84/0167 |
| 2024/0363753 | A1* | 10/2024 | Li ............... H10D 84/0193 |
| 2024/0371982 | A1* | 11/2024 | More ............. H10D 84/038 |
| 2024/0379409 | A1* | 11/2024 | Jeon ............. H10D 64/018 |
| 2024/0413161 | A1* | 12/2024 | Kim ............... H10D 84/907 |
| 2025/0006830 | A1* | 1/2025 | Yoo ............. H01L 23/5286 |
| 2025/0015129 | A1* | 1/2025 | Kuan ............. H10D 30/6735 |
| 2025/0048696 | A1* | 2/2025 | Kim ............... H10D 30/014 |
| 2025/0048699 | A1* | 2/2025 | Kim ............... H10D 64/514 |

FOREIGN PATENT DOCUMENTS

| | | | | |
|---|---|---|---|---|
| CN | 112349716 B | * | 7/2024 | ....... H01L 21/02123 |
| KR | 2005/0024669 A | | 3/2005 | |
| KR | 101409374 B1 | | 6/2014 | |
| KR | 2014/0122328 A | | 10/2014 | |
| KR | 102034262 B1 | | 10/2019 | |
| KR | 102216511 B1 | | 2/2021 | |

\* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0189492, filed on Dec. 28, 2021, in the Korean Intellectual Property Office, the entire contents of which are hereby incorporated by reference.

BACKGROUND

The present disclosure relates to a semiconductor device and/or a method of fabricating the same, and in particular, to a semiconductor device including a field effect transistor and/or a method of fabricating the same.

A semiconductor device may include an integrated circuit containing metal-oxide-semiconductor field-effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations associated with the scale-down of the semiconductor device and to realize the semiconductor devices with high performance.

SUMMARY

An embodiment of inventive concepts provides a semiconductor device with improved electric characteristics.

An embodiment of inventive concepts provides a method of fabricating a semiconductor device with improved electric characteristics.

According to an embodiment of inventive concepts, a semiconductor device may include a substrate including a center region and an edge region, a first active pattern on the center region and a second active pattern on the edge region, a first channel pattern on the first active pattern and a second channel pattern on the second active pattern, a first source/drain pattern connected to the first channel pattern and a second source/drain pattern connected to the second channel pattern, and a first gate electrode on the first channel pattern and a second gate electrode on the second channel pattern. Each of the first source/drain pattern and the second source/drain pattern may include a buffer layer and a main layer on the buffer layer. The buffer layer of the first source/drain pattern may be in contact with the first channel pattern and the buffer layer of the second source/drain pattern may be in contact with the second channel pattern. In each of the first source/drain pattern and the second source/drain pattern, the main layer may include a first semiconductor layer and a second semiconductor layer on the first semiconductor layer, and the first semiconductor layer and the second semiconductor layer may contain germanium. A concentration of germanium in the first semiconductor layer on the center region may be higher than a concentration of germanium in the first semiconductor layer on the edge region, and a concentration of germanium in the second semiconductor layer on the center region may be lower than a concentration of germanium in the second semiconductor layer on the edge region.

According to an embodiment of inventive concepts, a semiconductor device may include a substrate including a center region and an edge region, a first active pattern on the center region and a second active pattern on the edge region, a first channel pattern on the first active pattern and a second channel pattern on the second active pattern, a first source/drain pattern and a second source/drain pattern, and a gate electrode. The first channel pattern and the second channel pattern each may include a plurality of semiconductor patterns vertically stacked on each other and spaced apart from each other. The first source/drain pattern may be connected to the plurality of semiconductor patterns of the first active pattern and the second source/drain pattern may be connected to the plurality of semiconductor patterns of the second active pattern. Each of the first source/drain pattern and the second source/drain pattern may include a buffer layer and a main layer on the buffer layer. The buffer layer of the first source/drain pattern may be in contact with the first channel pattern and the buffer layer of the second source/drain pattern may be in contact with the second channel pattern. The main layer of each of the first source/drain pattern and the second source/drain pattern may include a first semiconductor layer and a second semiconductor layer on the first semiconductor layer. The first semiconductor layer and the second semiconductor layer may contain germanium. A concentration of germanium in the first semiconductor layer on the center region may be lower than a concentration of the germanium in the first semiconductor layer on the edge region. A concentration of germanium in the second semiconductor layer on the center region may be higher than a concentration of germanium in the second semiconductor layer on the edge region. The gate electrode may be on the plurality of semiconductor patterns in a corresponding one of the first channel pattern and the second channel pattern. The gate electrode may include a plurality of portions respectively provided between the plurality of semiconductor patterns in the corresponding one of the first channel pattern and the second channel pattern.

According to an embodiment of inventive concepts, a method of fabricating a semiconductor device may include forming a stacking pattern on a substrate, the substrate including a center region and an edge region, the stacking pattern including active layers and sacrificial layers that are alternately stacked; forming a sacrificial pattern on the stacking pattern; forming a recess in the stacking pattern by etching the stacking pattern adjacent to one side of the sacrificial pattern; forming a source/drain pattern in the recess, the forming the source/drain pattern including forming a buffer layer on an inner surface of the recess, forming a first semiconductor layer by performing a first selective epitaxial growth (SEG) process on the buffer layer, and forming a second semiconductor layer by performing a second SEG process on the first semiconductor layer; and replacing the sacrificial pattern and the sacrificial layers with a gate electrode. A concentration of germanium in the first semiconductor layer may be higher on the center region than on the edge region, and a concentration of germanium of the second semiconductor layer may be lower on the center region than on the edge region.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Example embodiments of inventive concepts will now be described more fully with reference to the accompanying drawings, in which example embodiments are shown.

Figure 1:
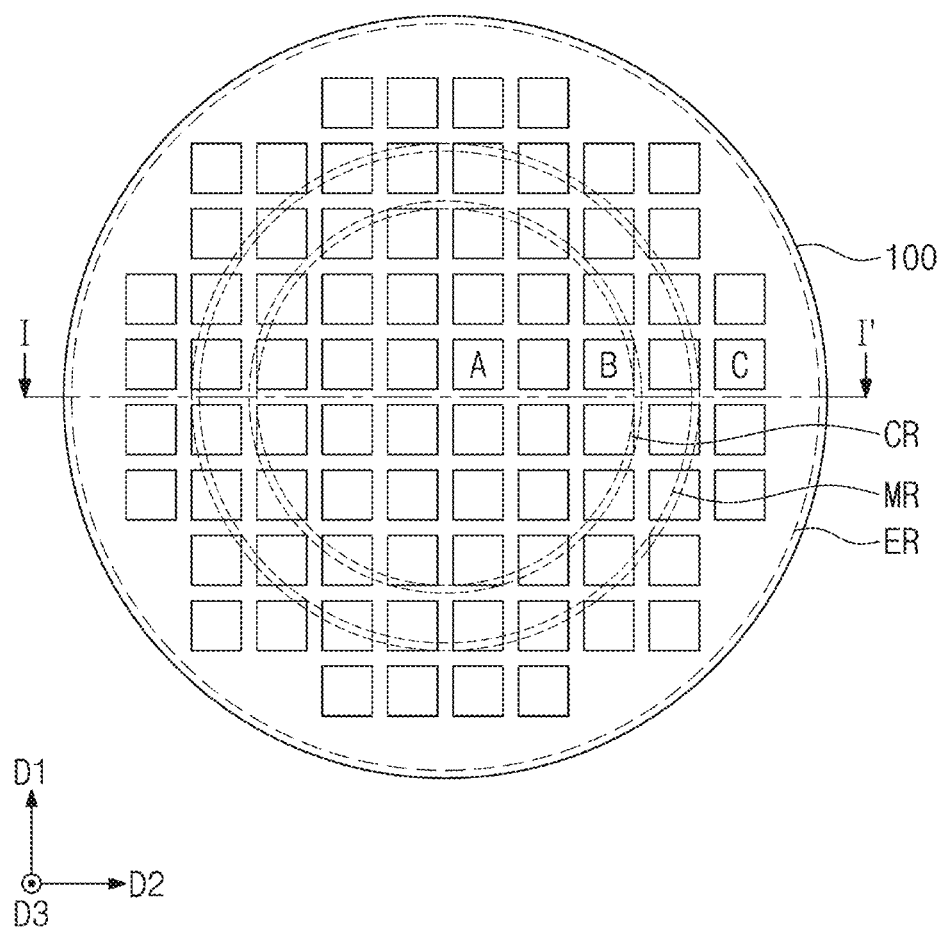
FIG. 1 is a plan view illustrating semiconductor chips arranged on a substrate.

FIG. 1 is a plan view illustrating semiconductor chips arranged on a substrate.

Referring to FIG. 1 a substrate 100 may be a semiconductor substrate, which is formed of or incudes silicon, germanium (Ge), silicon-germanium (Ge), or a compound semiconductor material. As an example, the substrate 100 may have a circular shape. A diameter of the circular substrate 100 may range from 50 mm to 300 mm, but is not limited thereto.

A center region CR, a middle region MR, and an edge region ER may be defined on the substrate 100. The center region CR may be placed to include a center of the substrate 100. The center region CR may have a circular shape, and a center of the center region CR may be vertically overlapped with the center of the substrate 100. The edge region ER may be placed in an outer edge of the substrate 100. The edge region ER may have a doughnut shape, and an edge of the edge region ER may be vertically overlapped with an edge of the substrate 100. The middle region MR may be disposed between the center region CR and the edge region ER. The middle region MR may have a doughnut shape and may be a region of the substrate 100 excluding the center region CR and the edge region ER.

Semiconductor chips may include first to third semiconductor chips A, B, and C. The first semiconductor chips A may be provided on the center region CR of the substrate 100. The second semiconductor chips B may be provided on the middle region MR of the substrate 100. The third semiconductor chips C may be provided on the edge region ER of the substrate 100. The first to third semiconductor chips A, B, and C may be arranged in a first direction D1 and a second direction D2. The first and second directions D1 and D2 may not be parallel to each other.

Each of the first to third semiconductor chips A, B, and C may include logic cells of a semiconductor device according to an embodiment of inventive concepts. Hereinafter, examples of the logic cells of the semiconductor device will be described in more detail.

Figure 2:
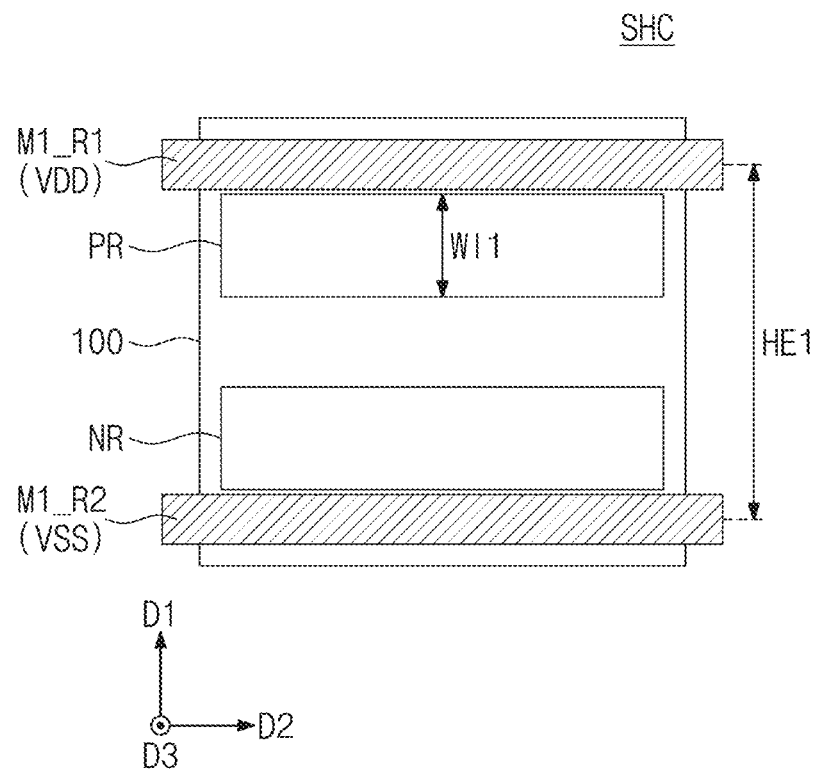
FIGS. 2 to 4 are conceptual diagrams illustrating logic cells of a semiconductor device according to an embodiment of inventive concepts.
Figure 3:
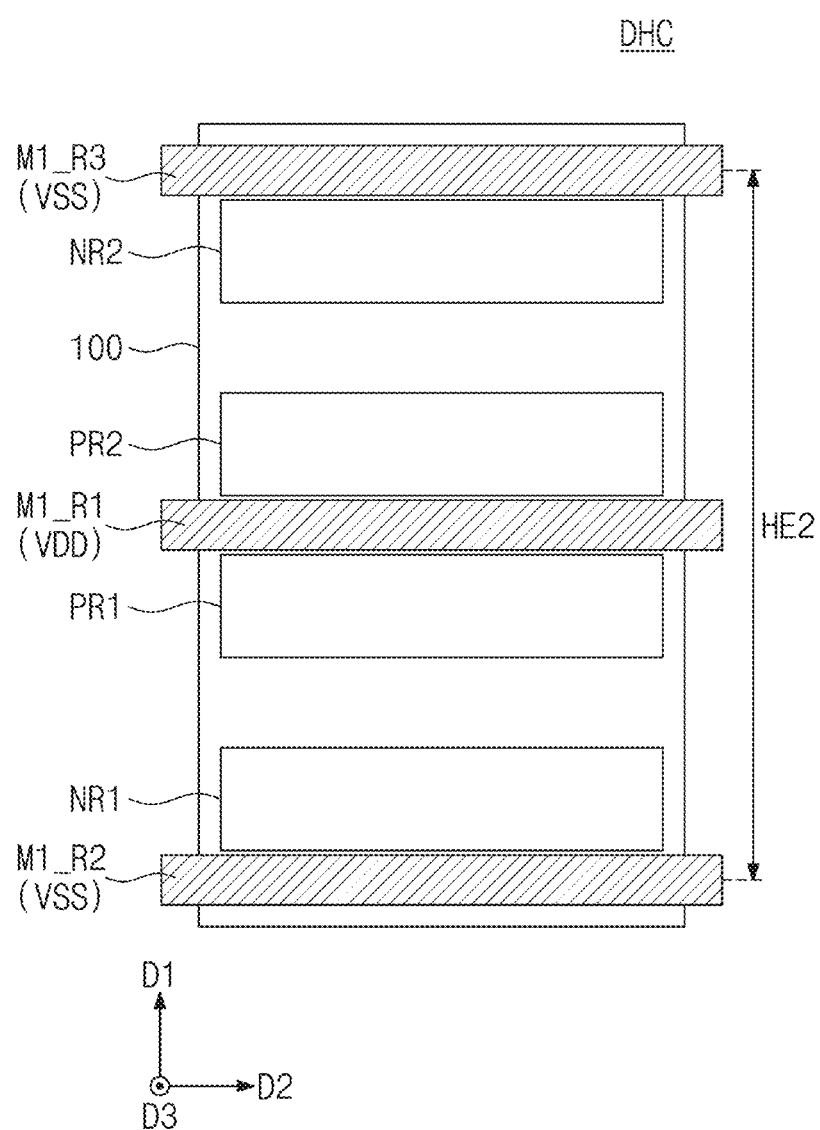
Figure 4:
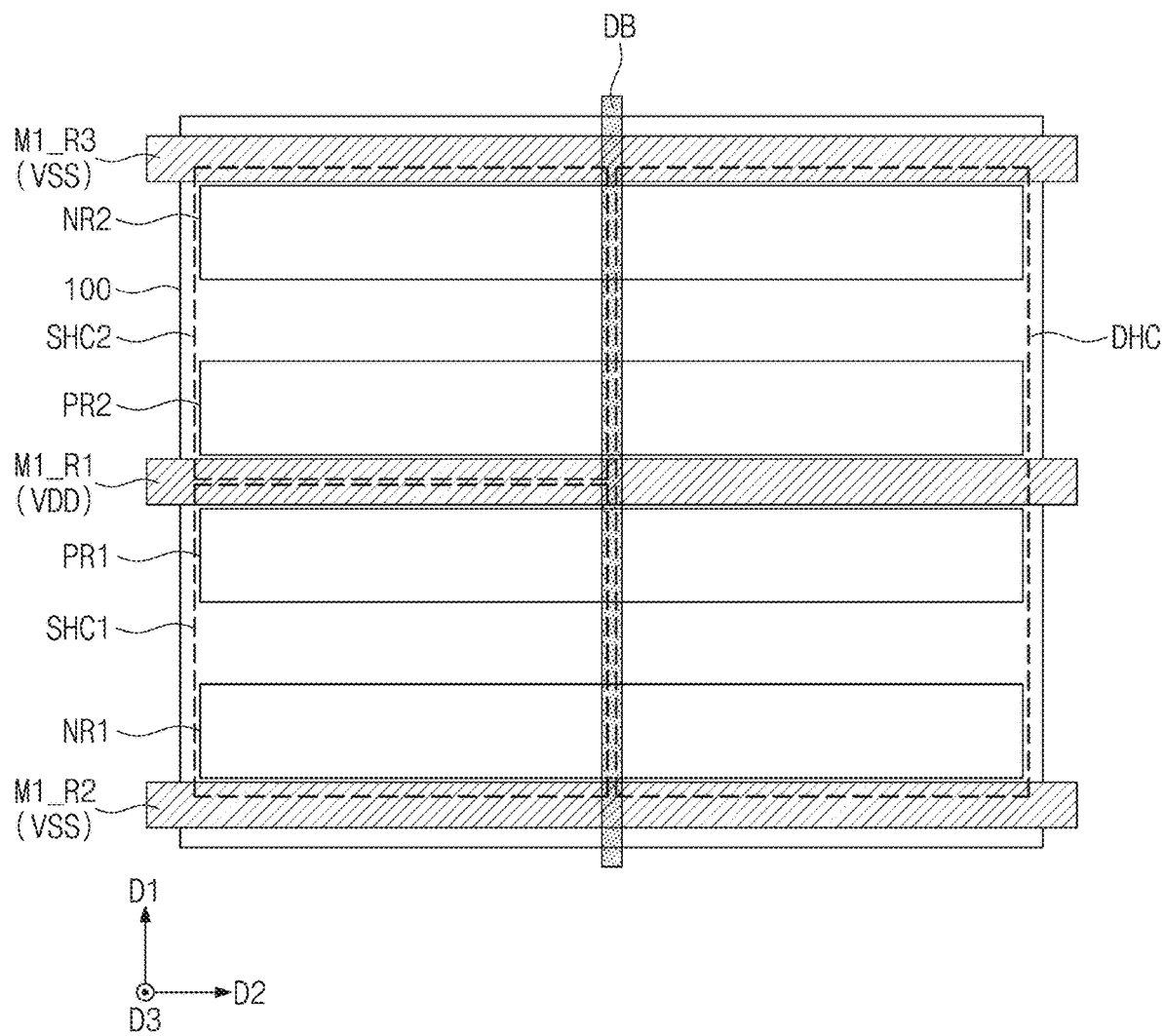

FIGS. 2 to 4 are conceptual diagrams illustrating logic cells of a semiconductor device according to an embodiment of inventive concepts.

Referring to FIG. 2, a single height cell SHC may be provided. In detail, a first power line M1_R1 and a second power line M1_R2 may be provided on a substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The single height cell SHC may be defined between the first power line M1_R1 and the second power line M1_R2. The single height cell SHC may include one PMOSFET region PR and one NMOSFET region NR. In other words, the single height cell SHC may have a CMOS structure provided between the first and second power lines M1_R1 and M1_R2.

Each of the PMOSFET and NMOSFET regions PR and NR may have a first width WI1 in a first direction D1. A length of the single height cell SHC in the first direction D1 may be defined as a first height HE1. The first height HE1 may be substantially equal to a distance (e.g., a pitch) between the first and second power lines M1_R1 and M1_R2.

The single height cell SHC may constitute a single logic cell. In the present specification, the logic cell may mean a logic device (e.g., AND, OR, XOR, XNOR, inverter, and so forth), which is configured to execute a specific function. In other words, the logic cell may include transistors constituting the logic device and interconnection lines connecting transistors to each other.

Referring to FIG. 3, a double height cell DHC may be provided. In detail, the first power line M1_R1, the second power line M1_R2, and a third power line M1_R3 may be provided on the substrate 100. The first power line M1_R1 may be disposed between the second power line M1_R2 and the third power line M1_R3. The third power line M1_R3 may be a conduction path, to which the drain voltage VDD is provided.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. When viewed in a plan view, the first power line M1_R1 may be disposed between the first and second PMOSFET regions PR1 and PR2.

A length of the double height cell DHC in the first direction D1 may be defined as a second height HE2. The second height HE2 may be about two times the first height HE1 of FIG. 2. The first and second PMOSFET regions PR1 and PR2 of the double height cell DHC may be combined to constitute as a single PMOSFET region.

Thus, a channel size of a PMOS transistor of the double height cell DHC may be greater than a channel size of a PMOS transistor of the single height cell SHC previously described with reference to FIG. 2. For example, the channel size of the PMOS transistor of the double height cell DHC may be about two times the channel size of the PMOS transistor of the single height cell SHC. In this case, the double height cell DHC may be operated at a higher speed than the single height cell SHC. In an embodiment, the double height cell DHC shown in FIG. 3 may be defined as a multi-height cell. Although not shown, the multi-height cell may include a triple height cell whose cell height is about three times that of the single height cell SHC.

Referring to FIG. 4, a first single height cell SHC1, a second single height cell SHC2, and the double height cell DHC may be two-dimensionally disposed on the substrate 100. The first single height cell SHC1 may be disposed between the first and second power lines M1_R1 and M1_R2. The second single height cell SHC2 may be disposed between the first and third power lines M1_R1 and M1_R3. The second single height cell SHC2 may be adjacent to the first single height cell SHC1 in the first direction D1.

The double height cell DHC may be disposed between the second and third power lines M1_R2 and M1_R3. The double height cell DHC may be adjacent to the first and second single height cells SHC1 and SHC2 in a second direction D2.

A division structure DB may be provided between the first single height cell SHC1 and the double height cell DHC and between the second single height cell SHC2 and the double height cell DHC. The active region of the double height cell DHC may be electrically separated from the active region of each of the first and second single height cells SHC1 and SHC2 by the division structure DB.

Figure 5:
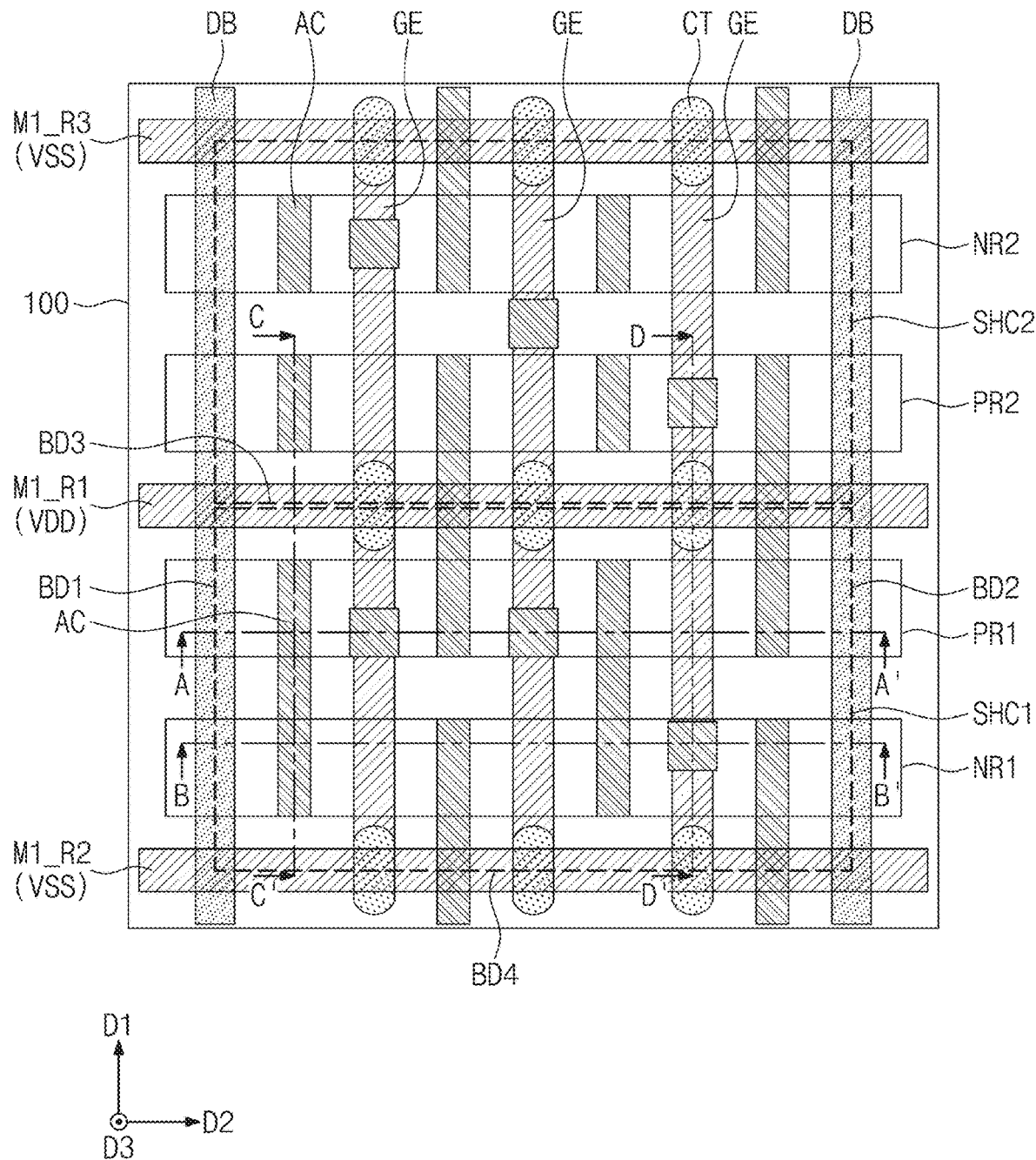
FIG. 5 is a plan view illustrating a semiconductor device that is included in each of semiconductor chips according to an embodiment of inventive concepts.

FIG. 5 is a plan view illustrating a semiconductor device that is included in each of semiconductor chips according to an embodiment of inventive concepts. FIGS. 6A to 6D are sectional views, which are respectively taken along lines A-A', B-B', C-C', and D-D' of FIG. 5.

Referring to FIGS. 5 and 6A to 6D, the first and second single height cells SHC1 and SHC2 may be provided on the substrate 100. Logic transistors constituting the logic circuit may be disposed on each of the first and second single height cells SHC1 and SHC2. The substrate 100 may be a semiconductor substrate that is formed of or includes silicon, germanium, silicon germanium, a compound semiconductor material, or the like. In an embodiment, the substrate 100 may be a silicon wafer.

The substrate 100 may include the first PMOSFET region PR1, the second PMOSFET region PR2, the first NMOSFET region NR1, and the second NMOSFET region NR2. Each of the first PMOSFET region PR1, the second PMOSFET region PR2, the first NMOSFET region NR1, and the second NMOSFET region NR2 may be extended in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR, which is formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may be extended in the second direction D2. Each of the first and second active patterns AP1 and AP2 may be a vertically-protruding portion of the substrate 100.

A device isolation layer ST may be provided to fill the trench TR. The device isolation layer ST may include a silicon oxide layer. The device isolation layer ST may not cover first and second channel patterns CH1 and CH2 to be described below.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (e.g., a third direction D3).

Each of the first to third semiconductor patterns SP1, SP2, and SP3 may be formed of or include at least one of silicon (Si), germanium (Ge), or silicon germanium (SiGe). For example, each of the first to third semiconductor patterns SP1, SP2, and SP3 may be formed of or include crystalline silicon.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3. In another embodiment, a top surface of at least one of the first and second source/drain patterns SD1 and SD2 may be located at substantially the same level as the top surface of the third semiconductor pattern SP3.

The first source/drain patterns SD1 may include a semiconductor material (e.g., SiGe) whose lattice constant is greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

Each of the first source/drain patterns SD1 may include a buffer layer BFL and a main layer MAL on the buffer layer BFL. Hereinafter, a sectional shape of the first source/drain pattern SD1 in the second direction D2 will be described in more detail with reference to FIG. 6A.

The buffer layer BFL may cover an inner surface of the first recess RS1. In an embodiment, the buffer layer BFL may have a decreasing thickness in an upward direction. For example, a thickness of the buffer layer BFL, which is measured in the third direction D3 on a bottom of the first recess RS1, may be larger than a thickness of the buffer layer BFL, which is measured in the second direction D2 at a top level of the first recess RS1. In addition, the buffer layer BFL may have a 'U'-shaped section along a profile of the first recess RS1.

A side surface of the buffer layer BFL may have an uneven or embossing shape. For example, the side surface of the buffer layer BFL may have a wavy profile. In detail, the side surface of the buffer layer BFL may have portions, which protrude toward first to third portions PO1, PO2, and PO3 of a gate electrode GE, which will be described below, and thus may have the wavy profile.

The main layer MAL may fill most of an unfilled region of the first recess RS1 covered with the buffer layer BFL. A volume of the main layer MAL may be larger than a volume of the buffer layer BFL. That is, a ratio of the volume of the main layer MAL to a total volume of the first source/drain pattern SD1 may be greater than a ratio of the volume of the buffer layer BFL to a total volume of the first source/drain pattern SD1.

Each of the buffer and main layers BFL and MAL may be formed of or include silicon germanium (SiGe). In detail, the buffer layer BFL may contain a relatively low concentration of germanium (Ge). In another embodiment, the buffer layer BFL may contain only silicon (Si), without germanium (Ge). A germanium concentration of the buffer layer BFL may range from 0 at % to 10 at %. For example, in some embodiments, the germanium concentration of the buffer layer BFL may range from 2 at % to 8 at %.

The main layer MAL may contain a relatively high concentration of germanium. In an embodiment, the germanium concentration of the main layer MAL may range from 30 at % to 70 at %. A spatial variation in the germanium concentration of the main layer MAL will be described in more detail with reference to FIG. 7B.

Each of the buffer and main layers BFL and MAL may contain impurities allowing for the first source/drain pattern SD1 to have a p-type conductivity. For example, the impurities may include boron, gallium, or indium atoms. The impurity concentration of each of the buffer and main layers BFL and MAL may range from 1E18 atoms/cm$^3$ to 5E22 atoms/cm$^3$. The impurity concentration of the main layer MAL may be higher than the impurity concentration of the buffer layer BFL. Spatial variations in the germanium and impurity concentrations of the main layer MAL will be described in more detail with reference to FIGS. 7B, 8B, and 9B.

The buffer layer BFL may limit and/or prevent a stacking fault between the substrate 100 (e.g., the first active pattern AP1) and the main layer MAL and between the first to third semiconductor patterns SP1, SP2, and SP3 and the main layer MAL. The stacking fault may lead to an increase of a channel resistance. The stacking fault may easily occur on the bottom of the first recess RS1. Thus, to limit and/or prevent the stacking fault, the buffer layer BFL may be provided to have a relatively large thickness near the bottom of the first recess RS1.

The buffer layer BFL may protect the main layer MAL from a process of replacing sacrificial layers SAL, which will be described below, with the first to third portions PO1, PO2, and PO3 of the gate electrode GE. For example, the buffer layer BFL may limit and/or prevent an etchant material, which is used to remove the sacrificial layers SAL, from entering and etching the main layer MAL.

Referring back to FIGS. 5 and 6A to 6D, the gate electrodes GE may be provided to extend in the first direction D1 and to cross the first and second channel patterns CH1 and CH2. The gate electrodes GE may be arranged at a first pitch in the second direction D2. Each of the gate electrodes GE may be vertically overlapped with the first and second channel patterns CH1 and CH2.

The gate electrode GE may include a first portion PO1 interposed between the active pattern AP1 or AP2 and the first semiconductor pattern SP1, a second portion PO2 interposed between the first and second semiconductor patterns SP1 and SP2, a third portion PO3 interposed between the second and third semiconductor patterns SP2 and SP3, and a fourth portion PO4 on the third semiconductor pattern SP3.

Referring back to FIG. 6A, each of the first to third portions PO1, PO2, and PO3 of the gate electrode GE on the PMOSFET region PR may have a concave side surface. The concave side surfaces of the first to third portions PO1, PO2, and PO3 may correspond to protruding portions of the side surface of the first source/drain pattern SD1. The first to third portions PO1, PO2, and PO3 of the gate electrode GE on the PMOSFET region PR may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 6D, the gate electrode GE may be provided on a top surface TS, a bottom surface BS, and opposite side surfaces SW of each of the first to third semiconductor patterns SP1, SP2, and SP3. That is, the transistor according to the present embodiment may be a three-dimensional field effect transistor (e.g., MBCFET or GAAFET) in which the gate electrode GE is provided to three-dimensionally surround the channel pattern.

Referring back to FIGS. 5 and 6A to 6D, the first single height cell SHC1 may have a first border BD1 and a second border BD2, which are opposite to each other in the second direction D2. The first and second borders BD1 and BD2 may be extended in the first direction D1. The first single height cell SHC1 may have a third border BD3 and a fourth border BD4, which are opposite to each other in the first direction D1. The third and fourth borders BD3 and BD4 may be extended in the second direction D2.

Gate cutting patterns CT may be disposed on a border, which is parallel to the second direction D2, of each of the first and second single height cells SHC1 and SHC2. For example, the gate cutting patterns CT may be disposed on the third and fourth borders BD3 and BD4 of the first single height cell SHC1. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be overlapped with the gate electrodes GE, respectively. The gate cutting patterns CT may be formed of or include at least one of insulating materials (e.g., silicon oxide, silicon nitride, or combinations thereof).

The gate electrode GE on the first single height cell SHC1 may be separated from the gate electrode GE on the second single height cell SHC2 by the gate cutting pattern CT. The gate cutting pattern CT may be interposed between the gate electrodes GE on the first and second single height cells SHC1 and SHC2 which are aligned to each other in the first direction D1. That is, the gate electrode GE extending in the first direction D1 may be divided into a plurality of the gate electrodes GE by the gate cutting patterns CT.

Figure 7A:
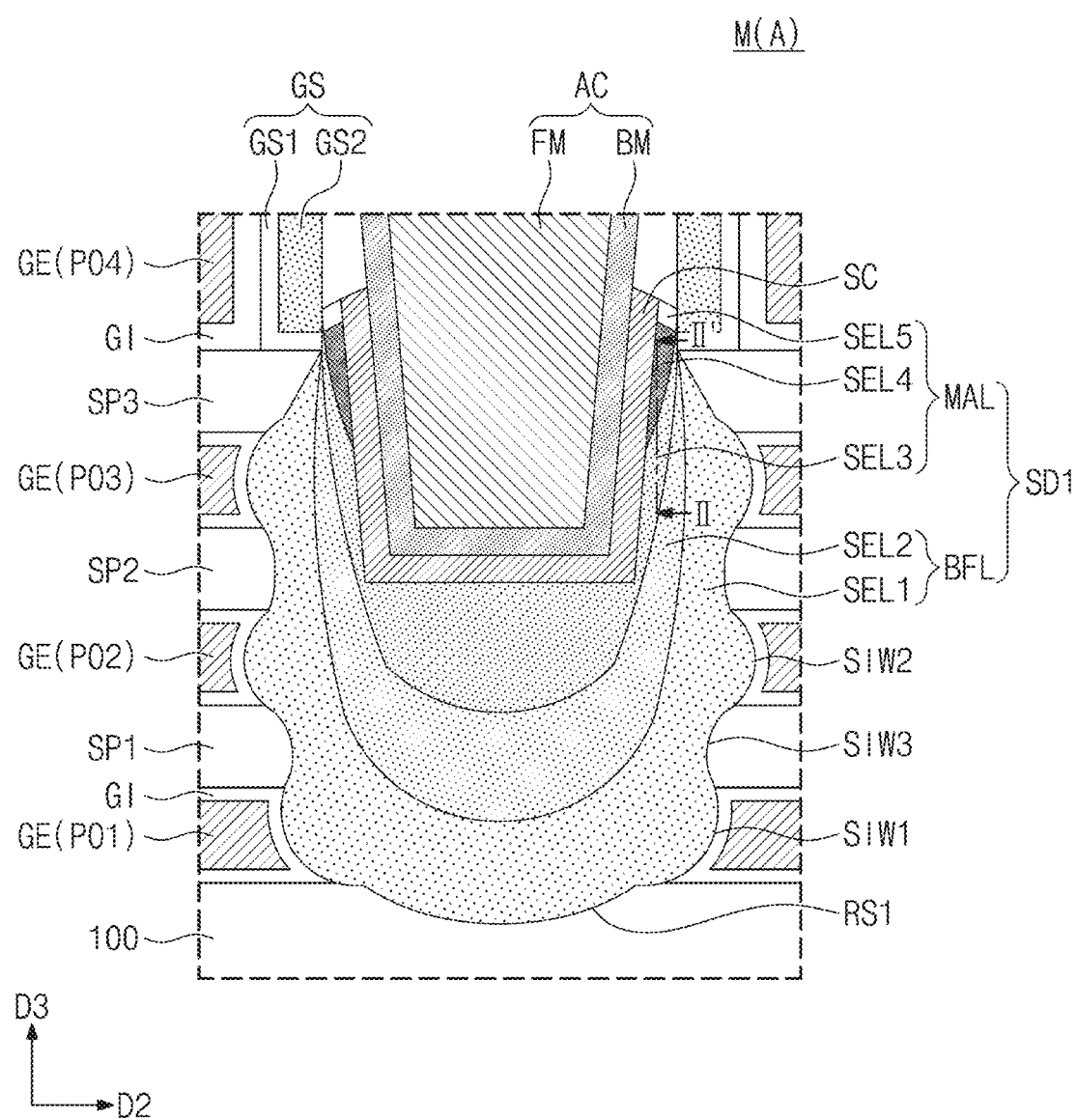
FIGS. 7A, 8A, and 9A are enlarged sectional views illustrating portions (e.g., 'M' of FIG. 6A) of logic cells of a first semiconductor chip, a second semiconductor chip, and a third semiconductor chip, respectively, according to an embodiment of inventive concepts.

A pair of gate spacers GS may be respectively disposed on opposite side surfaces of the fourth portion PO4 of the gate electrode GE. The gate spacers GS may be extended along the gate electrode GE and in the first direction D1. Top surfaces of the gate spacers GS may be higher than a top surface of the gate electrode GE. The top surfaces of the gate spacers GS may be coplanar with a top surface of a first interlayer insulating layer 110, which will be described below. In an embodiment, the gate spacers GS may be formed of or include at least one of SiCN, SiCON, or SiN. In another embodiment, the gate spacers GS may be a multi-layered structure, which is formed of or includes at least two different materials selected from SiCN, SiCON, and SiN. For example, the gate spacer GS may include a first spacer GS1 and a second spacer GS2, as illustrated in FIG. 7A.

A gate capping pattern GP may be provided on the gate electrode GE. The gate capping pattern GP may be extended along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, or SiN.

A gate insulating layer GI may be interposed between the gate electrode GE and the first channel pattern CH1 and between the gate electrode GE and the second channel pattern CH2. The gate insulating layer GI may cover the top surface TS, the bottom surface BS, and the opposite side surfaces SW of each of the first to third semiconductor patterns SP1, SP2, and SP3. The gate insulating layer GI may cover a top surface of the device isolation layer ST below the gate electrode GE.

In an embodiment, the gate insulating layer GI may include a silicon oxide layer, a silicon oxynitride layer, and/or a high-k dielectric layer. The high-k dielectric layer may be formed of or include at least one of high-k dielectric materials whose dielectric constants are higher than that of silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In another embodiment, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at the room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but inventive concepts are not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but inventive concepts are not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

Referring back to FIG. 6B, inner spacers IP may be provided on the first and second NMOSFET regions NR1 and NR2. That is, the inner spacers IP may be provided on the second active pattern AP2. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

A first interlayer insulating layer 110 may be provided on the substrate 100. The first interlayer insulating layer 110 may cover the gate spacers GS and the first and second source/drain patterns SD1 and SD2. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of division structures DB may be provided at both sides of each of the first and second single height cells SHC1 and SHC2 to be opposite to each other in the second direction D2. For example, pair of the division structures DB may be respectively provided on the first and second borders BD1 and BD2 of the first single height cell SHC1. The division structure DB may be extended in the first direction D1 to be parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may be extended into the first and second active patterns AP1 and AP2. The division structure DB may be provided to penetrate an upper portion of each of the first and second active patterns AP1 and AP2. The division structure DB may electrically separate an active region of each of the first and second single height cells SHC1 and SHC2 from an active region of a neighboring cell.

Active contacts AC may be provided to penetrate the first and second interlayer insulating layers 110 and 120 and to be electrically connected to the first and second source/drain patterns SD1 and SD2, respectively. A pair of the active contacts AC may be respectively provided at both sides of the gate electrode GE. When viewed in a plan view, the active contact AC may be a bar-shaped pattern that is extended in the first direction D1.

The active contact AC may be a self-aligned contact. For example, the active contact AC may be formed by a selfalignment process using the gate capping pattern GP and the gate spacer GS. For example, the active contact AC may cover at least a portion of the side surface of the gate spacer GS. Although not shown, the active contact AC may cover a portion of the top surface of the gate capping pattern GP.

Metal-semiconductor compound layers SC (e.g., a silicide layer) may be respectively interposed between the active contact AC and the first source/drain pattern SD1 and between the active contact AC and the second source/drain pattern SD2. The active contact AC may be electrically connected to the source/drain pattern SD1 and SD2 through the metal-semiconductor compound layer SC. For example, the metal-semiconductor compound layer SC may be formed of or include at least one of titanium silicide, tantalum silicide, tungsten silicide, nickel silicide, or cobalt silicide.

Referring back to FIG. 6C, at least one active contact AC on the first single height cell SHC1 may be provided to electrically connect the first source/drain pattern SD1 of the first PMOSFET region PR1 to the second source/drain pattern SD2 of the first NMOSFET region NR1. The active contact AC may be extended from the second source/drain pattern SD2 of the first NMOSFET region NR1 to the first source/drain pattern SD1 of the first PMOSFET region PR1 in the first direction D1.

Gate contacts GC may be provided to penetrate the second interlayer insulating layer 120 and the gate capping pattern GP and to be electrically connected to the gate electrodes GE, respectively. When viewed in a plan view, two gate contacts GC on the first single height cell SHC1 may be disposed to be overlapped with the first PMOSFET region PR1. That is, the two gate contacts GC on the first single height cell SHC1 may be provided on the first active pattern AP1 (e.g., see FIG. 6A). When viewed in a plan view, a single gate contact GC on the first single height cell SHC1 may be disposed to be overlapped with the first NMOSFET region NR1. In other words, the single gate contact GC on the first single height cell SHC1 may be provided on the second active pattern AP2 (e.g., see FIG. 6B).

The gate contact GC may be freely disposed on the gate electrode GE, without any limitation in its position. For example, the gate contacts GC on the second single height cell SHC2 may be respectively disposed on the second PMOSFET region PR2, the second NMOSFET region NR2, and the device isolation layer ST filling the trench TR (e.g., see FIG. 5).

Figure 6A:
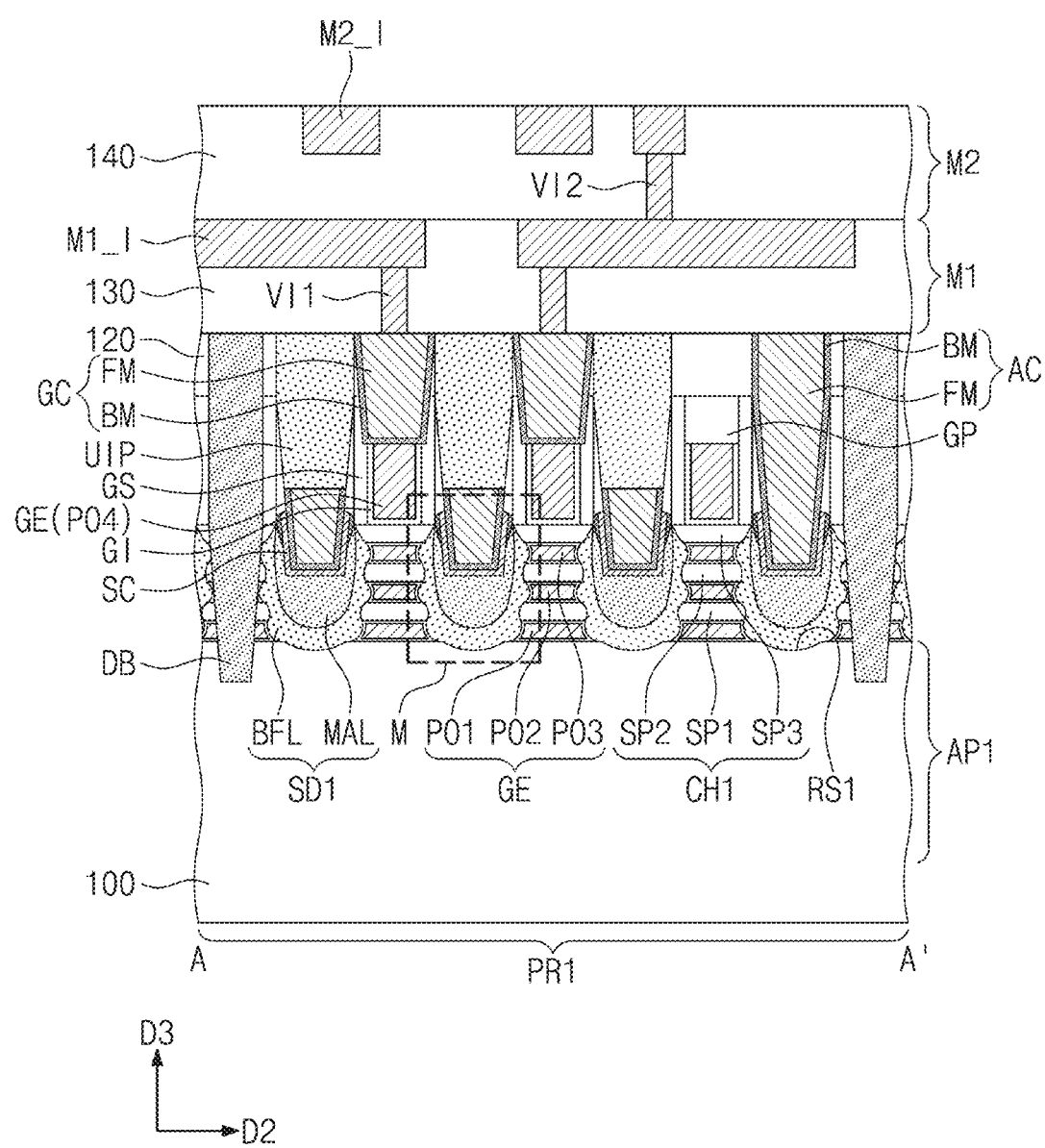
FIGS. 6A to 6D are sectional views, which are respectively taken along lines A-A', B-B', C-C', and D-D' of FIG. 5.
Figure 6B:
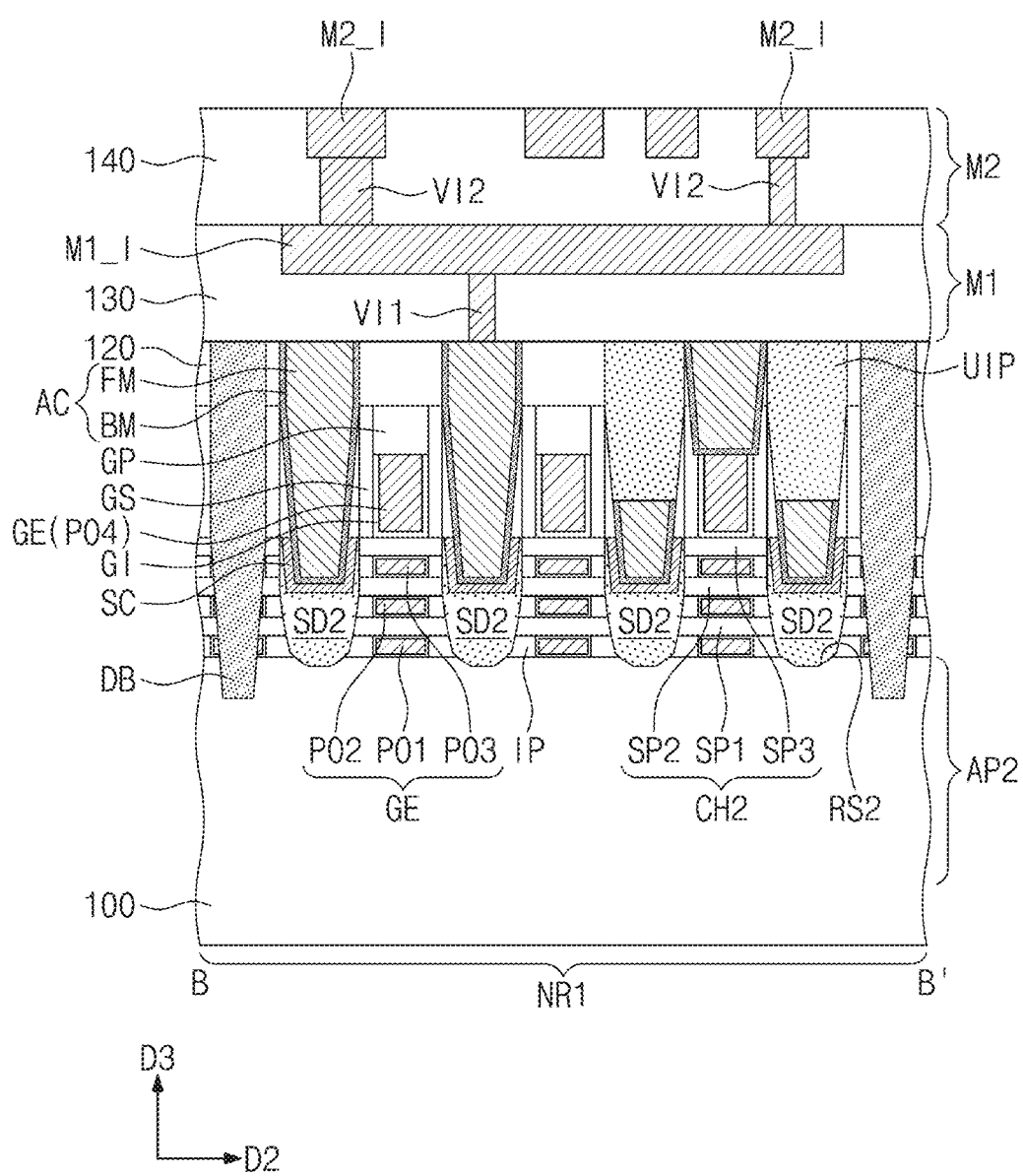
Figure 6C:
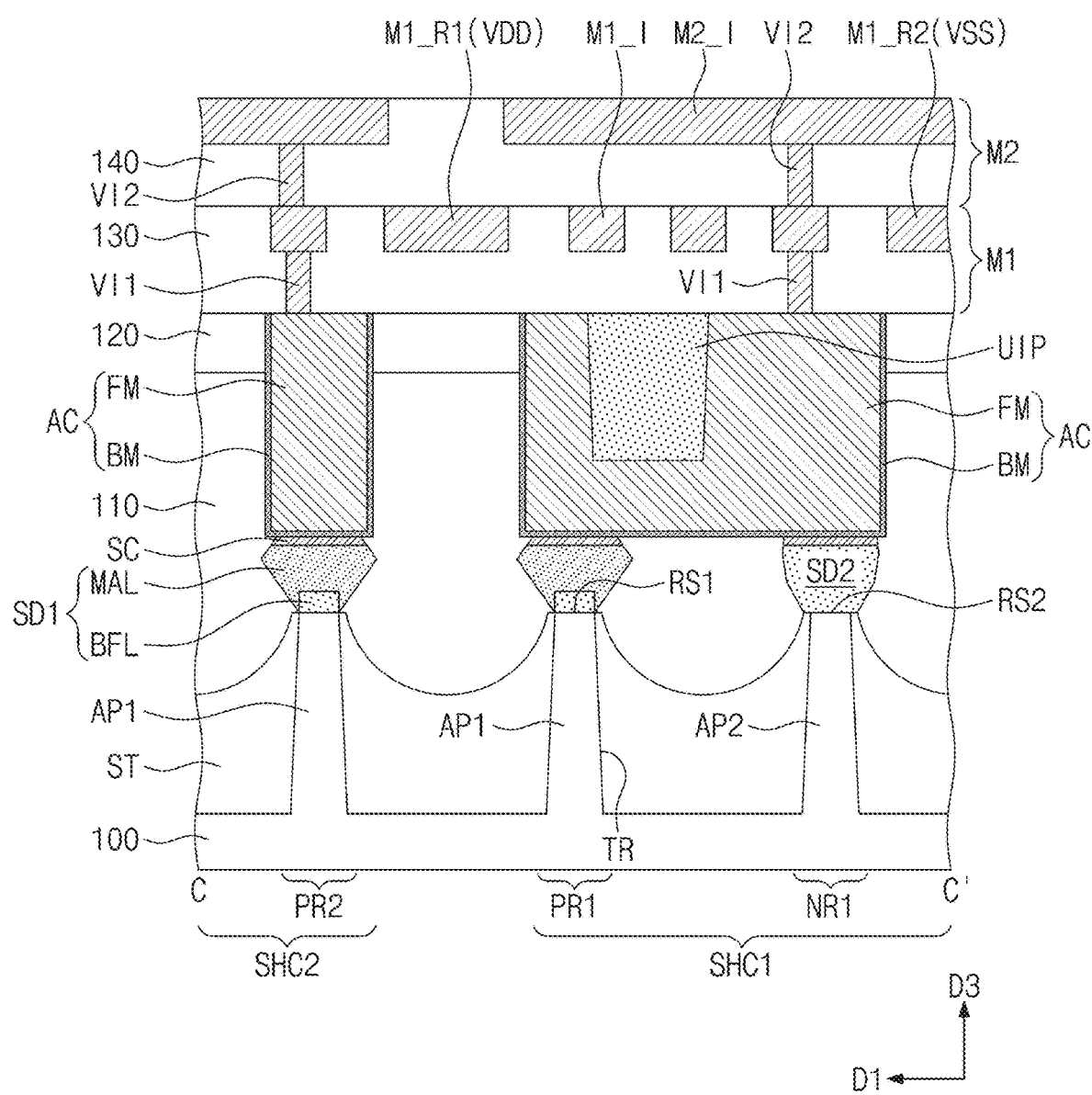
Figure 6D:
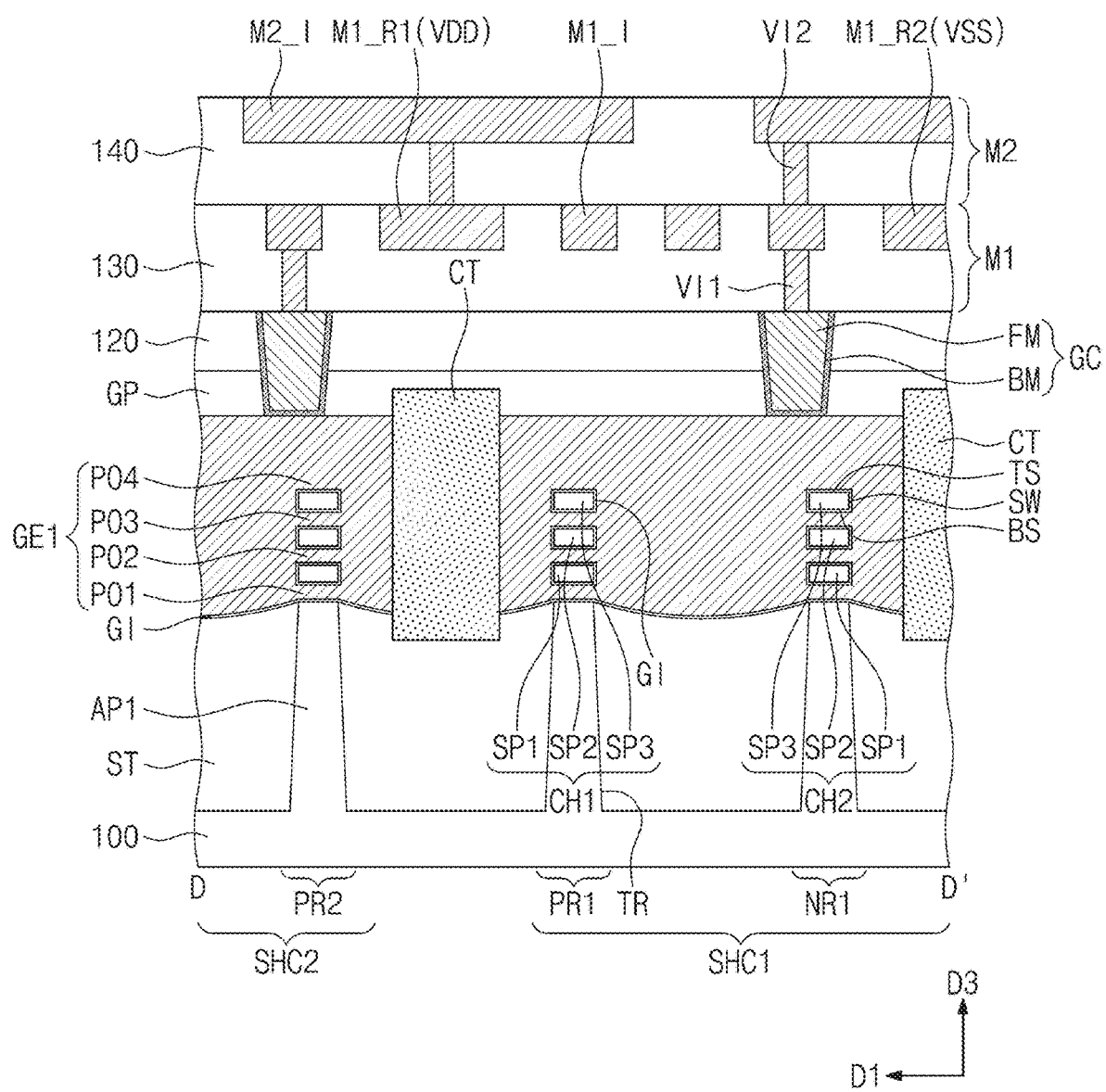

In an embodiment, referring to FIGS. 6A and 6C, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be formed at a level, which is lower than the bottom surface of the gate contact GC, by the upper insulating pattern UIP. Accordingly, it may be possible to limit and/or prevent the gate contact GC and the active contact AC, which are adjacent to each other, from being in contact with each other and thereby to limit and/or prevent a short circuit issue from occurring therebetween.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayer insulating layer 130. For example, the first metal layer M1 may include the first power line M1_R1, the second power line M1_R2, the third power line M1_R3, and first interconnection lines M1_I. The interconnection lines M1_R1, M1_R2, M1_R3, and M1_I of the first metal layer M1 may be extended in the second direction D2 to be parallel to each other.

In detail, the first and second power lines M1_R1 and M1_R2 may be provided on the third and fourth borders BD3 and BD4 of the first single height cell SHC1, respectively. The first power line M1_R1 may be extended along the third border BD3 and in the second direction D2. The second power line M1_R2 may be extended along the fourth border BD4 and in the second direction D2.

The first interconnection lines M1_I of the first metal layer M1 may be arranged at a second pitch in the first direction D1. The second pitch may be smaller than the first pitch. A linewidth of each of the first interconnection lines M1_I may be smaller than a linewidth of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of second interconnection lines M2_I. Each of the second interconnection lines M2_I of the second metal layer M2 may be a line- or bar-shaped pattern that is extended in the first direction D1. In other words, the second interconnection lines M2_I may be extended in the first direction D1 and parallel to each other.

The second metal layer M2 may further include second vias VI2, which are respectively provided below the second interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include at least one of metallic materials (e.g., aluminum, copper, tungsten, ruthenium, molybdenum, and cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Figure 7B:
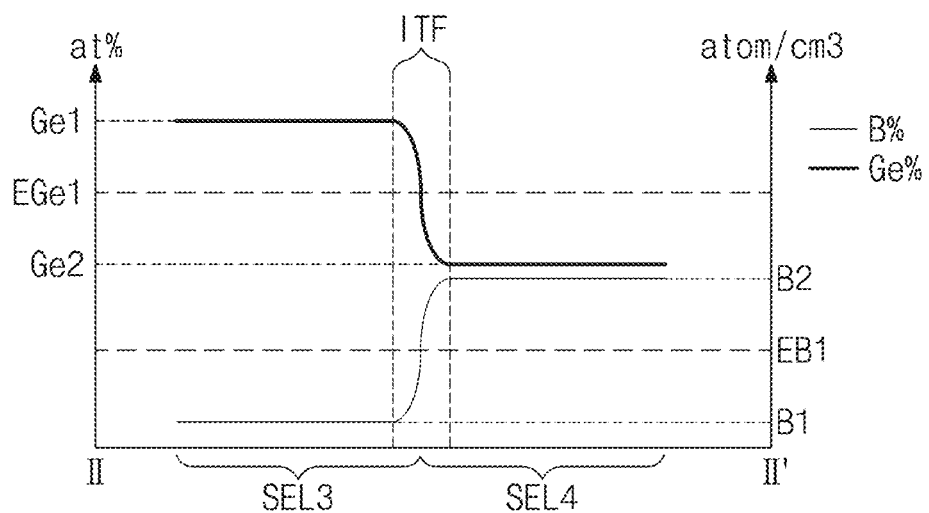
FIGS. 7B, 8B, and 9B are graphs showing variations in germanium and impurity concentrations of third and fourth semiconductor layers, measured in a third direction along lines II-II' of FIGS. 7A, 8A, and 9A, respectively.
Figure 8A:
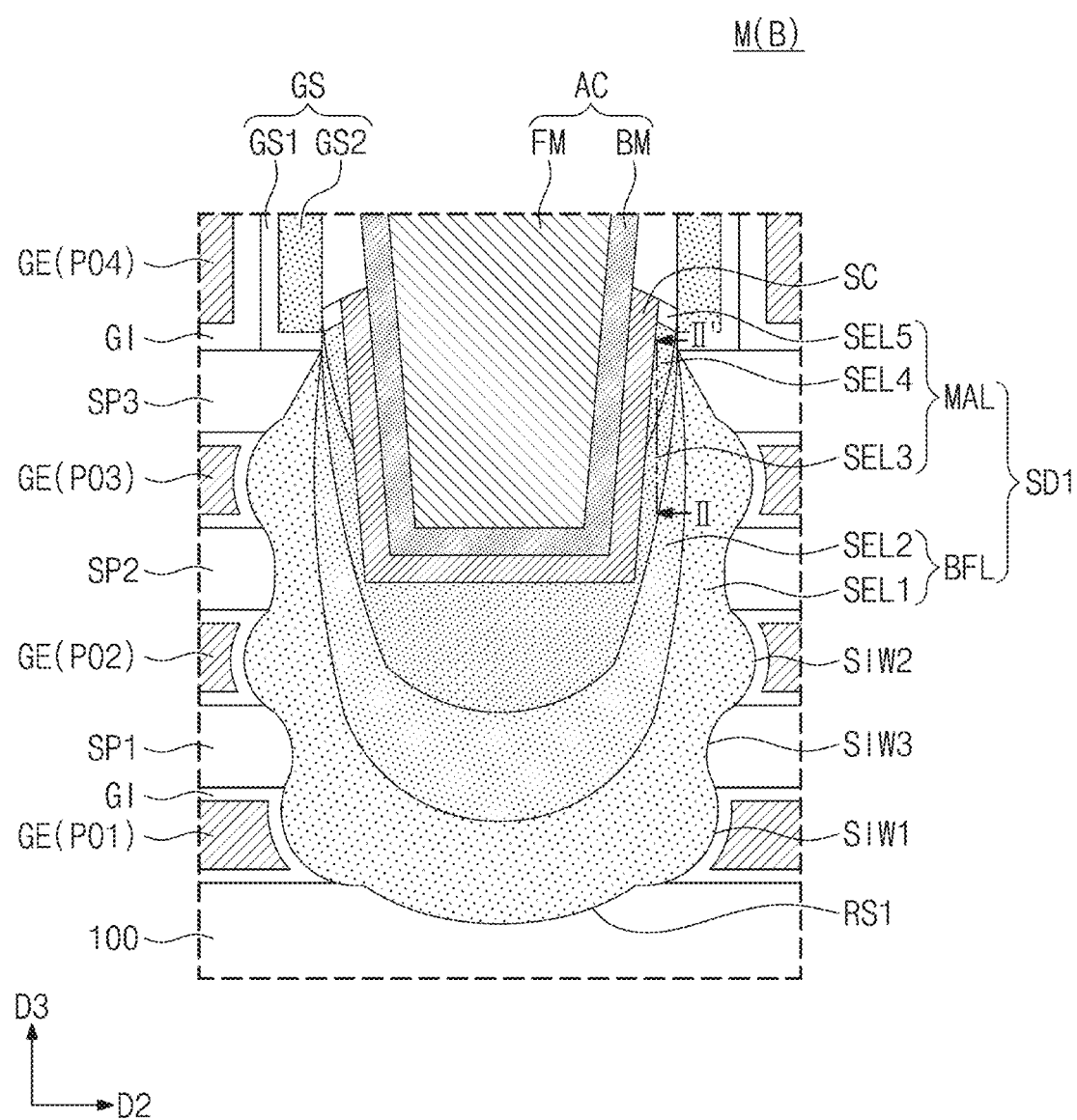
Figure 8B:
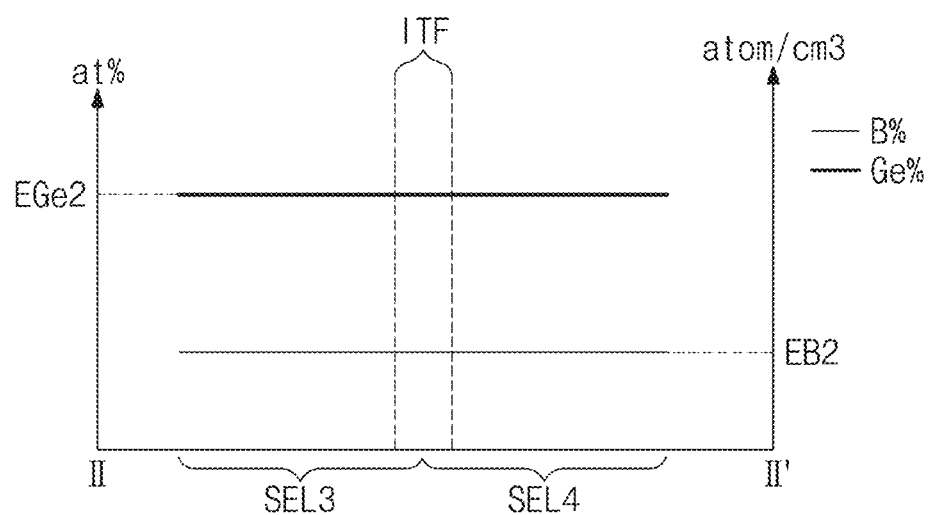
Figure 9A:
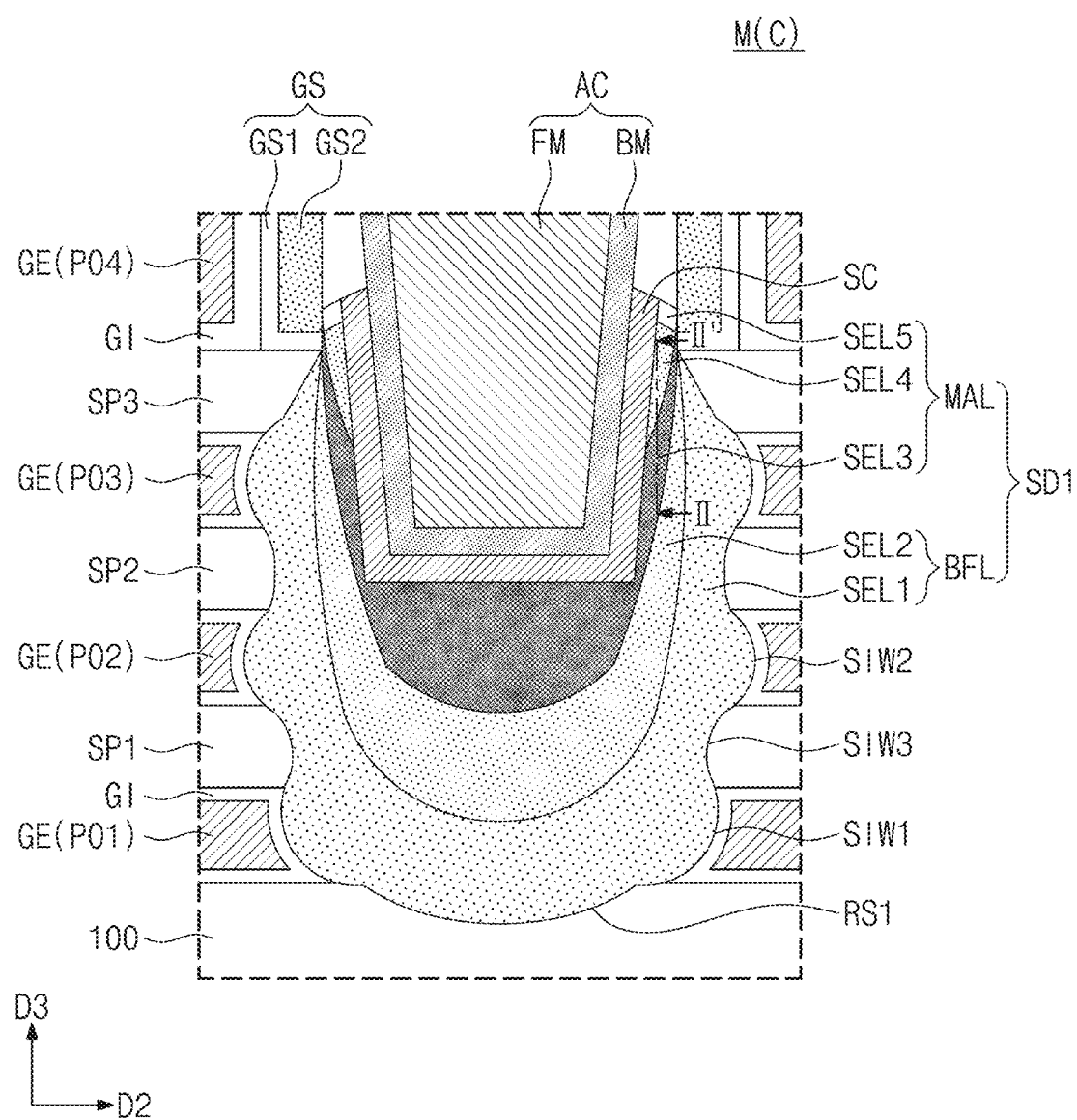
Figure 9B:
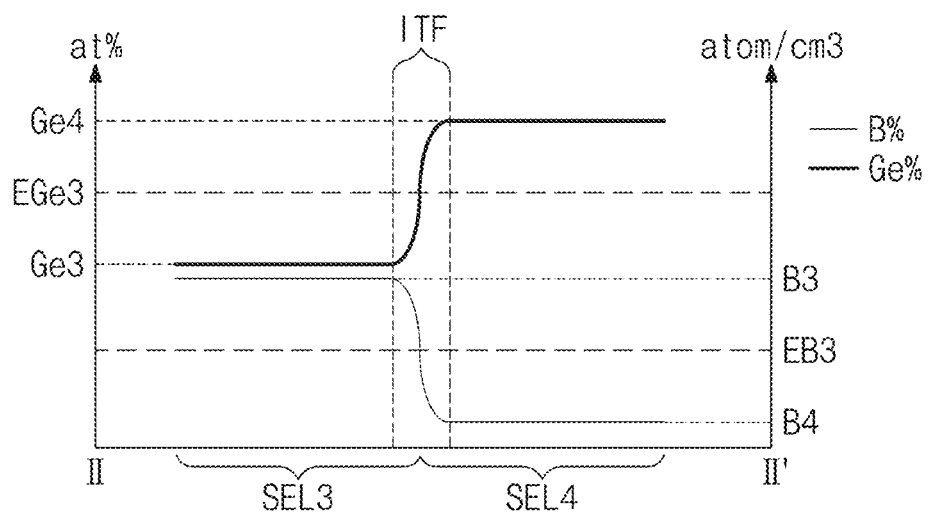
Figure 10A:
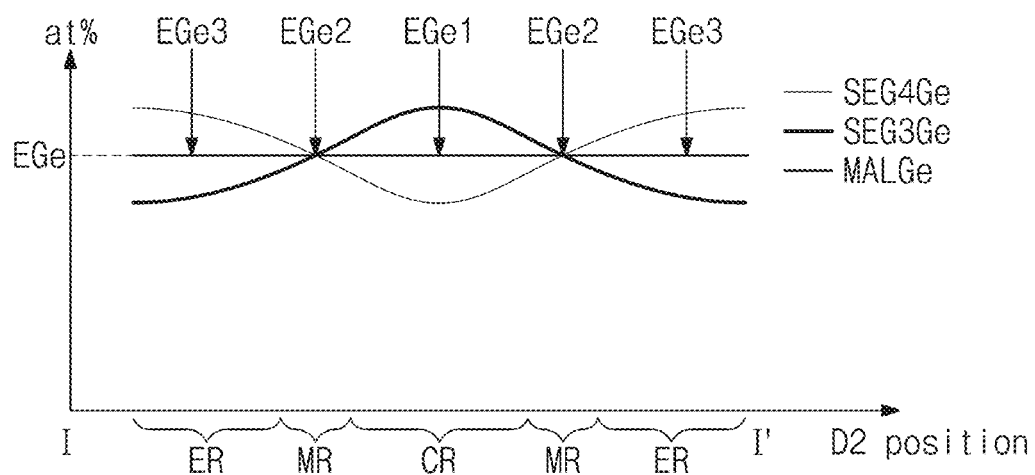
FIG. 10A is a graph showing variations in germanium concentrations of third and fourth semiconductor layers, which are provided in semiconductor chips according to an embodiment of inventive concepts and are measured in a second direction along a line I-I' of FIG. 1.
Figure 10B:
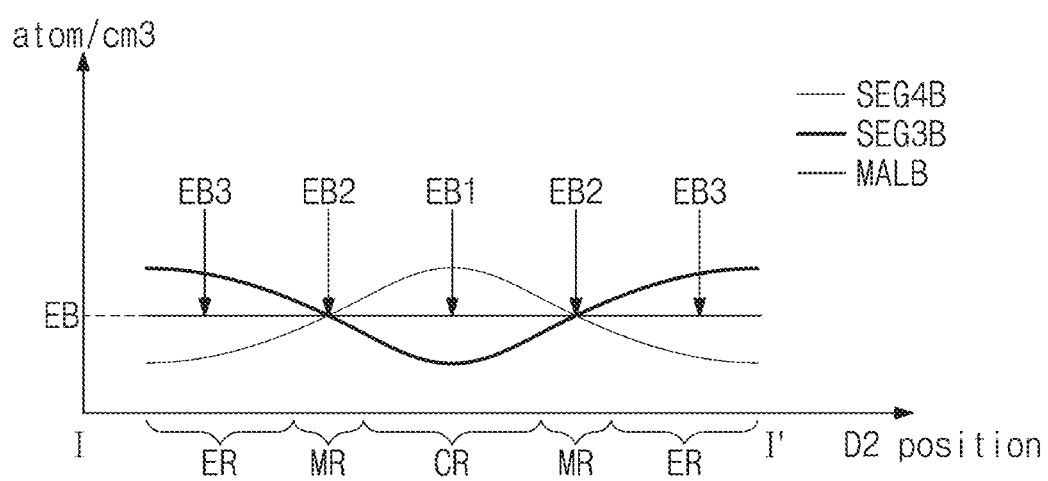
FIG. 10B is a graph showing variations in impurity concentrations of third and fourth semiconductor layers, which are provided in semiconductor chips according to an embodiment of inventive concepts and are measured in the second direction along the line I-I' of FIG. 1.

FIGS. 7A, 8A, and 9A are enlarged sectional views illustrating portions (e.g., 'M' of FIG. 6A) of logic cells of a first semiconductor chip, a second semiconductor chip, and a third semiconductor chip, respectively, according to an embodiment of inventive concepts. FIGS. 7B, 8B, and 9B are graphs showing variations in germanium and impurity concentrations of third and fourth semiconductor layers, measured in a third direction along lines II-II' of FIGS. 7A, 8A, and 9A, respectively. FIG. 10A is a graph showing variations in germanium concentrations of third and fourth semiconductor layers, which are provided in semiconductor chips according to an embodiment of inventive concepts and are measured in a second direction along a line I-I' of FIG. 1. FIG. 10B is a graph showing variations in impurity concentrations of third and fourth semiconductor layers, which are provided in semiconductor chips according to an embodiment of inventive concepts and are measured in the second direction along the line I-I' of FIG. 1.

As an example of the first to third semiconductor chips A, B, and C, the first source/drain pattern SD1 in the first semiconductor chip A will be described in more detail with reference to FIG. 7A. The buffer layer BFL of the first source/drain pattern SD1 may include a first semiconductor layer SEL1 and a second semiconductor layer SEL2.

The first semiconductor layer SEL1 may be in direct contact with an inner surface of the first recess RS1. The second semiconductor layer SEL2 may be interposed between the first semiconductor layer SEL1 and a third semiconductor layer SEL3, which will be described below.

Both of the first and second semiconductor layers SEL1 and SEL2 of the buffer layer BFL may be formed of or include silicon-germanium (SiGe). However, there may be a difference in germanium concentration between the first and second semiconductor layers SEL1 and SEL2. The germanium concentration of the buffer layer BFL may range from 0 at % to 10 at %. For example, in some embodiments, the germanium concentration of the buffer layer BFL may range from 2 at % to 8 at %.

A germanium concentration of the first semiconductor layer SEL1 may range from 4 at % to 8 at %. A germanium concentration of the second semiconductor layer SEL2 may be equal to the germanium concentration of the first semiconductor layer SEL1.

A mean thickness of the first semiconductor layer SEL1 may be about 3 nm. A mean thickness of the second semiconductor layer SEL2 may be equal to the mean thickness of the first semiconductor layer SEL1.

In an embodiment, the first and second semiconductor layers SEL1 and SEL2 may be formed of substantially the same material, and there may be no observable interface therebetween In another embodiment, the germanium concentration of the second semiconductor layer SEL2 may be different from the germanium concentration of the first semiconductor layer SEL1. For example, the germanium concentration (8 at %) of the second semiconductor layer SEL2 may be higher than the germanium concentration (5 at %) of the first semiconductor layer SEL1.

The main layer MAL may include a third semiconductor layer SEL3 on the second semiconductor layer SEL2, a fourth semiconductor layer SEL4 on the third semiconductor layer SEL3, and a fifth semiconductor layer SEL5 conformally covering a surface of the fourth semiconductor layer SEL4.

Both of the third and fourth semiconductor layers SEL3 and SEL4 of the main layer MAL may be formed of or include silicon-germanium (SiGe). However, there may be a difference in germanium concentration between them.

The fifth semiconductor layer SEL5 may be used as a capping layer covering and protecting an exposed surface of the fourth semiconductor layer SEL4. The fifth semiconductor layer SEL5 may be formed of or include silicon (Si). In an embodiment, the fifth semiconductor layer SEL5 may contain a tiny amount of germanium atoms which are diffused from the fourth semiconductor layer SEL4. A silicon concentration of the fifth semiconductor layer SEL5 may range from 98 at % to 100 at %.

Except for a difference in concentrations of the third and fourth semiconductor layers SEL3 and SEL4, the structure and composition of the first source/drain pattern SD1 in the second and third semiconductor chips B and C may be substantially the same as those in the first semiconductor chip A (e.g., see FIGS. 8A and 9A). Hereinafter, the spatial variations in germanium and impurity concentrations of each of the first to third semiconductor chips A, B, and C will be described in more detail with reference to FIGS. 7B, 8B, and 9B.

Referring to FIGS. 1 and 7B, in the main layer MAL of the first semiconductor chip A, the germanium concentrations of the third and fourth semiconductor layers SEL3 and SEL4 may be different from each other. In the main layer MAL of the first semiconductor chip A, the impurity concentrations of the third and fourth semiconductor layers SEL3 and SEL4 may also be different from each other. The third semiconductor layer SEL3 may have a first germanium concentration Ge1 and a first impurity concentration B1. The fourth semiconductor layer SEL4 may have a second germanium concentration Ge2 and a second impurity concentration B2.

The first germanium concentration Ge1 may be higher than the second germanium concentration Ge2. For example, the first germanium concentration Ge1 may range from 40 at % to 70 at %, and the second germanium concentration Ge2 may range from 30 at % to 60 at %.

The first impurity concentration B1 may be lower than the second impurity concentration B2. For example, the first impurity concentration B1 may range from $1E18$ atoms/cm$^3$ to $1E21$ atoms/cm$^3$, and the second impurity concentration B2 may range from $1E21$ atoms/cm$^3$ to $5E22$ atoms/cm$^3$.

For the first semiconductor chips A placed in the center region CR of the substrate 100, the germanium concentration of the third semiconductor layer SEL3 may be higher than the germanium concentration of the fourth semiconductor layer SEL4, and the impurity concentration of the third semiconductor layer SEL3 may be lower than the impurity concentration of the fourth semiconductor layer SEL4.

As an example, the first germanium concentration Ge1 in the third semiconductor layer SEL3 may be constant regardless of a height in the third direction D3, and the second germanium concentration Ge2 in the fourth semiconductor layer SEL4 may be constant regardless of a height in the third direction D3. As another example, although not shown, when measured in the third direction D3, the first germanium concentration Ge1 in the third semiconductor layer SEL3 may be slightly increased, and the second germanium concentration Ge2 in the fourth semiconductor layer SEL4 may be slightly increased.

The germanium and impurity concentrations may be abruptly changed at an interface region ITF between the third and fourth semiconductor layers SEL3 and SEL4. For example, as a height from the interface region ITF in the third direction D3 increases, the germanium concentration may be abruptly decreased from the first germanium concentration Ge1 to the second germanium concentration Ge2. For example, as a height from the interface region ITF in the third direction D3 increases, the impurity concentration may be abruptly increased from the first impurity concentration B1 to the second impurity concentration B2. The variations in the germanium and impurity concentration distributions at the interface region ITF may result from the diffusion of the germanium and impurity atoms in the third and fourth semiconductor layers SEL3 and SEL4 through the interface region ITF, and in this case, the germanium and impurity concentrations may be continuously changed in the interface region ITF.

For the first semiconductor chip A, the main layer MAL including the third and fourth semiconductor layers SEL3 and SEL4 may have a first mean germanium concentration EGe1 and a first mean impurity concentration EB1. In an embodiment, the first mean germanium concentration EGe1 may be a mean value of the first and second germanium concentrations Ge1 and Ge2. As an example, the first mean impurity concentration EB1 may be a mean value of the first and second impurity concentrations B1 and B2.

Referring to FIGS. 1, 8A, and 8B, in the main layer MAL of the second semiconductor chip B, the third and fourth semiconductor layers SEL3 and SEL4 may have the same germanium concentration. In the main layer MAL of the second semiconductor chip B, the third and fourth semiconductor layers SEL3 and SEL4 may have the same impurity concentration.

For example, the germanium concentrations of the third and fourth semiconductor layers SEL3 and SEL4 may range from 40 at % to 60 at %. For example, the impurity concentrations of the third and fourth semiconductor layers SEL3 and SEL4 may range from 1E20 atoms/cm$^3$ to 1E21 atoms/cm$^3$.

For the second semiconductor chips B placed in the middle region MR of the substrate 100, the germanium concentration and the impurity concentration may be maintained to be constant, when measured along the line II-II' of the main layer MAL in the third direction D3.

For the second semiconductor chip B, the main layer MAL including the third and fourth semiconductor layers SEL3 and SEL4 may have a second mean germanium concentration EGe2 and a second mean impurity concentration EB2. The second mean germanium concentration EGe2 may be equal to the first mean germanium concentration EGe1. The second mean impurity concentration EB2 may be equal to the first mean impurity concentration EB1. In the present specification, the sameness of the concentration means that a difference in concentration is within a variation range of concentration that is allowed for a fabrication process.

Referring to FIGS. 1, 9A, and 9B, in the main layer MAL of the third semiconductor chip C, the germanium concentrations of the third and fourth semiconductor layers SEL3 and SEL4 may be different from each other. The third semiconductor layer SEL3 may have a third germanium concentration Ge3 and a third impurity concentration B3. The fourth semiconductor layer SEL4 may have a fourth germanium concentration Ge4 and a fourth impurity concentration B4.

The third germanium concentration Ge3 may be lower than the fourth germanium concentration Ge4. For example, the third germanium concentration Ge3 may range from 30 at % to 60 at %, and the fourth germanium concentration Ge4 may range from 40 at % to 70 at %.

The third impurity concentration B3 may be higher than the fourth impurity concentration B4. For example, the third impurity concentration B3 may range from 1E21 atoms/cm$^3$ to 5E22 atoms/cm$^3$, and the fourth impurity concentration B4 may range from 1E18 atoms/cm$^3$ to 1E21 atoms/cm$^3$.

For the third semiconductor chips C placed at the edge region ER of the substrate 100, the germanium concentration of the third semiconductor layer SEL3 may be lower than the germanium concentration of the fourth semiconductor layer SEL4, and the impurity concentration of the third semiconductor layer SEL3 may be higher than the impurity concentration of the fourth semiconductor layer SEL4.

As an example, the third germanium concentration Ge3 in the third semiconductor layer SEL3 may be constant regardless of a height in the third direction D3, and the fourth germanium concentration Ge4 in the fourth semiconductor layer SEL4 may be constant regardless of a height in the third direction D3. As another example, when measured in the third direction D3, the third germanium concentration Ge3 in the third semiconductor layer SEL3 may be slightly increased, and the fourth germanium concentration Ge4 in the fourth semiconductor layer SEL4 may be slightly increased.

The germanium and impurity concentrations may be abruptly changed at an interface region ITF between the third and fourth semiconductor layers SEL3 and SEL4. For example, as a height from the interface region ITF in the third direction D3 increases, the germanium concentration may be abruptly increased from the third germanium concentration Ge3 to the fourth germanium concentration Ge4. For example, as a height from the interface region ITF in the third direction D3 increases, the impurity concentration may be abruptly decreased from the third impurity concentration B3 to the fourth impurity concentration B4.

For the third semiconductor chip C, the main layer MAL including the third and fourth semiconductor layers SEL3 and SEL4 may have a third mean germanium concentration EGe3 and a third mean impurity concentration EB3. The third mean germanium concentration EGe3 may be a mean value of the third and fourth germanium concentrations Ge3 and Ge4. The third mean impurity concentration EB3 may be a mean value of the third and fourth impurity concentrations B3 and B4. The third mean germanium concentration EGe3 may be equal to the first and second mean germanium concentrations EGe1 and EGe2. The third mean impurity concentration EB3 may be equal to the first and second mean impurity concentrations EB1 and EB2.

Referring to FIGS. 1 and 10A, a germanium concentration SEG3Ge of the third semiconductor layer SEL3 may have the highest value at a center portion of the center region CR and may have the lowest value at an edge portion of the edge region ER. The germanium concentration SEG3Ge of the third semiconductor layer SEL3 may decrease in a direction from the center portion of the center region CR toward the edge portion of the edge region ER. For example, the germanium concentration SEG3Ge of the third semiconductor layer SEL3 constituting the semiconductor chip may be continuously decreased when measured along a path from the center portion of the center region CR to the edge portion of the edge region ER.

A germanium concentration SEG4Ge of the fourth semiconductor layer SEL4 may have the lowest value at the center portion of the center region CR and may have the highest value at the edge portion of the edge region ER. The germanium concentration SEG4Ge of the fourth semiconductor layer SEL4 may be increased when measured along a path from the center portion of the center region CR to the edge portion of the edge region ER. For example, when measured along a path from the center portion of the center region CR to the edge portion of the edge region ER, the germanium concentration SEG4Ge of the fourth semiconductor layer SEL4 constituting the semiconductor chip may be continuously increased.

A mean germanium concentration MALGe of the main layer MAL including the third and fourth semiconductor layers SEL3 and SEL4 may be constantly maintained when measured along a path from the center portion of the center region CR to the edge portion of the edge region ER. In other words, the first mean germanium concentration EGe1 in the center region CR, the second mean germanium concentration EGe2 in the middle region MR, and the third mean germanium concentration EGe3 in the edge region ER may have substantially the same value.

Referring to FIGS. 1 and 10B, an impurity concentration SEG3B of the third semiconductor layer SEL3 may have the lowest value at the center portion of the center region CR and may have the highest value at the edge portion of the edge region ER. The impurity concentration SEG3B of the third semiconductor layer SEL3 may be increased when measured along a path from the center portion of the center region CR to the edge portion of the edge region ER. For example, the impurity concentration SEG3B of the third semiconductor layer SEL3 constituting the semiconductor chip may be continuously increased when measured along a path from the center portion of the center region CR to the edge portion of the edge region ER.

An impurity concentration SEG4B of the fourth semiconductor layer SEL4 may have the highest value at the center portion of the center region CR and may have the lowest value at the edge portion of the edge region ER. The impurity concentration SEG4B of the fourth semiconductor layer SEL4 may be decreased when measured along a path from the center portion of the center region CR to the edge portion of the edge region ER. For example, the impurity concentration SEG4B of the fourth semiconductor layer SEL4 constituting the semiconductor chip may be continuously decreased when measured along a path from the center portion of the center region CR to the edge portion of the edge region ER.

A mean impurity concentration MALB of the main layer MAL including the third and fourth semiconductor layers SEL3 and SEL4 may be constantly maintained when measured along a path from the center portion of the center region CR to the edge portion of the edge region ER. In other words, the first mean impurity concentration EB1 in the center region CR, the second mean impurity concentration EB2 in the middle region MR, and the third mean impurity concentration EB3 in the edge region ER may be the same as each other.

Figure 22:
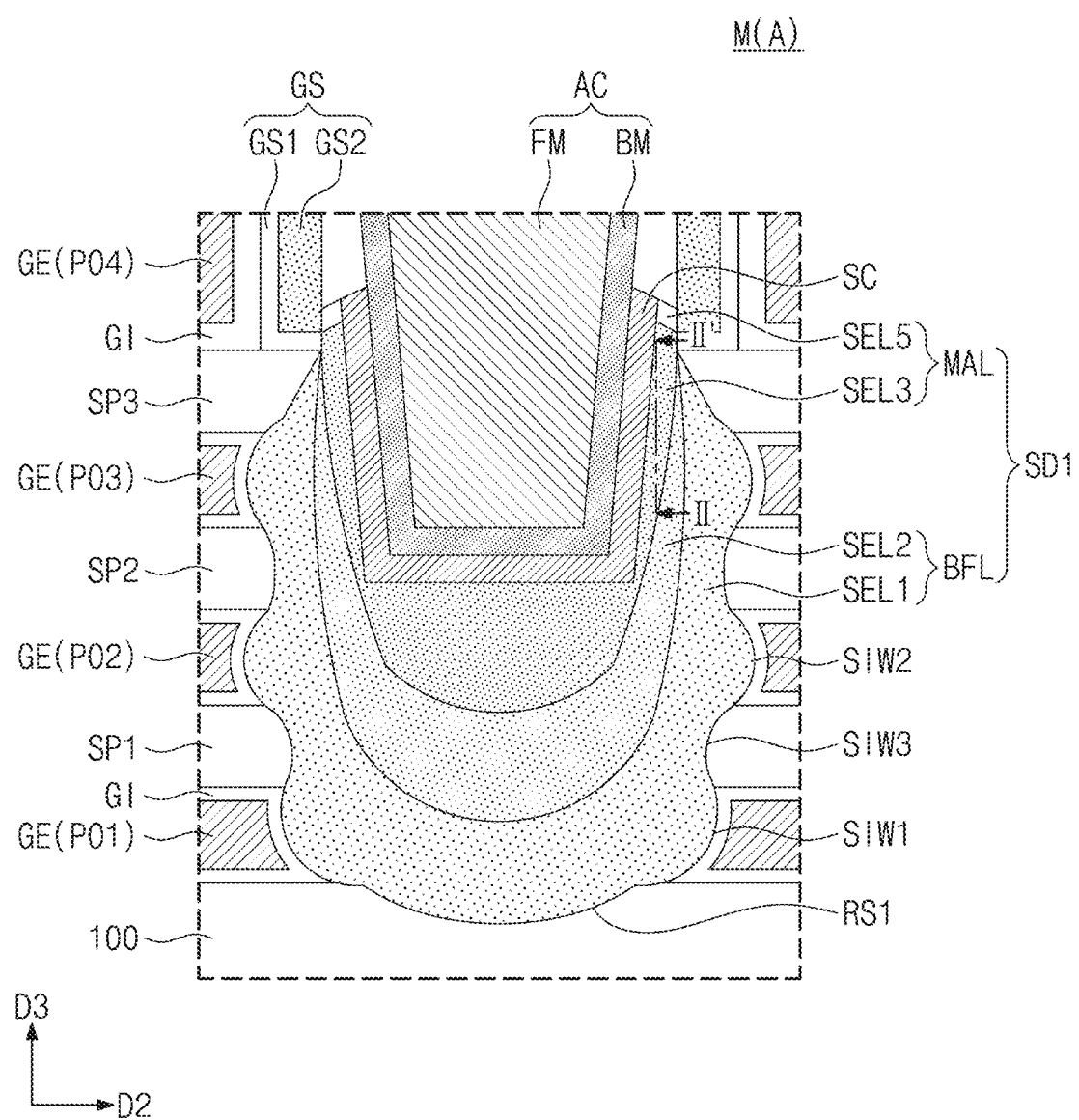
FIG. 22 is an enlarged sectional view illustrating a semiconductor device according to a comparative example and corresponding to a portion 'M' of FIG. 6A.
Figure 23:
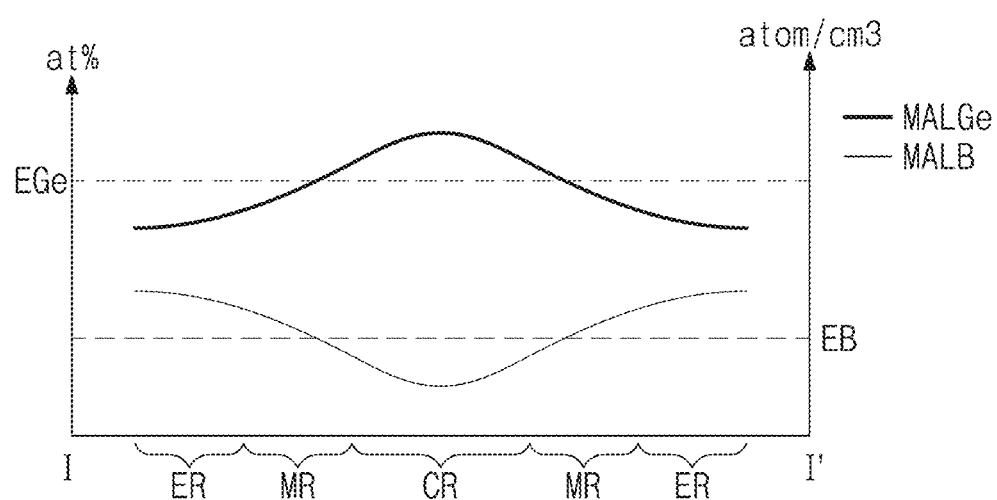
FIG. 23 is a graph showing variations in germanium and impurity concentrations of a main layer, which is provided in semiconductor chips according to a comparative example and is measured in the second direction along the line I-I' of FIG. 1.

FIG. 22 is an enlarged sectional view illustrating a semiconductor device according to a comparative example and corresponding to a portion 'M' of FIG. 6A. FIG. 23 is a graph showing variations in germanium and impurity concentrations of a main layer, which is provided in semiconductor chips according to a comparative example and is measured in the second direction along the line I-I' of FIG. 1. In the following description, an element previously described with reference to FIGS. 1 to 6 may be identified by the same reference number without repeating an overlapping description thereof, for concise description.

Referring to FIGS. 1, 22, and 23, the fourth semiconductor layer SEL4 may not be provided in the main layer MAL in a comparative example. That is, in the comparative example, the main layer MAL may be composed of the third semiconductor layer SEL3 and the fifth semiconductor layer SEL5.

In the comparative example, the germanium concentration MALGe of the main layer MAL in the center region CR may be different from that in the edge region ER. The impurity concentration MALB of the main layer MAL in the center region CR may also be different from that in the edge region ER.

As an example, the germanium concentration MALGe of the main layer MAL may have the highest value in the center region CR and may have the lowest value in the edge region ER. In this case, the impurity concentration MALB of the main layer MAL may have the lowest value in the center region CR and may have the highest value in the edge region ER.

As another example, although not shown, the germanium concentration MALGe of the main layer MAL may have the lowest value in the center region CR and may have the highest value in the edge region ER. In this case, the impurity concentration MALB of the main layer MAL may have the highest value in the center region CR and may have the lowest value in the edge region ER.

In this comparative example, there may be a difference in electric performance between semiconductor devices, which are respectively formed in the center and edge regions CR and ER of the substrate 100, and a semiconductor device formed on one of the center or edge region CR or ER may have deteriorated electric characteristics.

By contrast, according to an embodiment of inventive concepts, the fourth semiconductor layer SEL4 may be provided on the third semiconductor layer SEL3, unlike the comparative example. The variations or profiles of the germanium and impurity concentrations of the fourth semiconductor layer SEL4 in the center region CR, the middle region MR, and the edge region ER may be different from those of the third semiconductor layer SEL3. According to an embodiment of inventive concepts, the mean values of the germanium and impurity concentrations of the main layer may be maintained to have no difference between the center region CR, the middle region MR, and the edge region ER.

Accordingly, it may be possible to improve the uniformity in electric performance of semiconductor devices, which are formed on the entire region of the substrate 100 (e.g., from the center region CR to the edge region ER) and to improve the electric characteristics of the semiconductor devices formed on the substrate 100.

FIGS. 11A to 17D are sectional views illustrating a method of fabricating a semiconductor device according to an embodiment of inventive concepts. In detail, FIGS. 11A, 12A, 13A, 14A, 15A, 16A, and 17A are sectional views taken along the line A-A' of FIG. 5. FIGS. 13B, 14B, 15B, 16B, and 17B are sectional views taken along the line B-B' of FIG. 5. FIGS. 13C, 14C, 15C, 16C, and 17C are sectional views taken along the line C-C' of FIG. 5. FIGS. 13D, 14D, 15D, 16D, and 17D are sectional views taken along the line D-D' of FIG. 5.

Figure 11A:
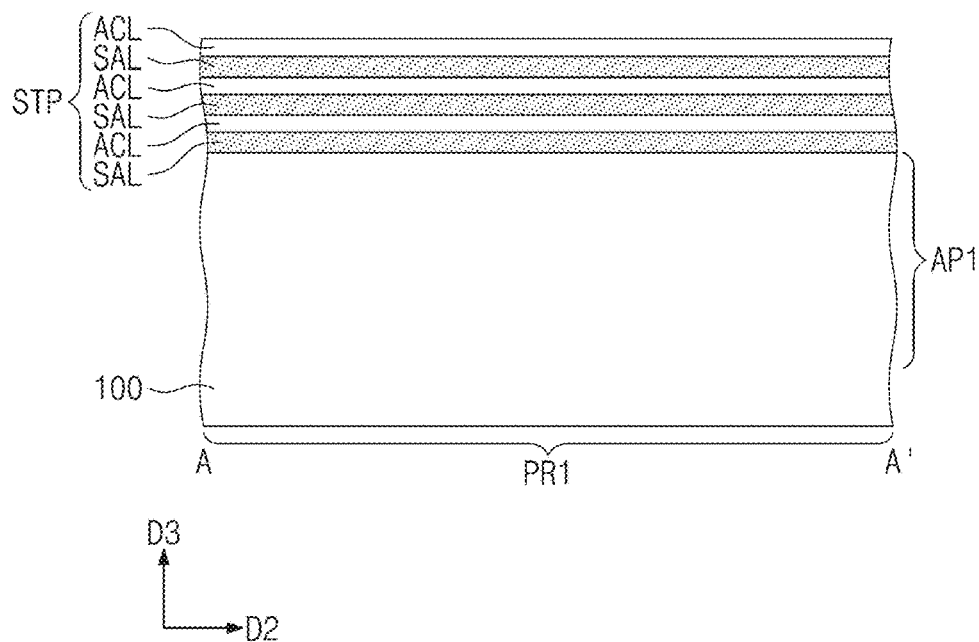
FIGS. 11A to 17D are sectional views illustrating a method of fabricating a semiconductor device according to an embodiment of inventive concepts.
Figure 11B:
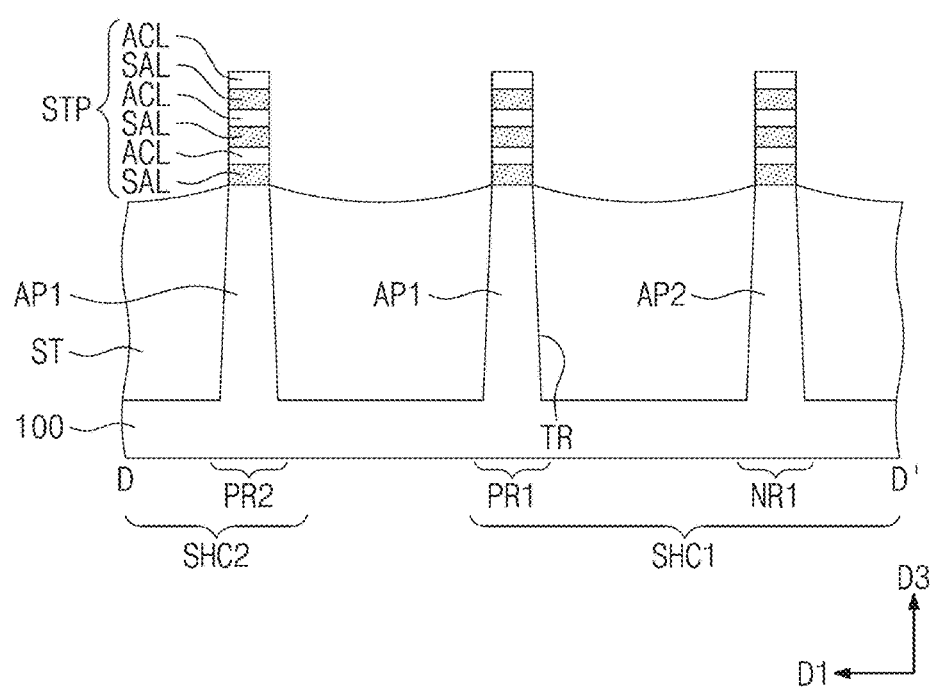

Referring to FIGS. 11A and 11B, the substrate 100 may be provided, and in an embodiment, the substrate may include the first and second PMOSFET regions PR1 and PR2 and the first and second NMOSFET regions NR1 and NR2. Active layers ACL and the sacrificial layers SAL may be alternately stacked on the substrate 100. The active layers ACL may be formed of or include one of silicon (Si), germanium (Ge), and silicon germanium (SiGe), and the sacrificial layers SAL may be formed of or include another one of silicon (Si), germanium (Ge), and silicon germanium (SiGe).

The sacrificial layer SAL may be formed of or include a material having an etch selectivity with respect to the active layer ACL. For example, the active layers ACL may be formed of or include silicon (Si), and the sacrificial layers SAL may be formed of or include silicon germanium (SiGe). A germanium concentration of each of the sacrificial layers SAL may range from 10 at % to 30 at %.

Mask patterns may be respectively formed on the first and second PMOSFET regions PR1 and PR2 and the first and second NMOSFET regions NR1 and NR2 of the substrate 100. The mask pattern may be a line- or bar-shaped pattern that is extended in the second direction D2.

A patterning process using the mask patterns as an etch mask may be performed to form the trench TR defining the first and second active patterns AP1 and AP2. The first active pattern AP1 may be formed on each of the first and second PMOSFET regions PR1 and PR2. The second active pattern AP2 may be formed on each of the first and second NMOSFET regions NR1 and NR2.

A stacking pattern STP may be formed on each of the first and second active patterns AP1 and AP2. The stacking pattern STP may include the active layers ACL and the sacrificial layers SAL which are alternately stacked. The stacking pattern STP may be formed along with the first and second active patterns AP1 and AP2, during the patterning process.

The device isolation layer ST may be formed to fill the trench TR. In detail, an insulating layer may be formed on the substrate 100 to cover the first and second active patterns AP1 and AP2 and the stacking patterns STP. The device isolation layer ST may be formed by recessing the insulating layer to expose the stacking patterns STP.

The device isolation layer ST may be formed of or include at least one of insulating materials (e.g., silicon oxide). The stacking patterns STP may be placed above the device isolation layer ST and may be exposed to the outside of the device isolation layer ST. In other words, the stacking patterns STP may protrude vertically above the device isolation layer ST.

Figure 12A:
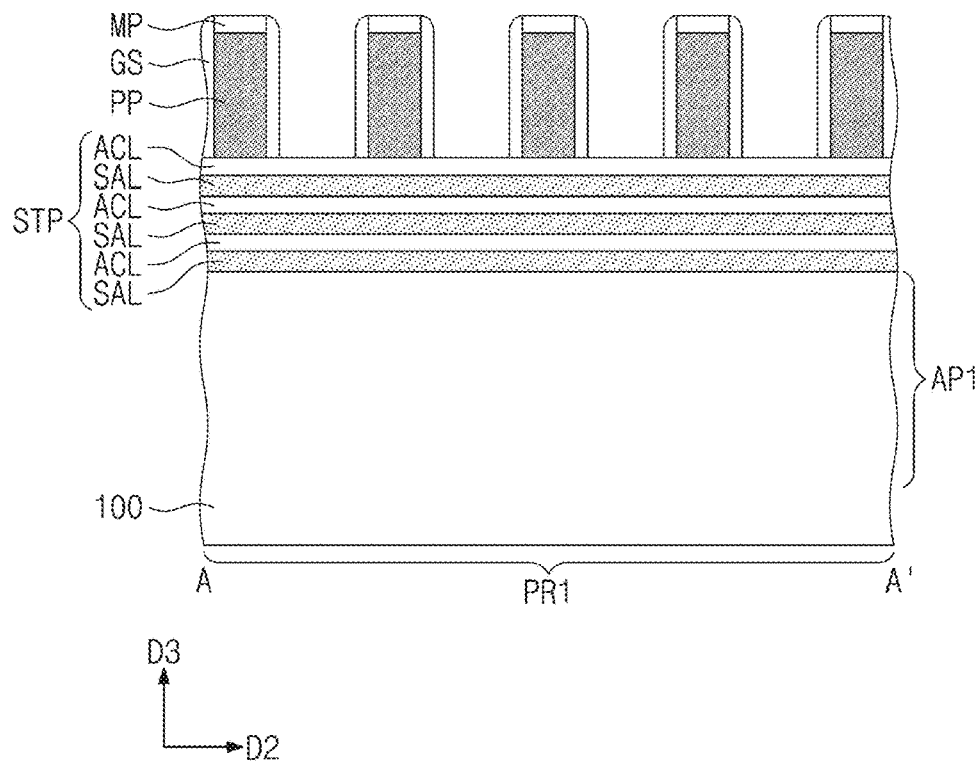
Figure 12B:
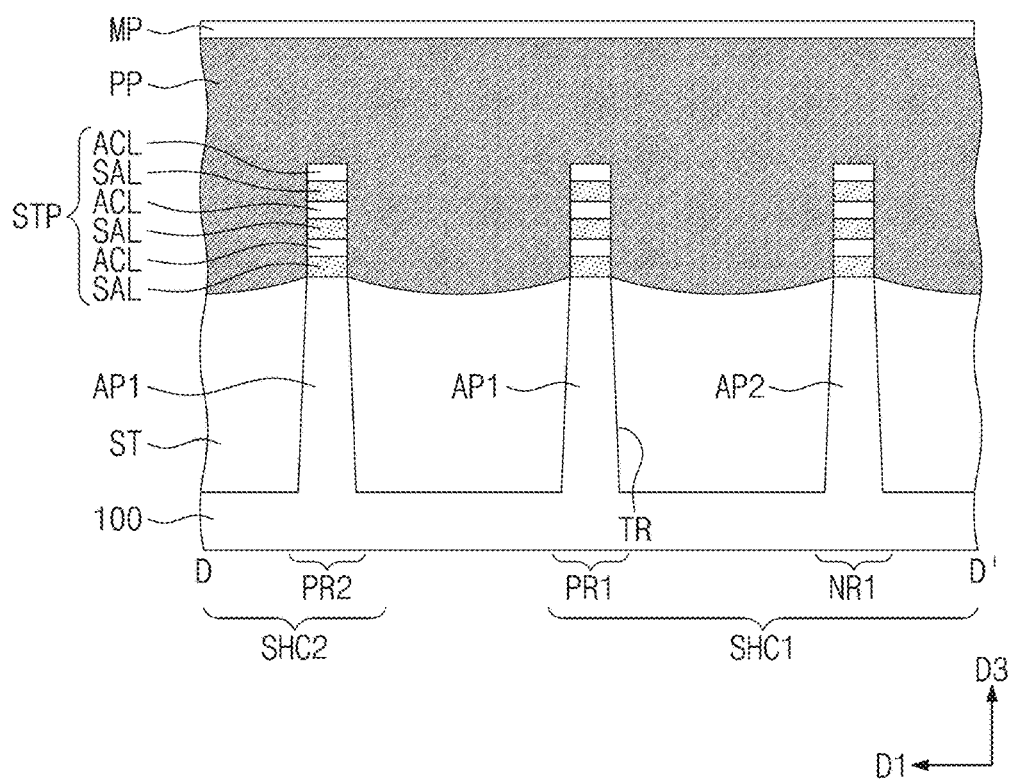
Figure 13A:
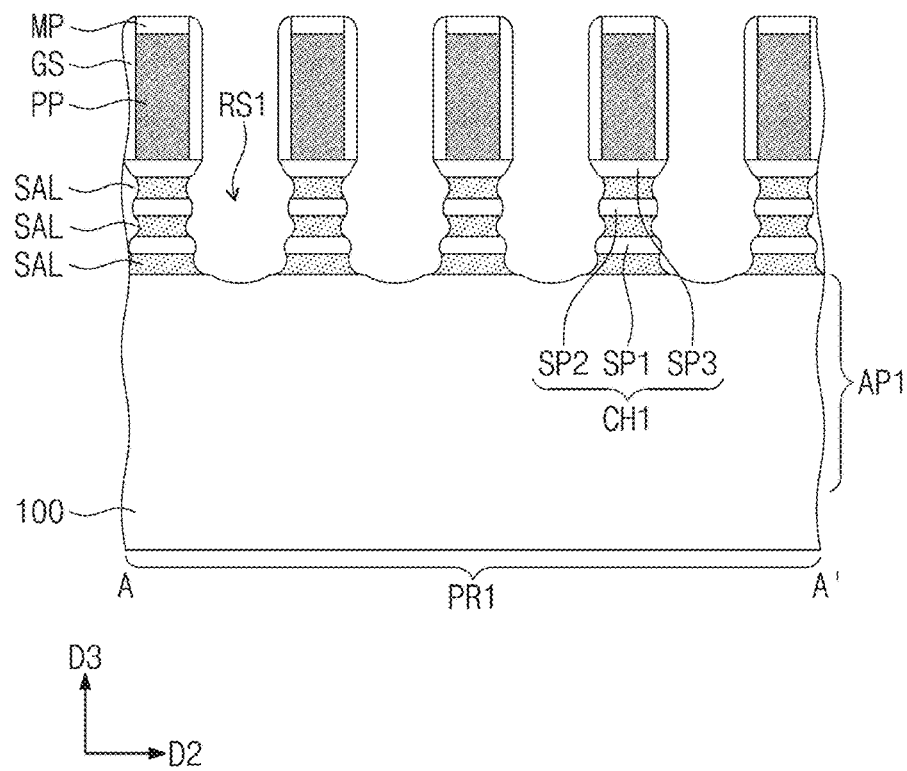
Figure 13B:
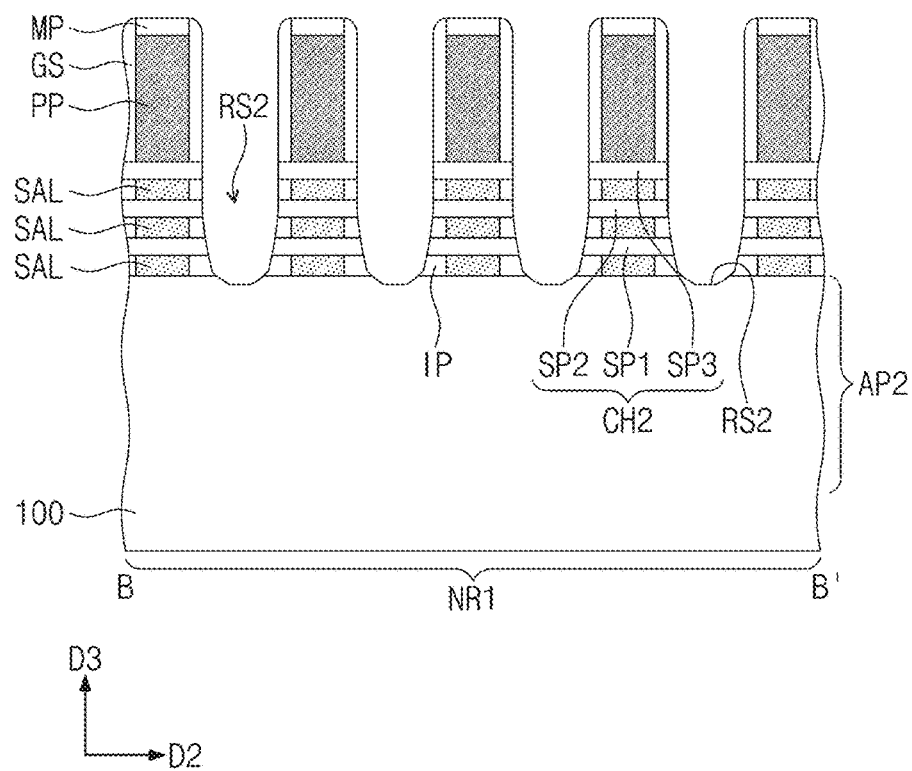
Figure 13C:
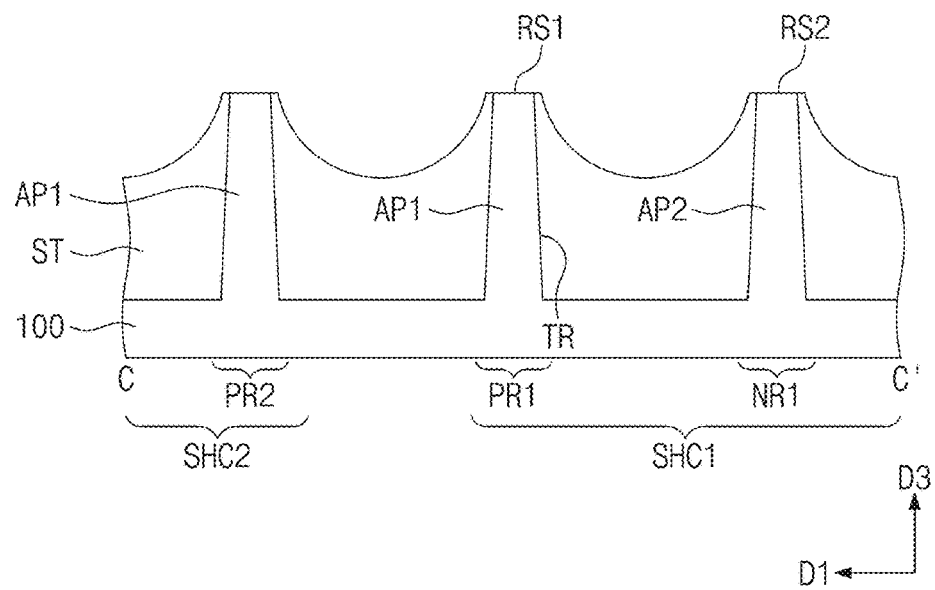
Figure 13D:
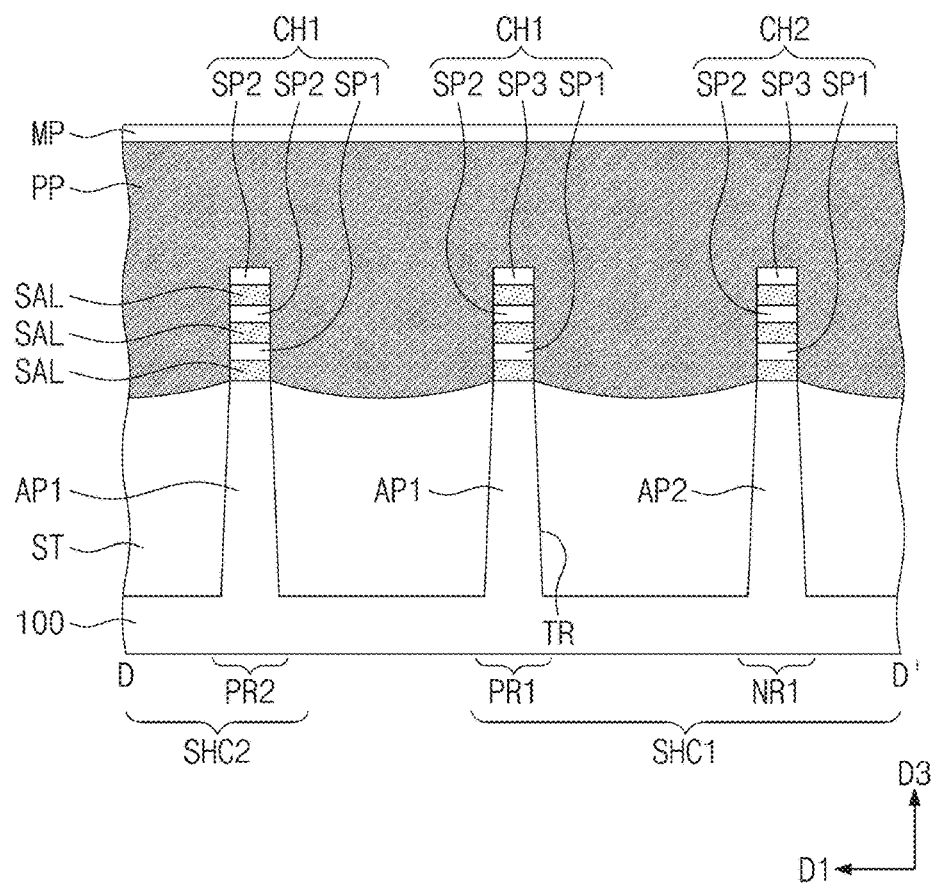

Referring to FIGS. 12A and 12B, sacrificial patterns PP may be formed on the substrate 100 to cross the stacking patterns STP. Each of the sacrificial patterns PP may be a line- or bar-shaped pattern that is extended in the first direction DE The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer GS may be a multi-layered structure including the first spacer GS1 and the second spacer GS2, as previously described with reference to FIG. 7A.

Referring to FIGS. 13A to 13D, the first recesses RS1 may be formed in the stacking pattern STP on the first active pattern APE The second recesses RS2 may be formed in the stacking pattern STP on the second active pattern AP2. During the formation of the first and second recesses RS1 and RS2, the device isolation layer ST may also be recessed at both sides of each of the first and second active patterns AP1 and AP2 (e.g., see FIG. 13C).

In detail, the first recesses RS1 may be formed by etching the stacking pattern STP on the first active pattern AP1 using the hard mask patterns MP and the gate spacers GS as an etch mask. The first recess RS1 may be formed between a pair of the sacrificial patterns PP. The formation of the first recess RS1 may include additionally performing a selective etching process on exposed portions of the sacrificial layers SAL. Accordingly, the first recess RS1 may be formed to have an inner side surface of a wavy shape.

The second recesses RS2 in the stacking pattern STP on the second active pattern AP2 may be formed by the same method as that for the first recesses RS1. However, the formation of the second recess RS2 may further include forming the inner spacers IP in recessed regions that are formed by selectively etching the sacrificial layer SAL. As a result, an inner surface of the second recess RS2 may not have a wavy shape, unlike the inner surface of the first recess RS1.

The first to third semiconductor patterns SP1, SP2, and SP3, which are sequentially stacked between adjacent ones of the first recesses RS1, may be respectively formed from the active layers ACL. The first to third semiconductor patterns SP1, SP2, and SP3, which are sequentially stacked between adjacent ones of the second recesses RS2, may be respectively formed from the active layers ACL. The first to third semiconductor patterns SP1, SP2, and SP3 between the adjacent ones of the first recesses RS1 may constitute the first channel pattern CH1. The first to third semiconductor patterns SP1, SP2, and SP3 between the adjacent ones of the second recesses RS2 may constitute the second channel pattern CH2.

Referring to FIGS. 14A to 14D, the first source/drain patterns SD1 may be formed in the first recesses RS1, respectively. In detail, the buffer layer BFL may be formed by a SEG process using an inner surface of the first recess RS1 as a seed layer. The buffer layer BFL may be grown using the first to third semiconductor patterns SP1, SP2, and SP3 and the substrate 100, which are exposed through the first recess RS1, as a seed layer. In an embodiment, the SEG process may include a chemical vapor deposition (CVD) process or a molecular beam epitaxy (MBE) process.

The buffer layer BFL may contain a semiconductor material (e.g., SiGe) whose lattice constant is larger than that of a semiconductor material of the substrate 100. The buffer layer BFL may contain a relatively low concentration of germanium (Ge). In an embodiment, the buffer layer BFL may contain only silicon (Si) without germanium (Ge). The germanium concentration of the buffer layer BFL may range from 0 at % to 10 at %.

A SEG process may be performed on the buffer layer BFL to form the main layer MAL. The main layer MAL may be formed to fully fill the first recess RS1. The main layer MAL may contain a relatively high concentration of germanium. In an embodiment, the germanium concentration of the main layer MAL may range from 30 at % to 70 at %.

The first source/drain pattern SD1 may be doped in-situ with p-type impurities (e.g., boron, gallium, or indium) during the formation of the buffer and main layers BFL and MAL. Alternatively, impurities may be injected into the first source/drain pattern SD1, after the formation of the first source/drain pattern SD1.

The second source/drain patterns SD2 may be formed in the second recesses RS2, respectively. In detail, the second source/drain pattern SD2 may be formed by a SEG process, in which an inner surface of the second recess RS2 is used as a seed layer. In an embodiment, the second source/drain pattern SD2 may be formed of or include the same semiconductor material (e.g., Si) as the substrate 100.

During the formation of the second source/drain pattern SD2, the second source/drain pattern SD2 may be doped in-situ with n-type impurities (e.g., phosphorus, arsenic, or antimony). Alternatively, impurities may be injected into the second source/drain pattern SD2, after the formation of the second source/drain pattern SD2.

Referring to FIGS. 15A to 15D, the first interlayer insulating layer 110 may be formed to cover the first and second source/drain patterns SD1 and SD2, the hard mask patterns MP, and the gate spacers GS. As an example, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All of the hard mask patterns MP may be removed during the planarization process. Accordingly, the first interlayered insulating layer 110 may have a top surface that is coplanar with the top surfaces of the sacrificial patterns PP and the top surfaces of the gate spacers GS.

A photolithography process may be performed to selectively open a region of the sacrificial pattern PP. For example, a region of the sacrificial pattern PP on the third and fourth borders BD3 and BD4 of the first single height cell SHC1 may be selectively opened. The opened region of the sacrificial pattern PP may be selectively etched and removed. The gate cutting pattern CT may be formed by filling a space, which is formed by removing the sacrificial pattern PP, with an insulating material.

Referring to FIGS. 16A to 16D, the exposed sacrificial patterns PP may be selectively removed. As a result of the removal of the sacrificial patterns PP, an outer region ORG exposing the first and second channel patterns CH1 and CH2 may be formed (e.g., see FIG. 16D). The removal of the sacrificial patterns PP may include a wet etching process which is performed using an etching solution capable of selectively etching polysilicon.

Figure 16A:
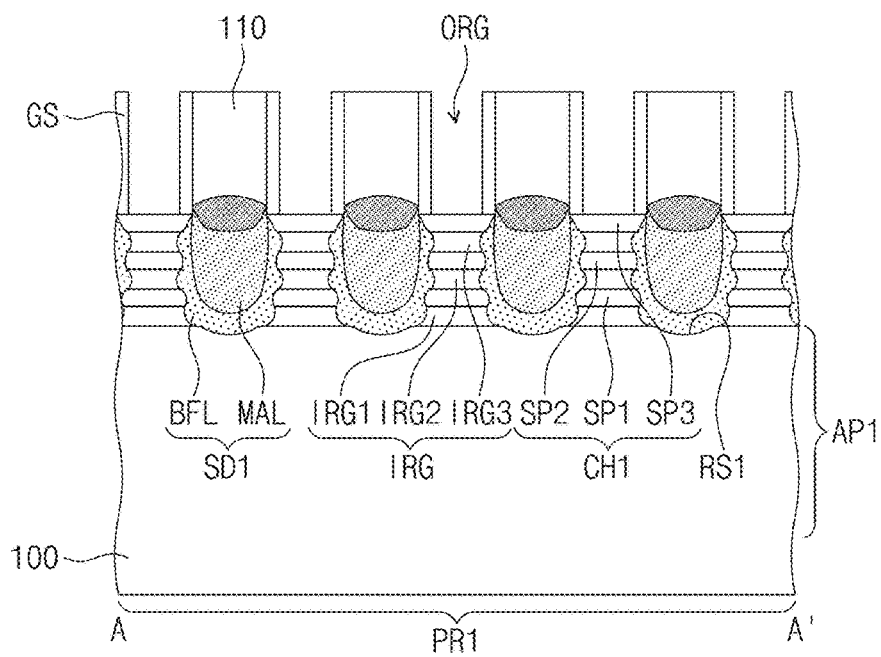
Figure 16B:
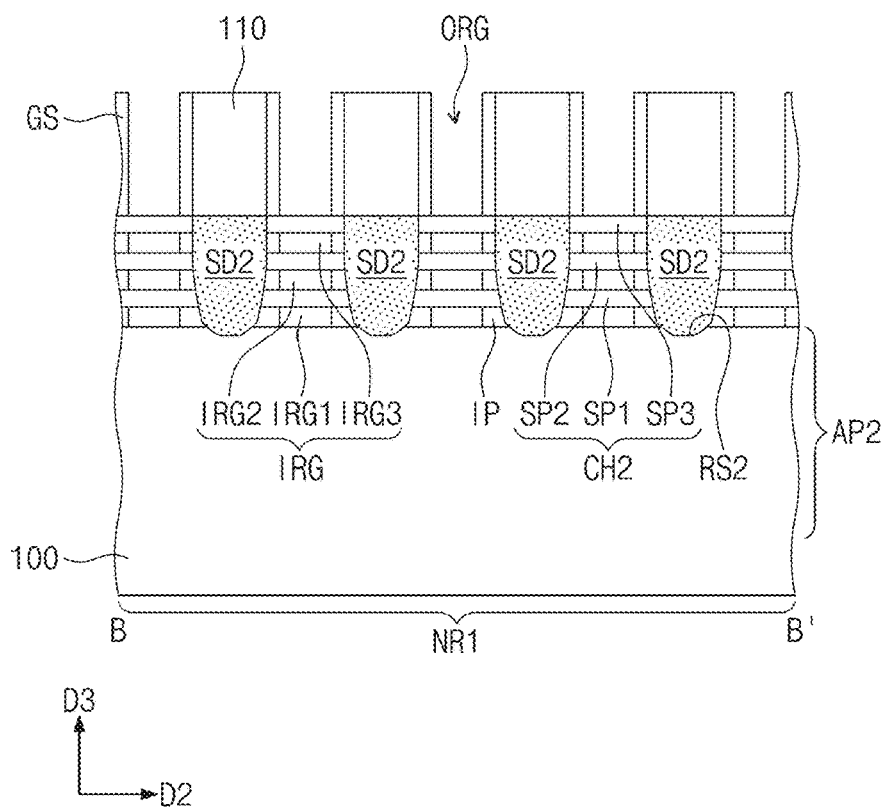
Figure 16C:
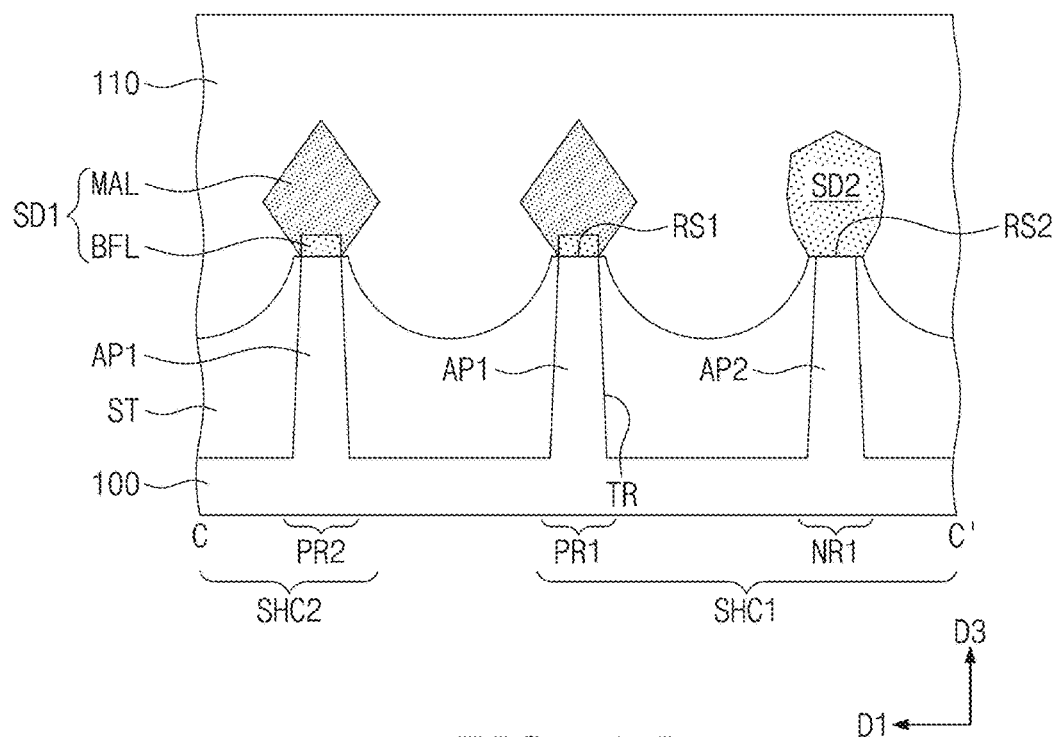
Figure 16D:
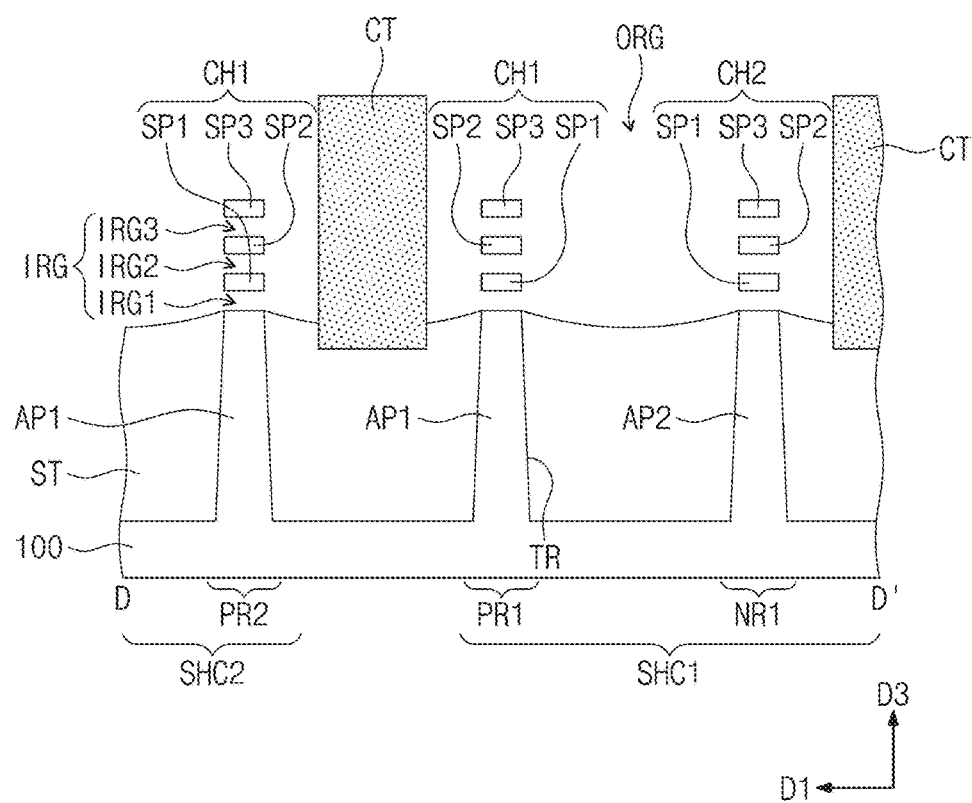
Figure 17A:
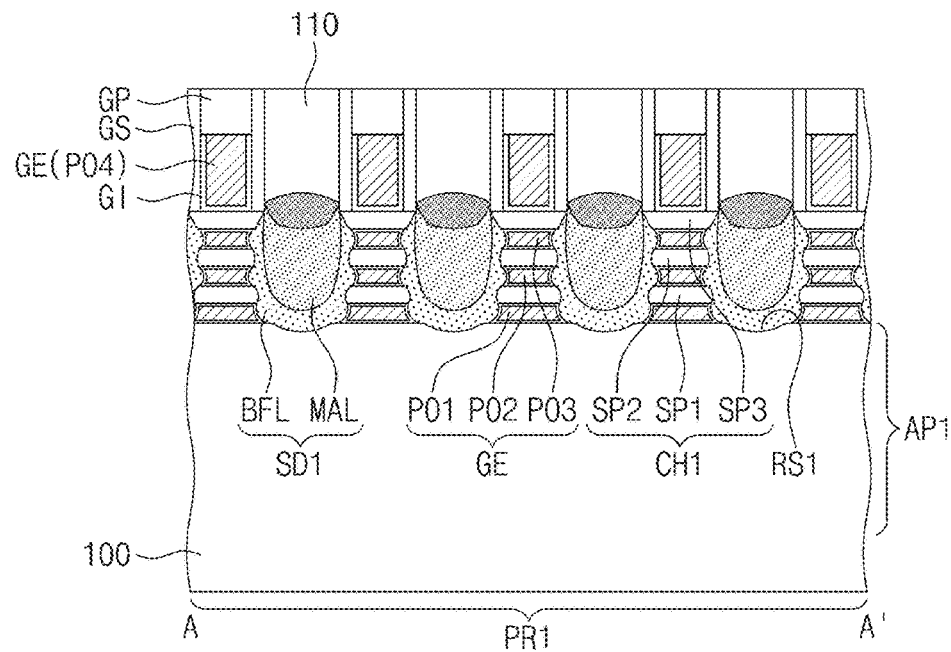
Figure 17B:
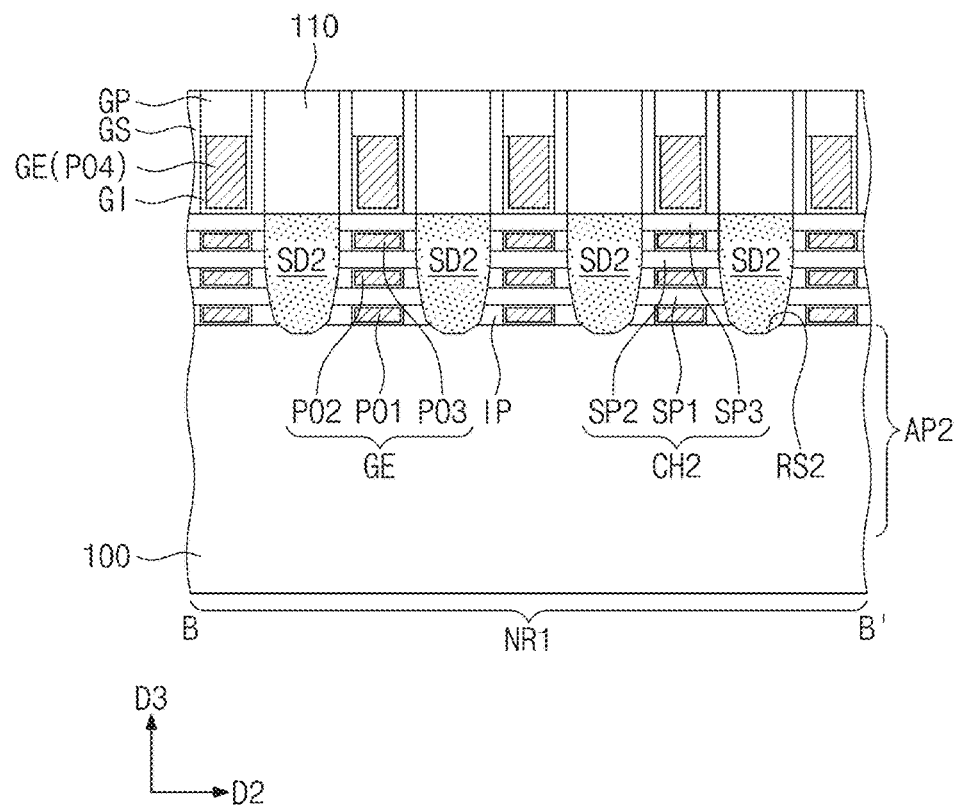
Figure 17C:
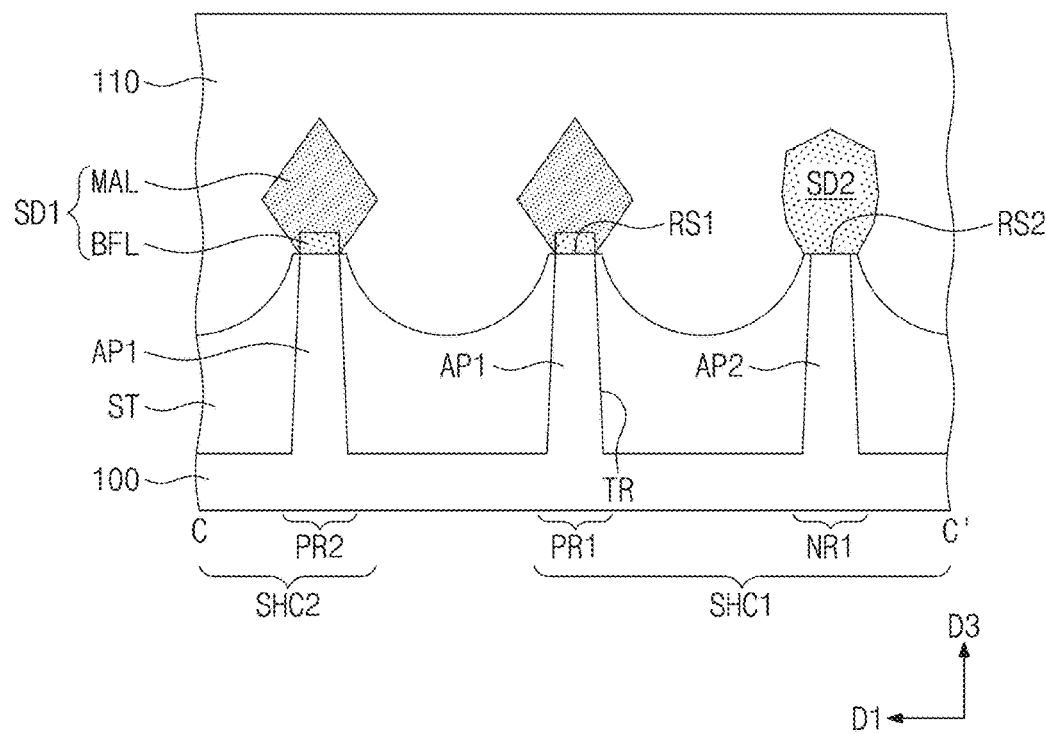
Figure 17D:
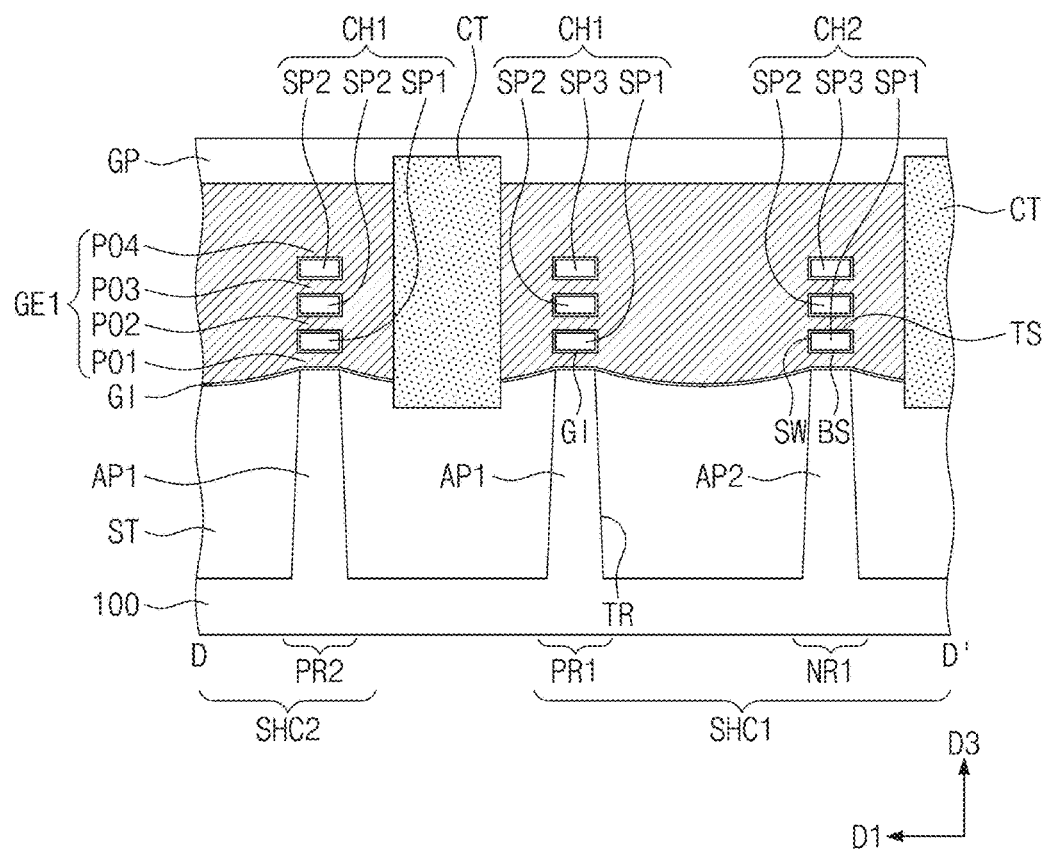

The sacrificial layers SAL exposed through the outer region ORG may be selectively removed to form inner regions IRG (e.g., see FIG. 16D). In detail, by performing a process of selectively etching the sacrificial layers SAL, it may be possible to leave the first to third semiconductor patterns SP1, SP2, and SP3 and to remove only the sacrificial layers SAL. The etching process may be chosen to have a high etch rate for a material (e.g., SiGe) having a relatively high germanium concentration. For example, the etching process may be chosen to have a high etch rate for a silicon germanium layer whose germanium concentration is higher than 10 at %.

The sacrificial layers SAL on the first and second PMOSFET regions PR1 and PR2 and the first and second NMOSFET regions NR1 and NR2 may be removed during the etching process. The etching process may be a wet etching process. An etchant material, which is used in the etching process, may be chosen to quickly remove the sacrificial layer SAL having a relatively high germanium concentration. Meanwhile, the first source/drain pattern SD1 on the first and second PMOSFET regions PR1 and PR2 may be protected from the etching process by the buffer layer BFL having a relatively low germanium concentration.

Referring back to FIG. 16D, since the sacrificial layers SAL are selectively removed, only the first to third semiconductor patterns SP1, SP2, and SP3, which are stacked on each of the first and second active patterns AP1 and AP2, may be left. Empty regions, which are formed by removing the sacrificial layers SAL, may form first to third inner regions IRG1, IRG2, and IRG3, respectively.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 17A to 17D, the gate insulating layer GI may be conformally formed on the exposed first to third semiconductor patterns SP1, SP2, and SP3. The gate electrode GE may be formed on the gate insulating layer GI. The gate electrode GE may include the first to third portions PO1, PO2, and PO3, which are respectively formed in the first to third inner regions IRG1, IRG2, and IRG3, and the fourth portion PO4, which is formed in the outer region ORG.

The gate electrode GE may be recessed to have a reduced height. Upper portions of first and second gate cutting patterns CT1 and CT2 may be slightly recessed, during the recessing of the gate electrode GE. The gate capping pattern GP may be formed on the recessed gate electrode GE.

Referring back to FIGS. 5 and 6A to 6D, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and to be electrically connected to the first and second source/drain patterns SD1 and SD2. The gate contact GC may be formed to penetrate the second interlayer insulating layer 120 and the gate capping pattern GP and to be electrically connected to the gate electrode GE.

The formation of each of the active and gate contacts AC and GC may include forming the barrier pattern BM and forming the conductive pattern FM on the barrier pattern BM. The barrier pattern BM may be conformally formed and may include a metal layer and a metal nitride layer. The conductive pattern FM may be formed of or include a low resistance metal.

A pair of the division structures DB may be formed at both sides of each of the first and second single height cells SHC1 and SHC2. The division structure DB may penetrate the second interlayer insulating layer 120 and the gate electrode GE and may be extended into the active pattern AP1 or AP2. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. The fourth interlayer insulating layer 140 may be formed on the third interlayer insulating layer 130. The second metal layer M2 may be formed in the fourth interlayer insulating layer 140.

Figure 14A:
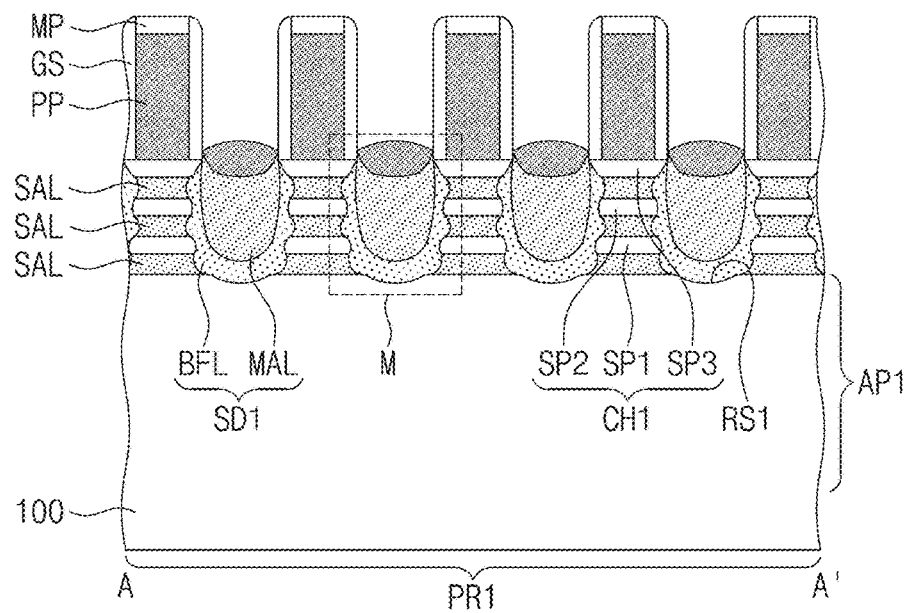
Figure 14B:
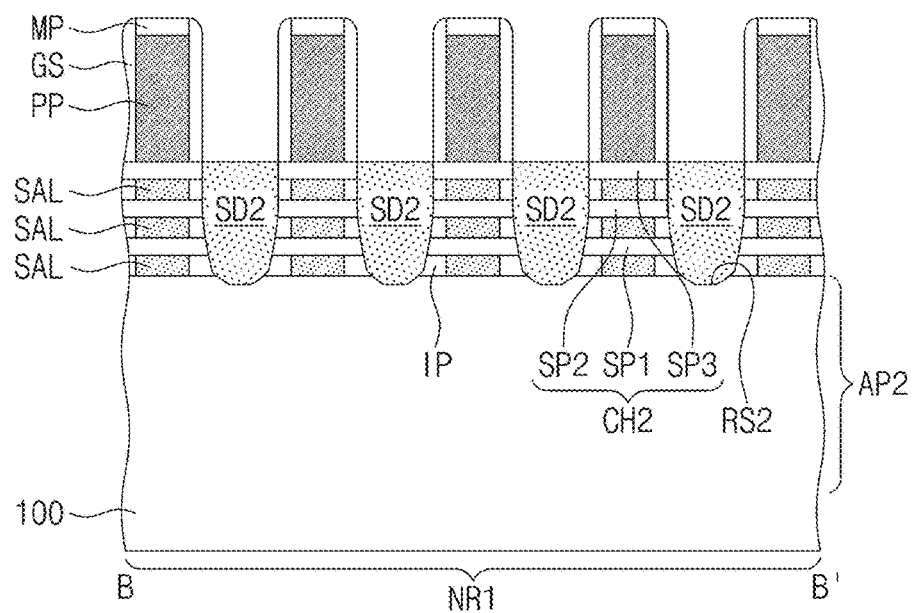
Figure 14C:
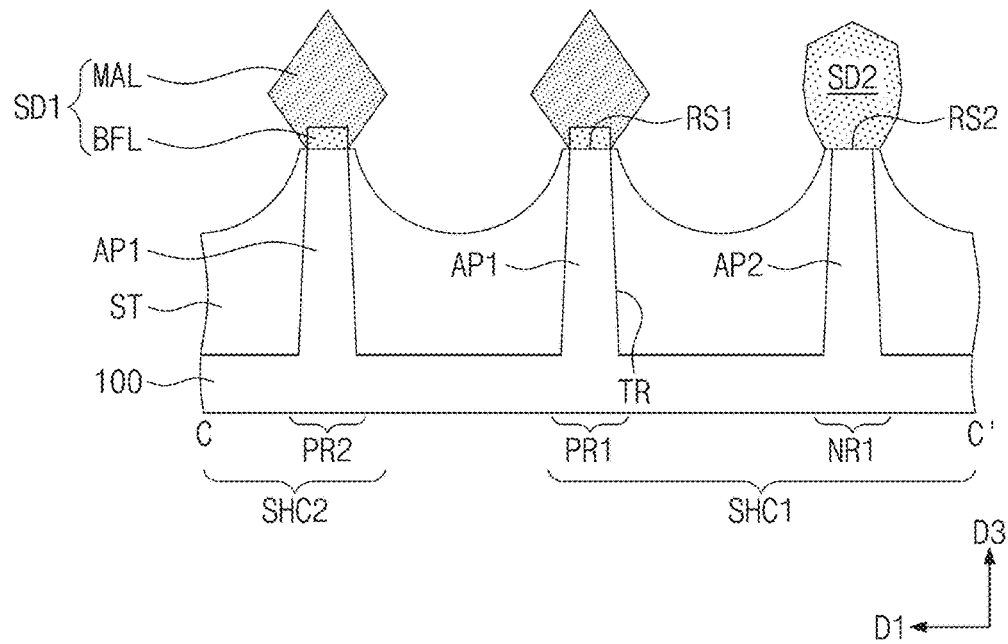
Figure 14D:
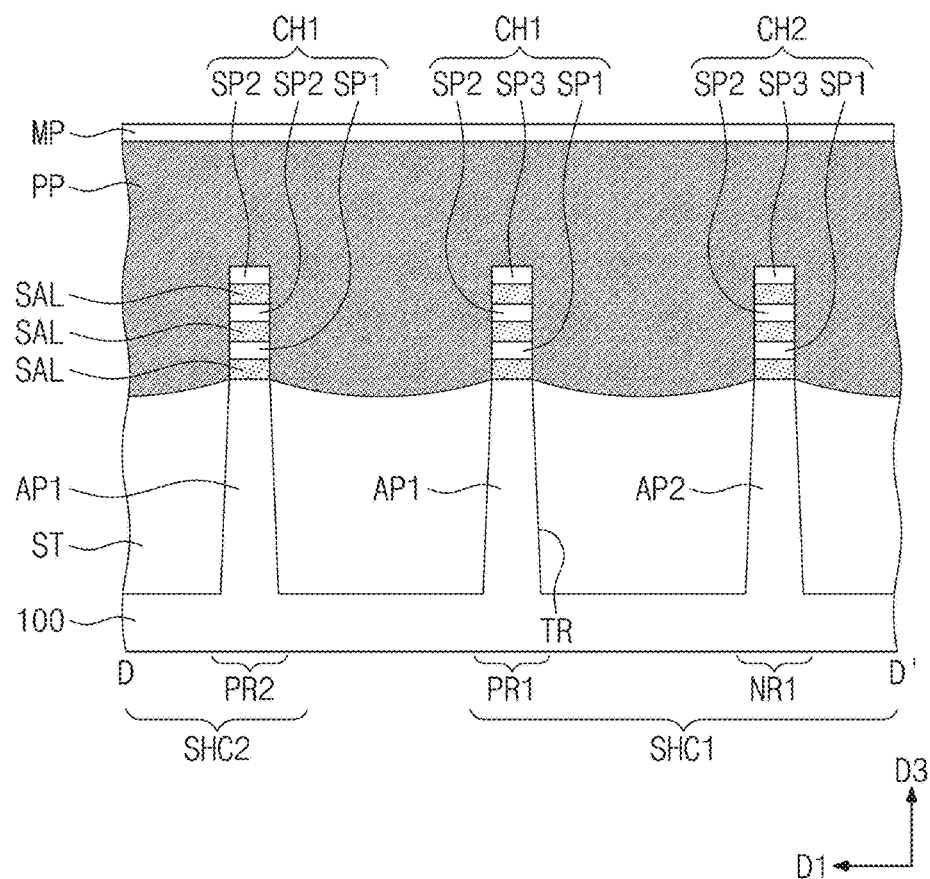
Figure 15A:
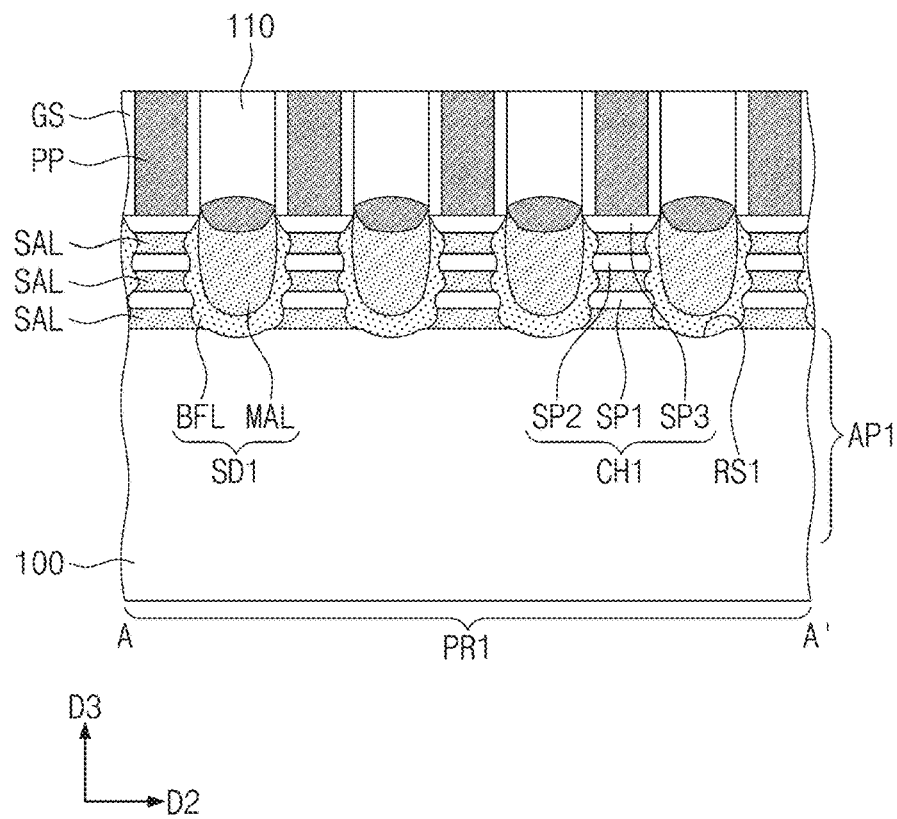
Figure 15B:
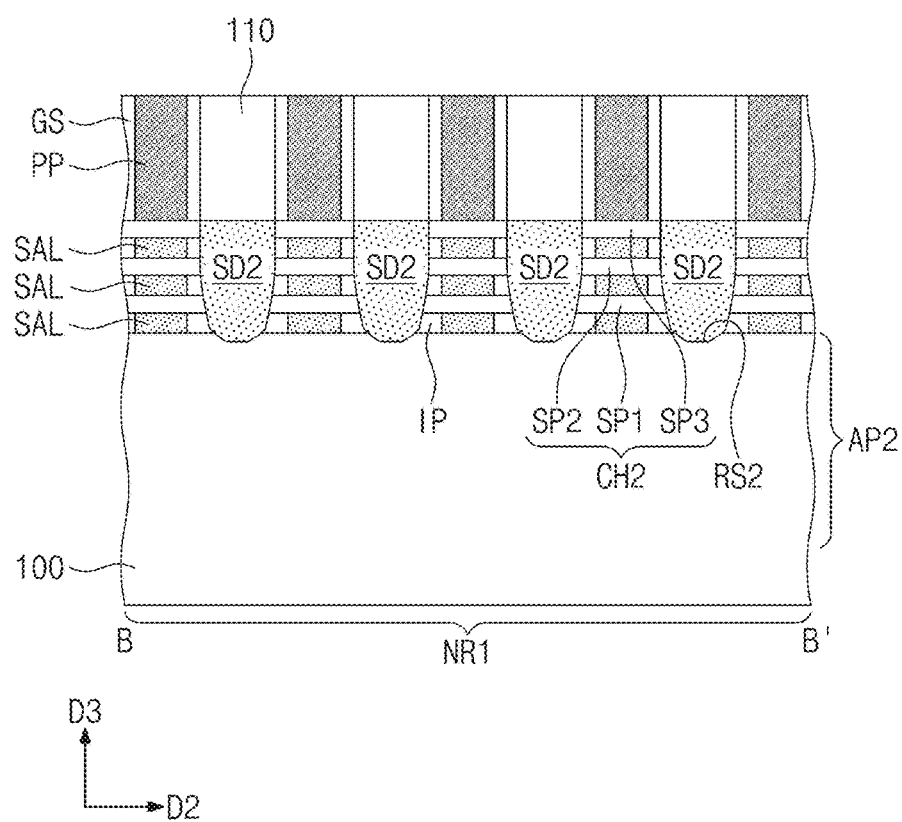
Figure 15C:
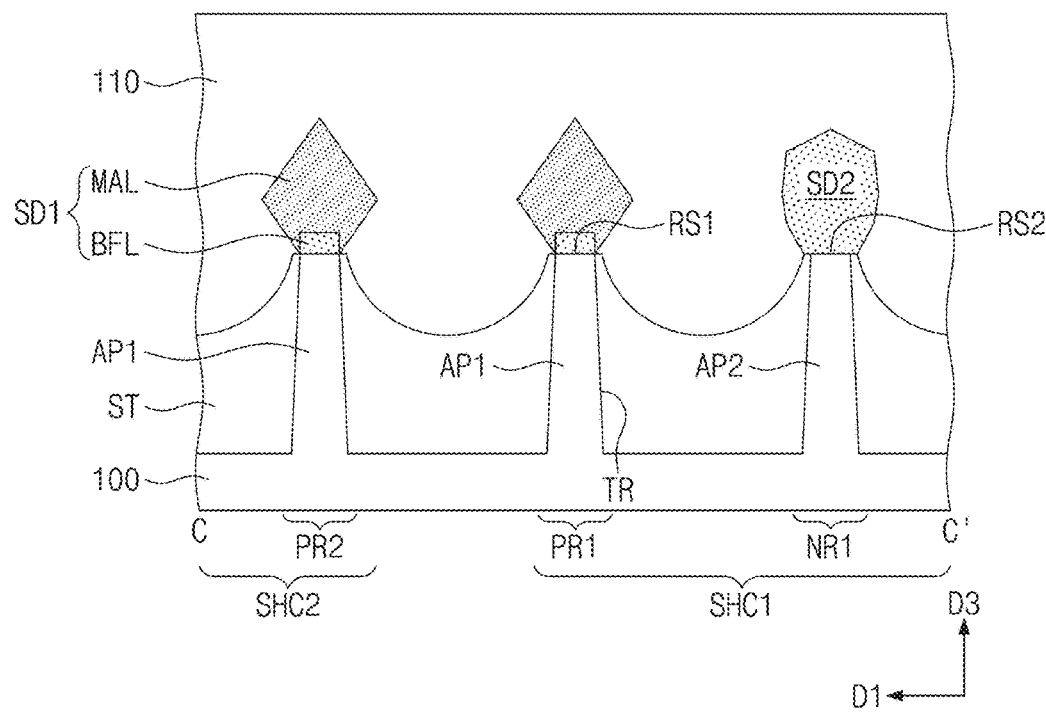
Figure 15D:
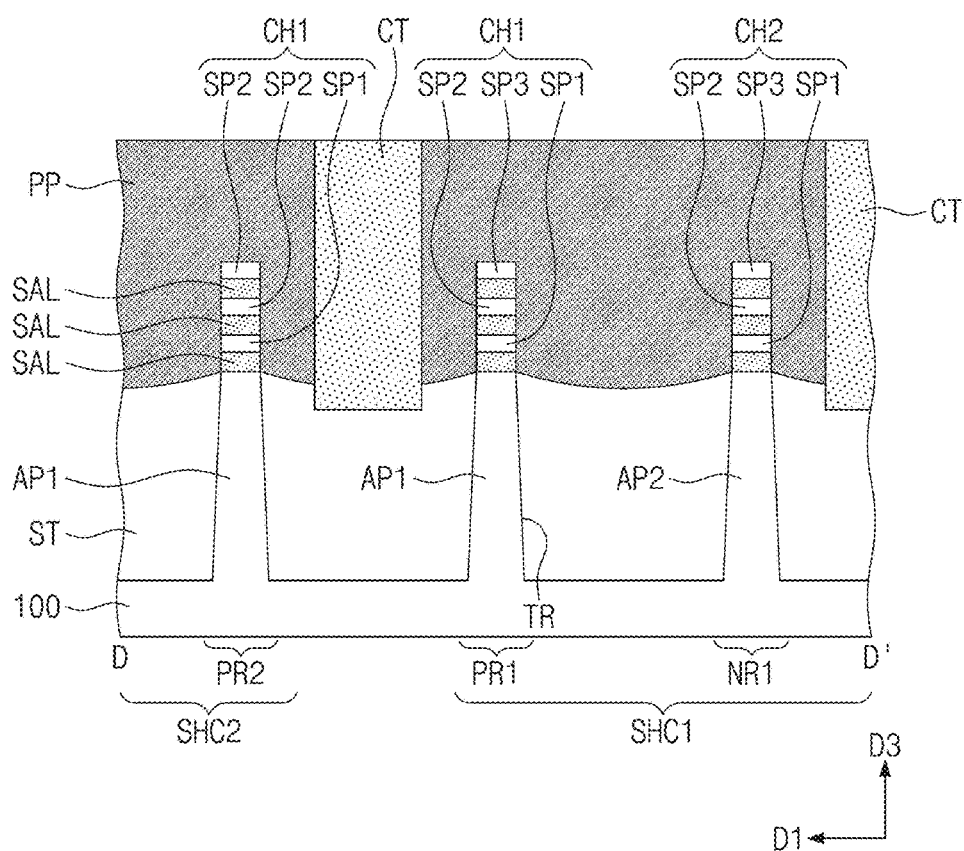
Figure 18:
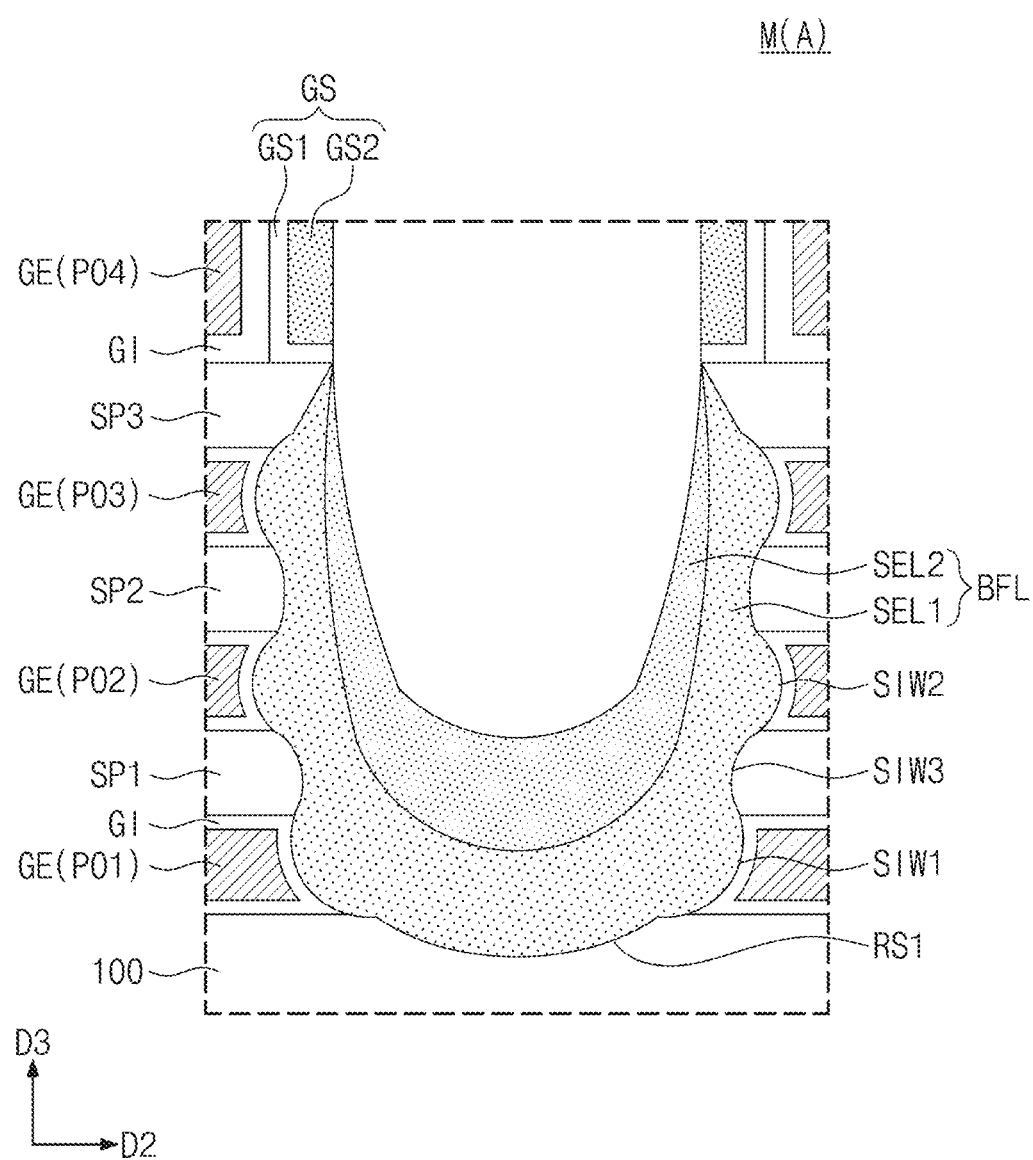
FIGS. 18, 19A, 19B, 20A, 20B, and 21 are enlarged sectional views illustrating a method of forming a first source/drain pattern in a portion 'M' of FIG. 14A.
Figure 19A:
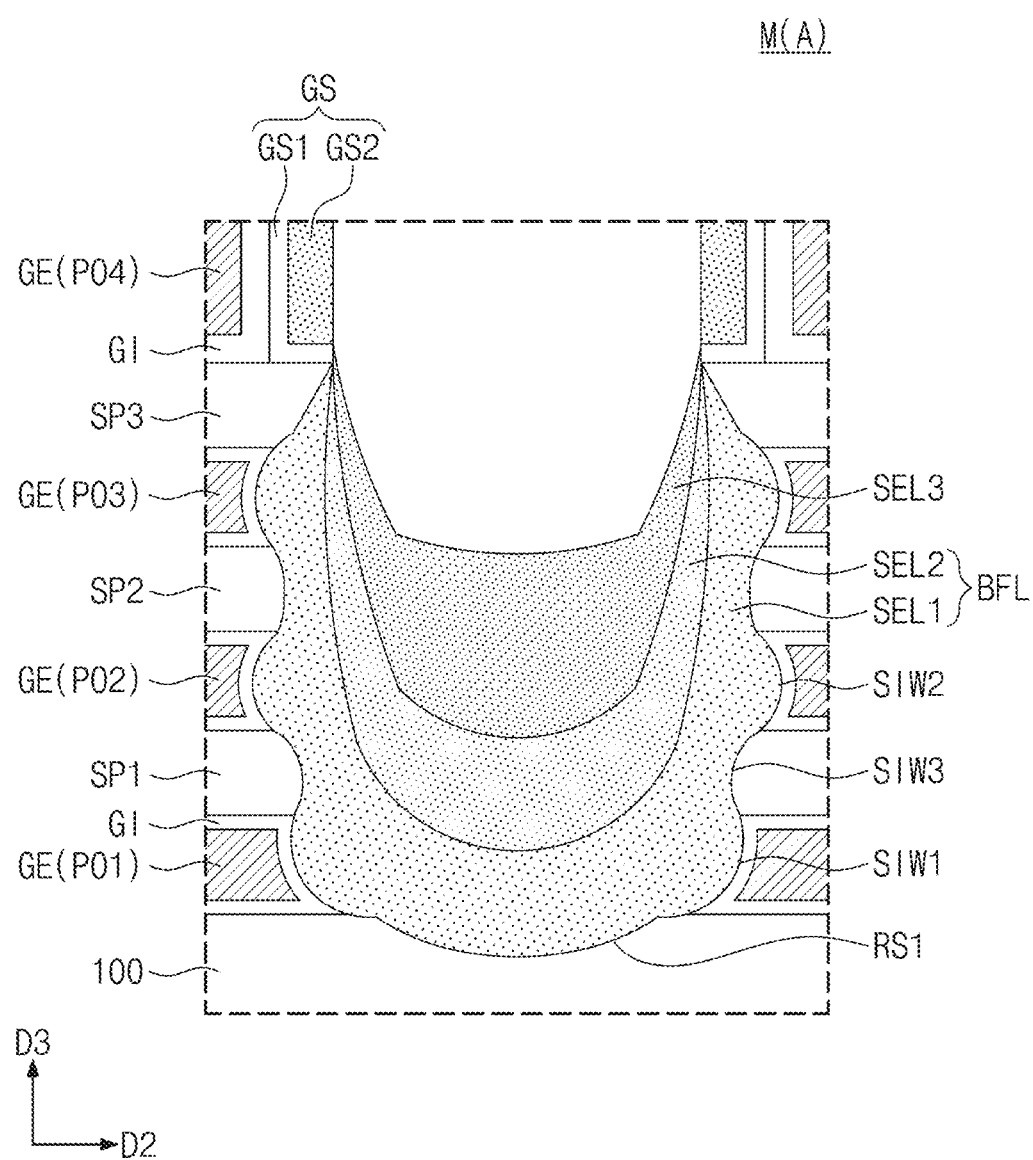
Figure 19B:
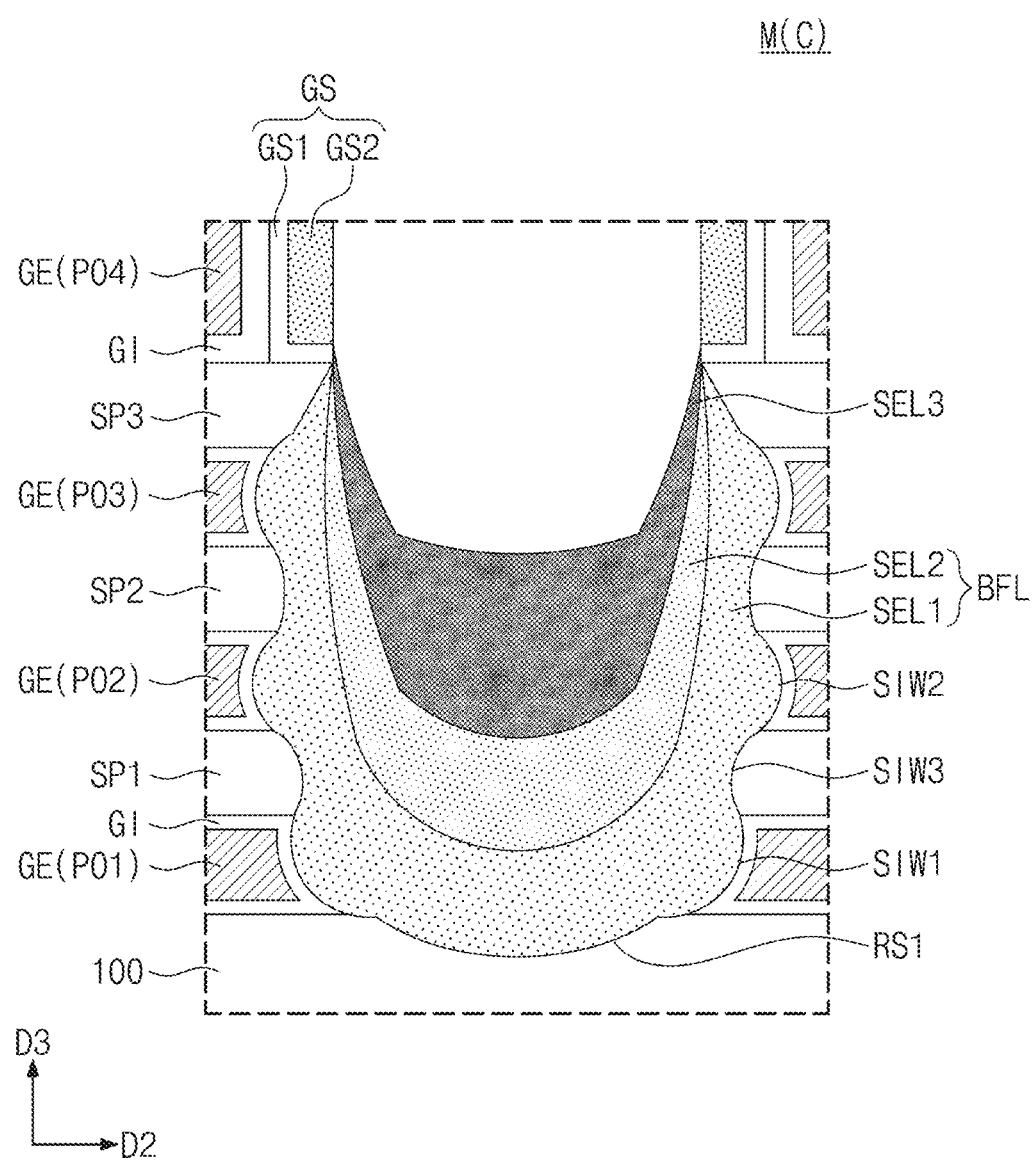
Figure 20A:
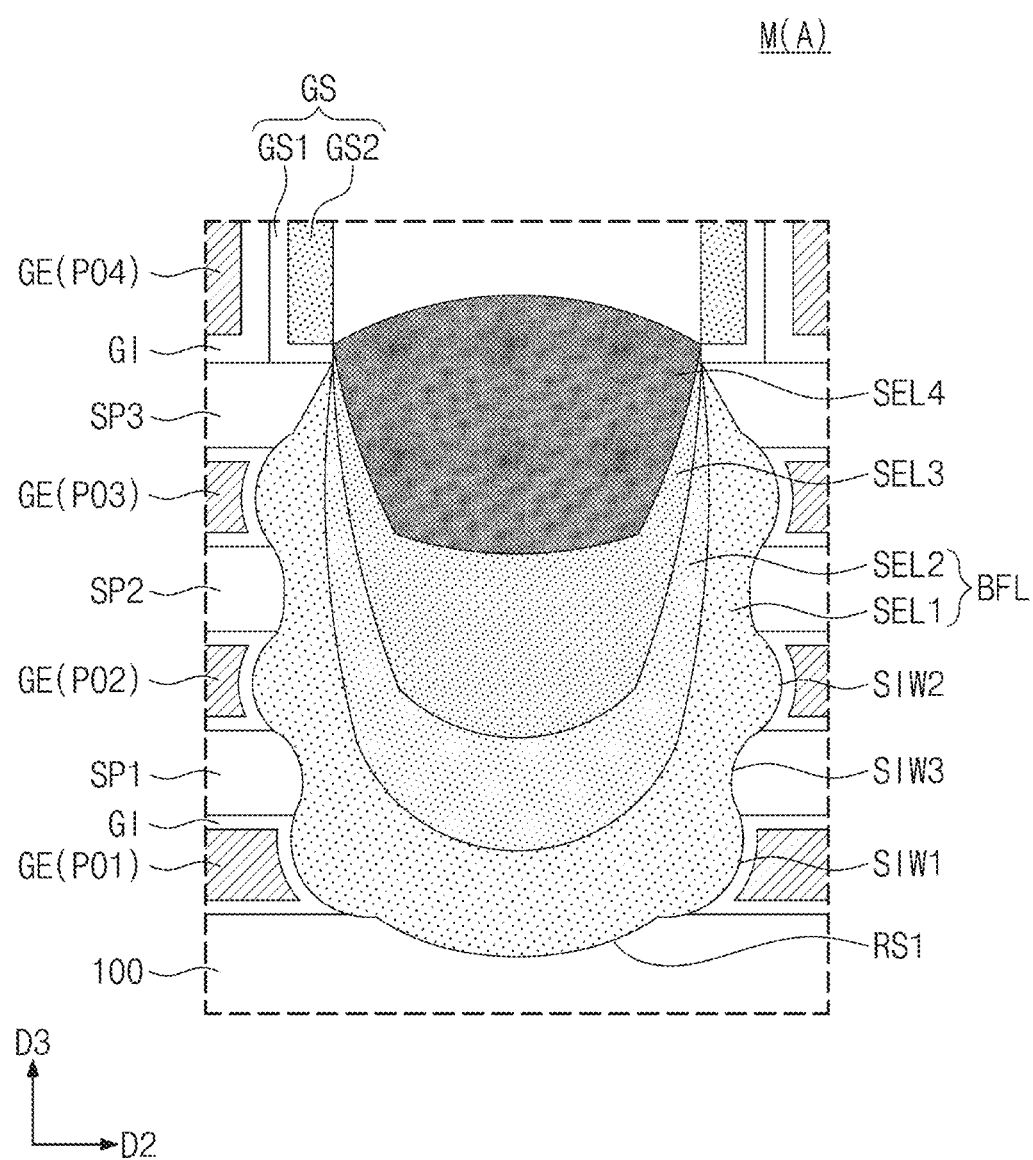

FIGS. 18, 19A, 19B, 20A, 20B, and 21 are enlarged sectional views illustrating a method of forming a first source/drain pattern in a portion 'M' of FIG. 14A. FIGS. 19A and 20A may correspond to a semiconductor device formed on the center region of the substrate of FIG. 1, and FIGS. 19B and 20B may correspond to a semiconductor device formed on the edge region of the substrate of FIG. 1.

Referring to FIG. 18, the first recess RS1 may be formed to penetrate the stacking pattern STP. The first recess RS1 may be formed between an adjacent pair of the sacrificial patterns PP. The first recess RS1 may be formed using an adjacent pair of the gate spacers GS as an etch mask.

The sacrificial layers SAL, which are exposed through the first recess RS1, may be further recessed, such that the first recess RS1 has a wavy inner surface. In detail, the inner surface of the first recess RS1 may include the first side surface SIW1, which protrudes toward the sacrificial layer SAL, the second side surface SIW2, which protrudes toward the sacrificial layer SAL, and the third side surface SIW3, which is provided between the first and second side surfaces SIW1 and SIW2 and has a concave shape.

A first SEG process may be performed to form the first semiconductor layer SEL1 on the inner surface of the first recess RS1. In an embodiment, the first semiconductor layer SEL1 may be formed of or include silicon germanium (SiGe). The first semiconductor layer SEL1 may be formed to have a germanium concentration of 4 at % to 8 at %. Due to the wavy profile of the inner surface of the first recess RS1, the first semiconductor layer SEL1 may also have a wavy profile.

A second SEG process may be performed on the first semiconductor layer SEL1 to form the second semiconductor layer SEL2. For example, the second semiconductor layer SEL2 may be formed of or include silicon-germanium (SiGe). The second semiconductor layer SEL2 may be formed to have a germanium concentration of 4 at % to 10 at %.

In an embodiment, the second semiconductor layer SEL2 may be formed to have the same germanium concentration as that of the first semiconductor layer SELL In another embodiment, the second semiconductor layer SEL2 may be formed to have a germanium concentration that is higher than that of the first semiconductor layer SEL1.

The first and second semiconductor layers SEL1 and SEL2 may constitute a buffer layer RFL. Unlike the illustrated structure, the first and second semiconductor layers SEL1 and SEL2 of the buffer layer RFL may have no distinct or observable interface therebetween.

Referring to FIGS. 1, 19A, and 19B, a third SEG process may be performed on the buffer layer RFL to form the third semiconductor layer SEL3. For example, the third semiconductor layer SEL3 may be formed of or include silicon germanium (SiGe). The third SEG process may be performed such that the third semiconductor layer SEL3 has a germanium concentration of 30 at % to 70 at %.

The germanium concentration of the third semiconductor layer SEL3, which is formed in the center region CR of the substrate 100 by the third SEG process, may be higher than the germanium concentration of the third semiconductor layer SEL3, which is formed in the edge region ER of the substrate 100 by the third SEG process. For example, the germanium concentration of the third semiconductor layer SEL3, which is formed in the center region CR, may have a concentration ranging from 40 at % to 70 at % (e.g., see FIG. 19A), and the germanium concentration of the third semiconductor layer SEL3, which is formed in the edge region ER, may have a concentration ranging from 30 at % to 60 at % (e.g., see FIG. 19B).

The impurity concentration of the third semiconductor layer SEL3, which is formed in the center region CR of the substrate 100 in by the third SEG process, may be lower than the impurity concentration of the third semiconductor layer SEL3, which is formed in the edge region ER of the substrate 100 by the third SEG process. For example, the impurity concentration of the third semiconductor layer SEL3, which is formed in the center region CR, may range from 1E18 atoms/cm$^3$ to 1E21 atoms/cm$^3$ (e.g., see FIG. 19A), and the impurity concentration of the third semiconductor layer SEL3, which is formed in the edge region ER, may range from 1E21 atoms/cm$^3$ to 5E22 atoms/cm$^3$ (e.g., see FIG. 19B).

Figure 20B:
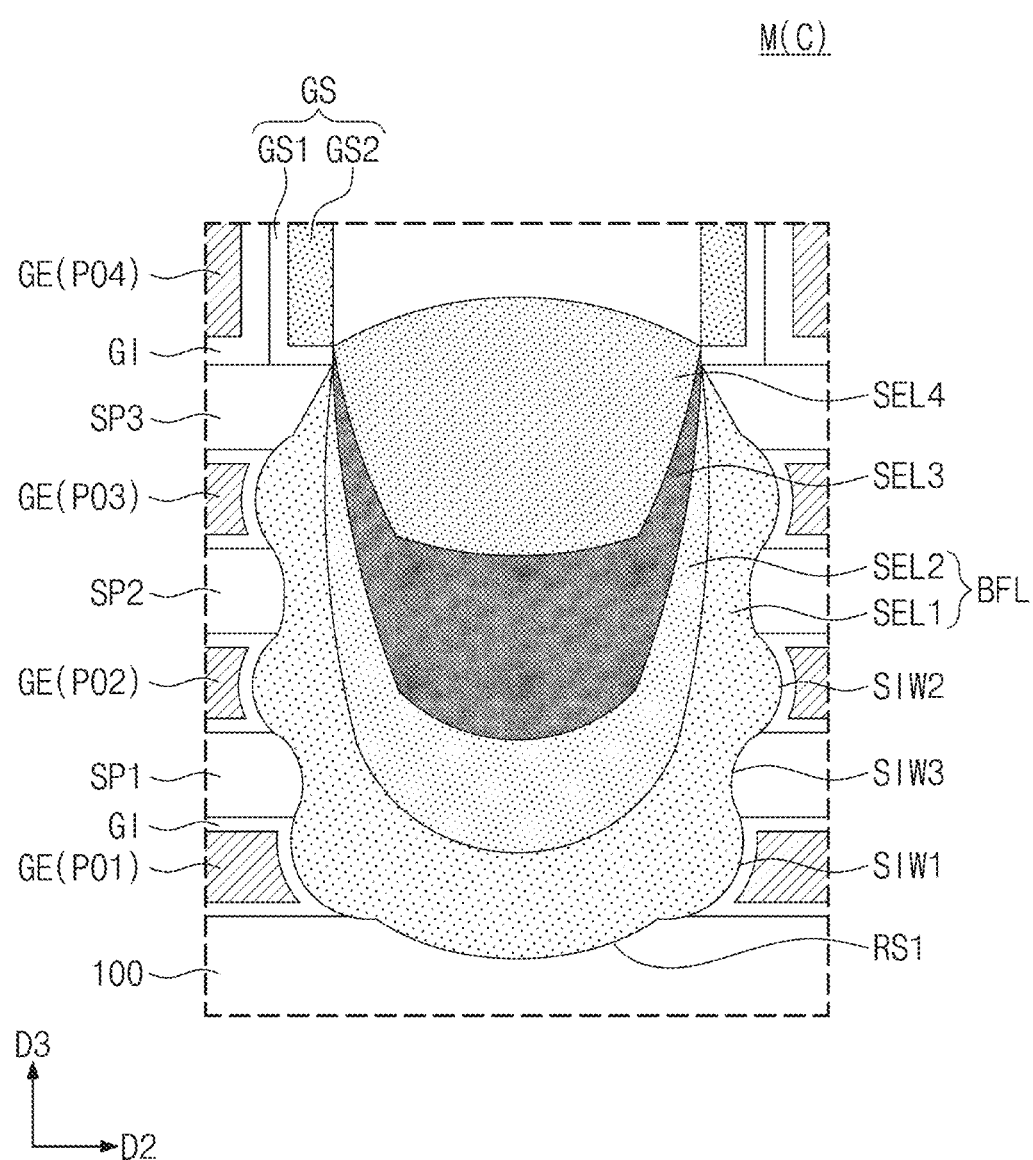

Referring to FIGS. 1, 20A, and 20B, a fourth SEG process may be performed on the third semiconductor layer SEL3 to form the fourth semiconductor layer SEL4. The fourth semiconductor layer SEL4 may be formed to fully fill the first recess RS1. The fourth semiconductor layer SEL4 may be formed to have a top surface that is higher than that of the third semiconductor pattern SP3. For example, the fourth semiconductor layer SEL4 may be formed of or include silicon-germanium (SiGe). The fourth semiconductor layer SEL4 may be formed to have a germanium concentration ranging from 30 at % to 70 at %.

The germanium concentration of the fourth semiconductor layer SEL4, which is formed in the center region CR of the substrate 100 by the fourth SEG process, may be lower than the germanium concentration of the fourth semiconductor layer SEL4, which is formed in the edge region ER of the substrate 100 by the fourth SEG process. For example, the germanium concentration of the fourth semiconductor layer SEL4, which is formed in the center region CR, may have a concentration ranging from 30 at % to 60 at % (e.g., see FIG. 20A), and the germanium concentration of the fourth semiconductor layer SEL4, which is formed in the edge region ER, may have a concentration ranging from 40 at % to 70 at % (e.g., see FIG. 20B).

The impurity concentration of the fourth semiconductor layer SEL4, which is formed in the center region CR of the substrate 100 by the fourth SEG process, may be higher than the impurity concentration of the fourth semiconductor layer SEL4, which is formed in the edge region ER of the substrate 100 by the fourth SEG process. For example, the impurity concentration of the fourth semiconductor layer SEL4, which is formed in the center region CR, may range from 1E21 atoms/cm$^3$ to 5E22 atoms/cm$^3$ (e.g., see FIG. 20A), and the impurity concentration of the fourth semiconductor layer SEL4, which is formed in the edge region ER, may range from 1E18 atoms/cm$^3$ to 1E21 atoms/cm$^3$ (e.g., see FIG. 20B).

Figure 21:
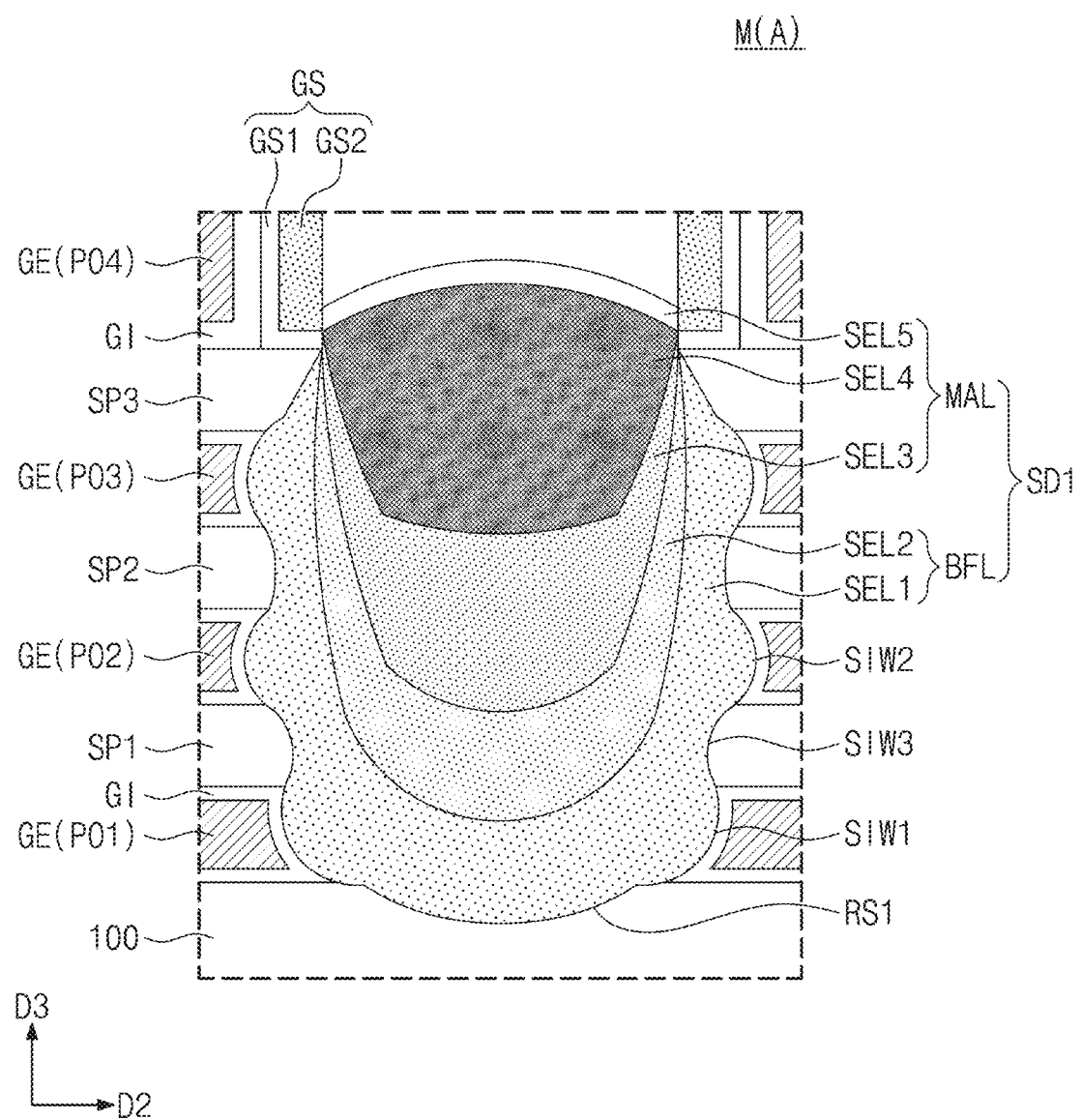

Referring to FIG. 21, a fifth SEG process may be performed on the fourth semiconductor layer SEL4 to form the fifth semiconductor layer SEL5. The fifth semiconductor layer SEL5 may be formed to conformally cover an exposed surface of the main layer MAL. The fifth semiconductor layer SEL5 may be formed of or include silicon (Si), and a silicon concentration of the fifth semiconductor layer SEL5 may range from 98 at % to 100 at %.

Some embodiments of inventive concepts will be further described below. In the following description of these embodiments, an element previously described with reference to FIGS. 2 to 6D may be identified by the same reference number without repeating an overlapping description thereof, for concise description.

Figure 24A:
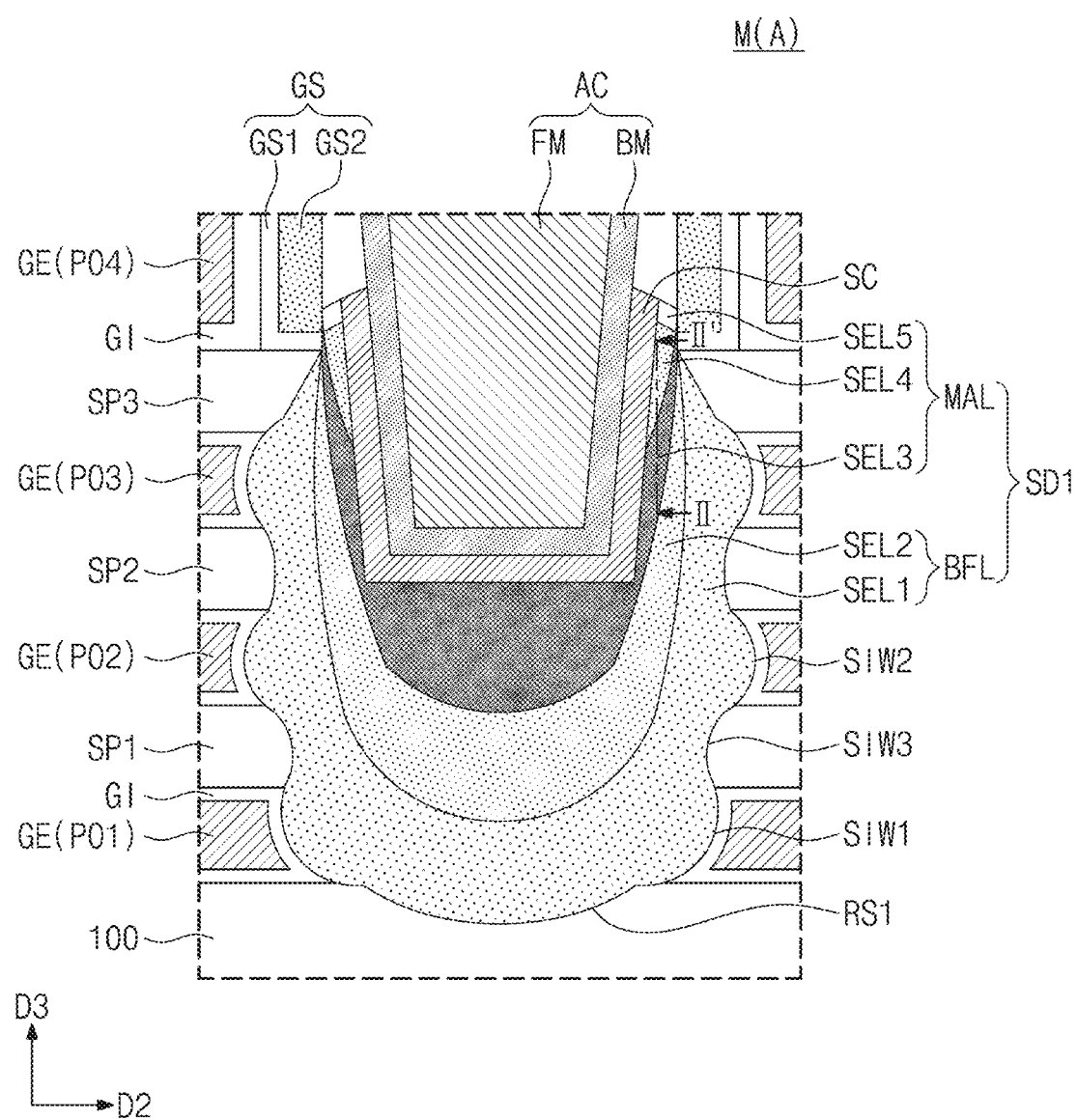
FIGS. 24A to 27B are diagrams illustrating an embodiment of inventive concepts.
Figure 25A:
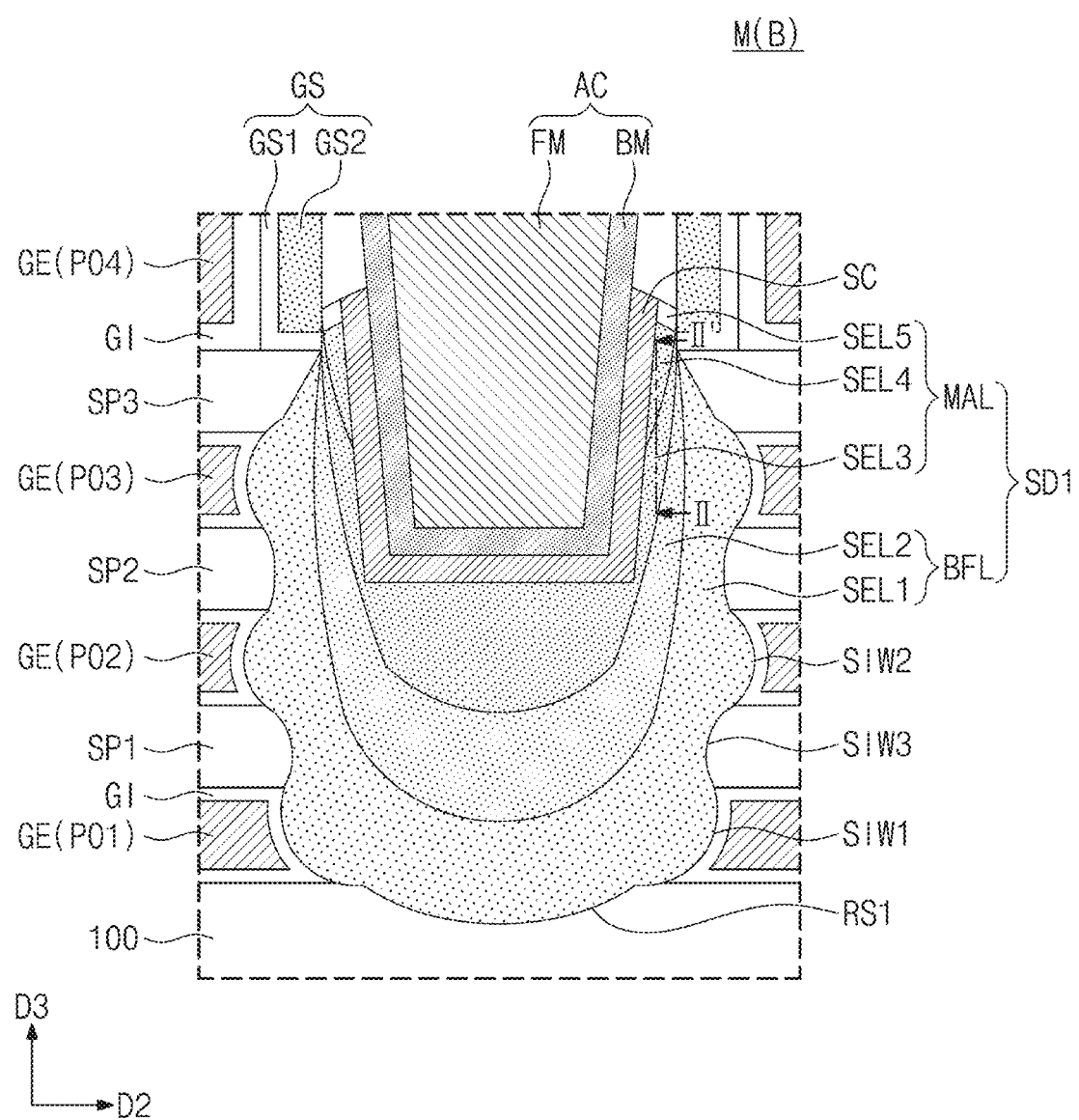
Figure 25B:
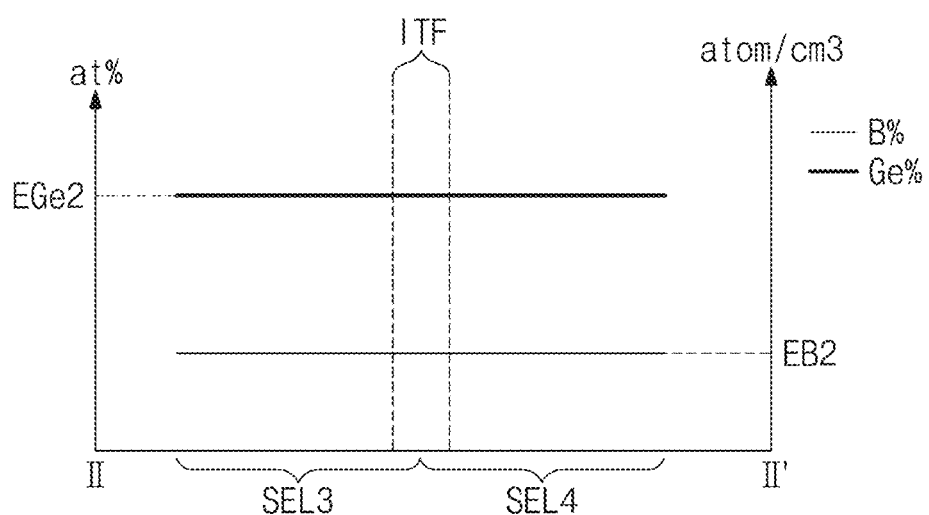
Figure 26A:
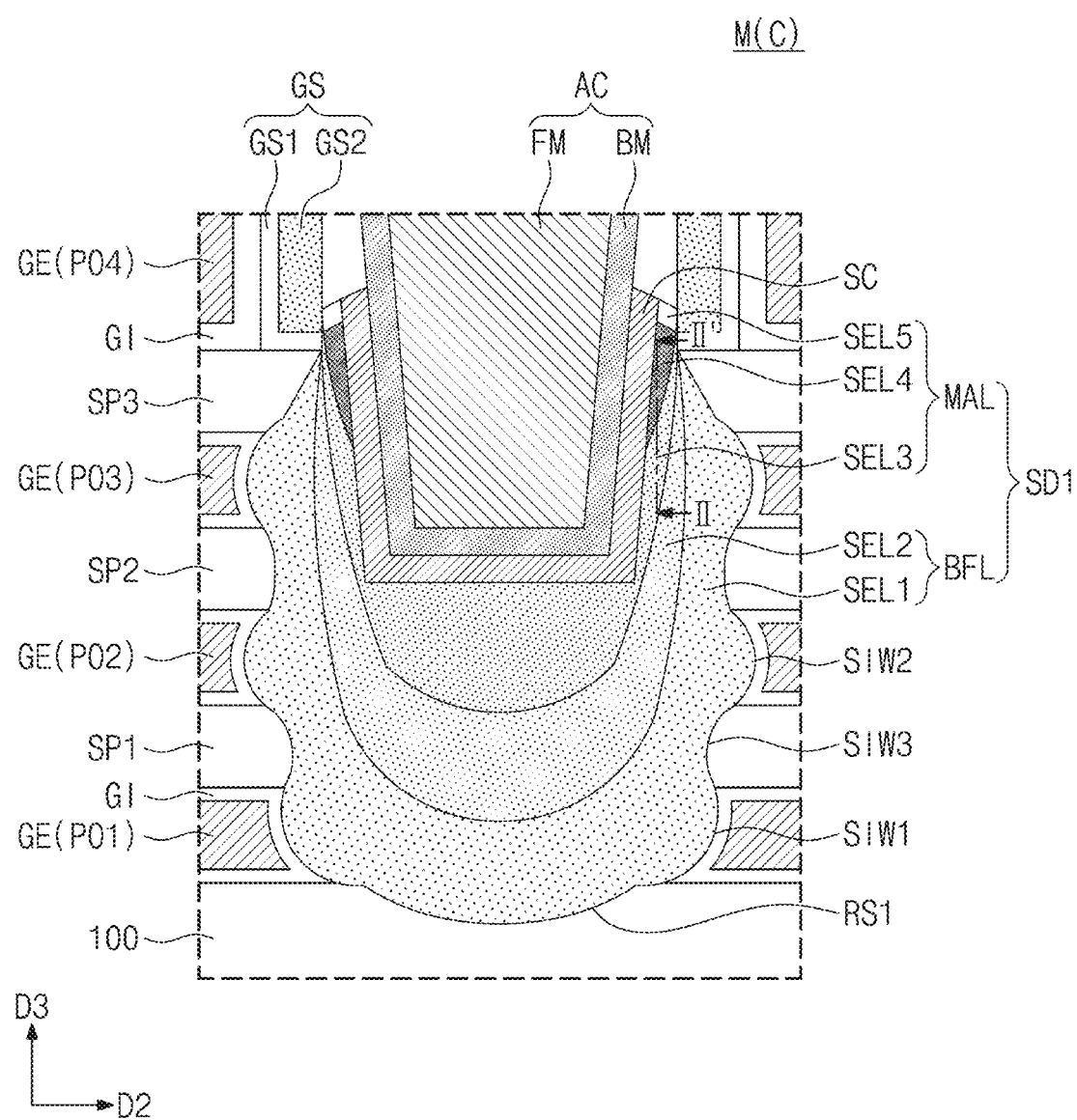
Figure 26B:
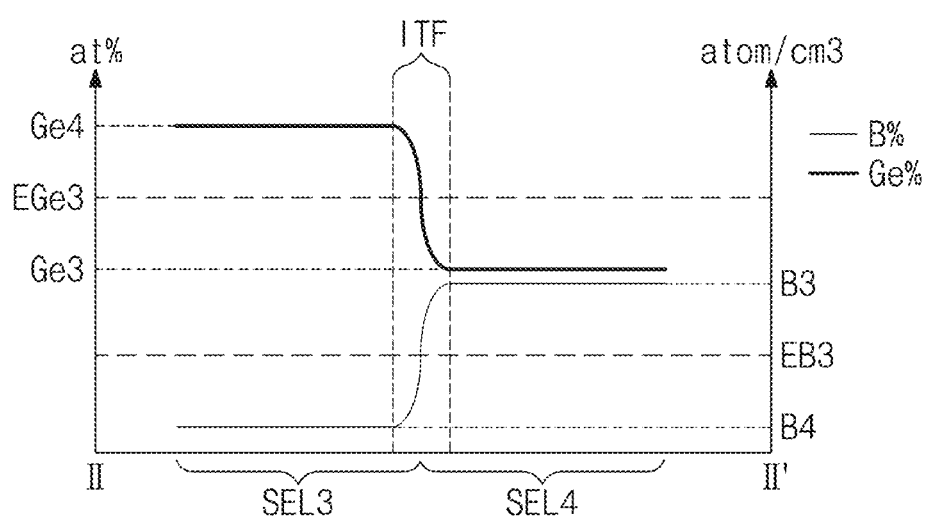
Figure 27A:
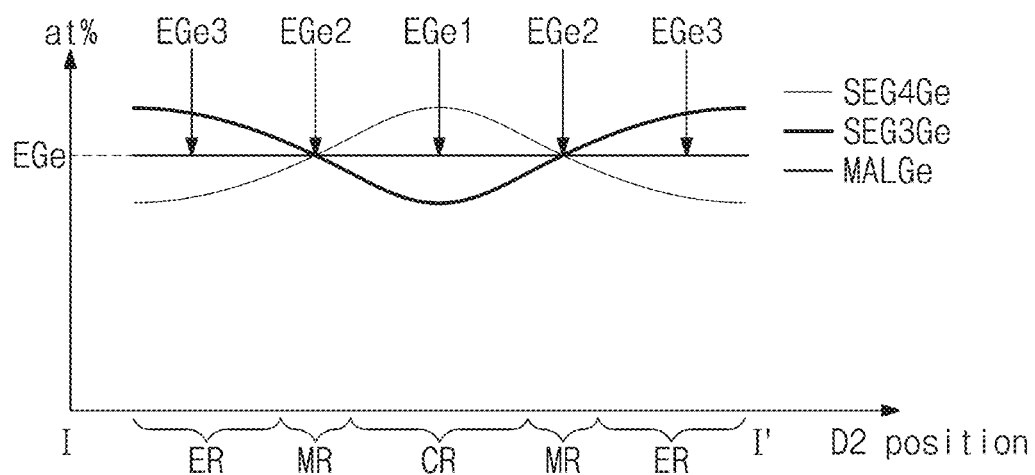
Figure 27B:
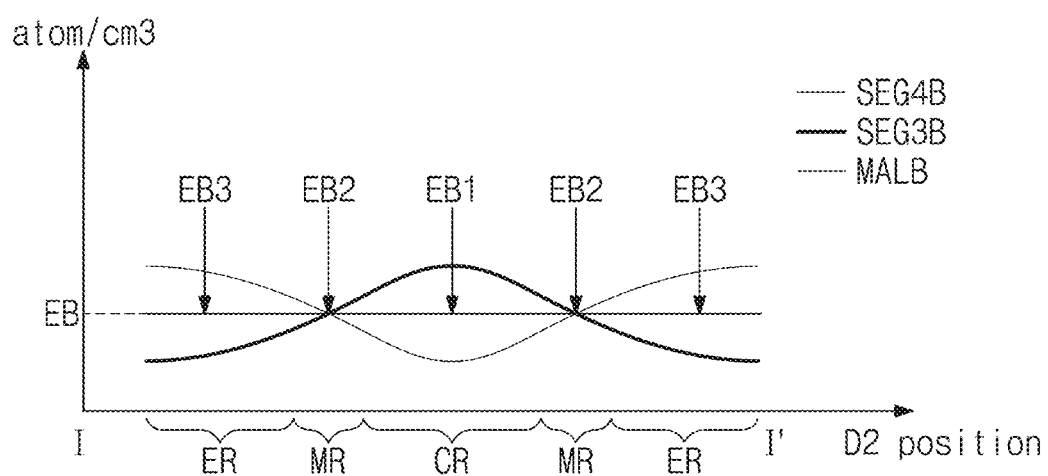

FIGS. 24A to 27B are diagrams illustrating an embodiment of inventive concepts. FIGS. 24A, 25A, and 26A are enlarged sectional views illustrating portions (e.g., 'M' of FIG. 6A) of the logic cells of the first, second, and third semiconductor chips of FIG. 1. FIGS. 24B, 25B, and 26B are graphs showing variations in germanium and impurity concentrations of third and fourth semiconductor layers, measured in a third direction along lines II-II' of FIGS. 24A, 25A, and 26A, respectively. FIG. 27A is a graph showing variations in germanium concentrations of third and fourth semiconductor layers, which are provided in semiconductor chips according to an embodiment of inventive concepts and are measured in a second direction along a line IT of FIG. 1. FIG. 27B is a graph showing variations in impurity concentrations of third and fourth semiconductor layers, which are provided in semiconductor chips according to an embodiment of inventive concepts and are measured in the second direction along the line IT of FIG. 1.

Figure 24B:
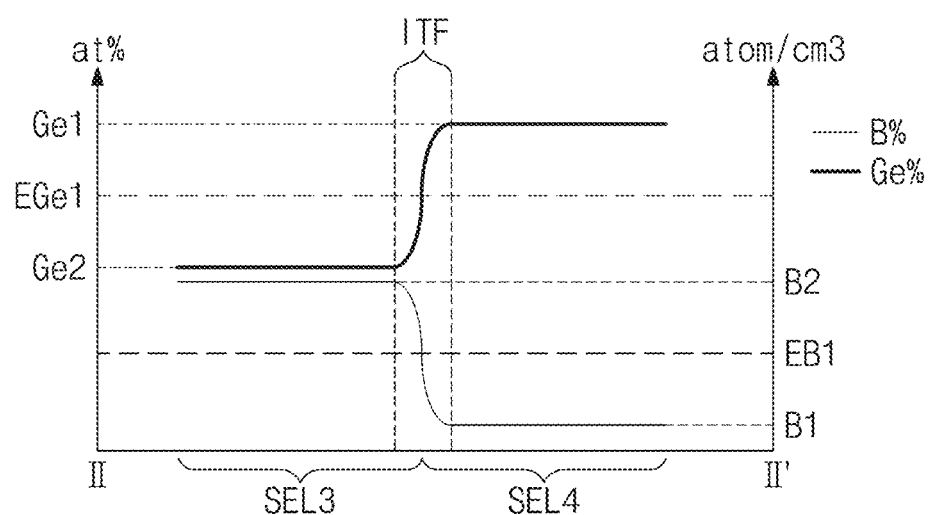

Referring to FIGS. 1, 24A, and 24B, for the first semiconductor chips A placed in the center region CR of the substrate 100, the germanium concentration of the third semiconductor layer SEL3 may be lower than the germanium concentration of the fourth semiconductor layer SEL4, and the impurity concentration of the third semiconductor layer SEL3 may be higher than the impurity concentration of the fourth semiconductor layer SEL4.

The germanium concentration of the third semiconductor layer SEL3 may be equal to the second germanium concentration Ge2 in FIG. 7B, and the germanium concentration of the fourth semiconductor layer SEL4 may be equal to the first germanium concentration Ge1 in FIG. 7B. For the first semiconductor chip A, a mean germanium concentration of the main layer MAL including the third and fourth semiconductor layers SEL3 and SEL4 may be equal to the first mean germanium concentration EGe1 in FIG. 7B.

The impurity concentration of the third semiconductor layer SEL3 may be equal to the second impurity concentration B2 in FIG. 7B, and the germanium concentration of the fourth semiconductor layer SEL4 may be equal to the first impurity concentration B1 in FIG. 7B. For the first semiconductor chip A, the mean impurity concentration of the main layer MAL including the third and fourth semiconductor layers SEL3 and SEL4 may be equal to the first mean impurity concentration EB1 in FIG. 7B.

Referring to FIGS. 1, 25A, and 25B, for the second semiconductor chips B placed in the middle region MR of the substrate 100, the germanium concentrations of the third and fourth semiconductor layers SEL3 and SEL4 may be equal to each other.

For the second semiconductor chip B, the mean germanium concentration of the main layer MAL including the third and fourth semiconductor layers SEL3 and SEL4 may be equal to the second mean germanium concentration EGe2 in FIG. 8B.

For the second semiconductor chip B, the mean impurity concentration of the main layer MAL including the third and fourth semiconductor layers SEL3 and SEL4 may be equal to the second mean impurity concentration EB2 in FIG. 8B.

Referring to FIGS. 1, 26A, and 26B, for the third semiconductor chips C placed in the edge region ER of the substrate 100, the germanium concentration of the third semiconductor layer SEL3 may be higher than the germanium concentration of the fourth semiconductor layer SEL4, and the impurity concentration of the third semiconductor layer SEL3 may be lower than the impurity concentration of the fourth semiconductor layer SEL4.

The germanium concentration of the third semiconductor layer SEL3 may be equal to the fourth germanium concentration Ge4 in FIG. 9B, and the germanium concentration of the fourth semiconductor layer SEL4 may be equal to the third germanium concentration Ge3 in FIG. 9B. For the third semiconductor chip C, the mean germanium concentration of the main layer MAL including the third and fourth semiconductor layers SEL3 and SEL4 may be equal to the third mean germanium concentration EGe3 in FIG. 9B.

The impurity concentration of the third semiconductor layer SEL3 may be equal to the fourth impurity concentration B4 in FIG. 9B, and the germanium concentration of the fourth semiconductor layer SEL4 may be equal to the third impurity concentration B3 in FIG. 9B. For the third semiconductor chip C, the mean impurity concentration of the main layer MAL including the third and fourth semiconductor layers SEL3 and SEL4 may be equal to the third mean impurity concentration EB3 in FIG. 9B.

Referring to FIGS. 1, 27A, the germanium concentration SEG3Ge of the third semiconductor layer SEL3 may have the lowest value at the center portion of the center region CR and may have the highest value at the edge portion of the edge region ER. The germanium concentration SEG3Ge of the third semiconductor layer SEL3 may be increased when measured along a path from the center portion of the center region CR to the edge portion of the edge region ER.

The germanium concentration SEG4Ge of the fourth semiconductor layer SEL4 may have the highest value at the center portion of the center region CR and may have the lowest value at the edge portion of the edge region ER. The germanium concentration SEG4Ge of the fourth semiconductor layer SEL4 may be decreased when measured along a path from the center portion of the center region CR to the edge portion of the edge region ER.

The mean germanium concentration MALGe of the main layer MAL including the third and fourth semiconductor layers SEL3 and SEL4 may be constantly maintained when measured along a path from the center portion of the center region CR to the edge portion of the edge region ER. In other words, the first mean germanium concentration EGe1 in the center region CR, the second mean germanium concentration EGe2 in the middle region MR, and the third mean germanium concentration EGe3 in the edge region ER may have substantially the same value.

Referring to FIGS. 1 and 27B, the impurity concentration SEG3B of the third semiconductor layer SEL3 may have the highest value at the center portion of the center region CR and may have the lowest value at the edge portion of the edge region ER. The impurity concentration SEG3B of the third semiconductor layer SEL3 may be decreased when measured along a path from the center portion of the center region CR to the edge portion of the edge region ER.

The impurity concentration SEG4B of the fourth semiconductor layer SEL4 may have the lowest value at the center portion of the center region CR and may have the highest value at the edge portion of the edge region ER. The impurity concentration SEG4B of the fourth semiconductor layer SEL4 may be increased when measured along a path from the center portion of the center region CR to the edge portion of the edge region ER.

The mean impurity concentration MALB of the main layer MAL including the third and fourth semiconductor layers SEL3 and SEL4 may be constantly maintained when measured along a path from the center portion of the center region CR to the edge portion of the edge region ER. In other words, the first mean impurity concentration EB1 in the center region CR, the second mean impurity concentration EB2 in the middle region MR, and the third mean impurity concentration EB3 in the edge region ER may have substantially the same value.

According to an embodiment of inventive concepts, mean values of germanium and impurity concentrations in a main layer of a source/drain pattern may be constantly maintained throughout the entire region of a substrate (e.g., from a center region to an edge region), and this may make it possible to improve electric characteristics of a semiconductor device.

While example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including a center region and an edge region;
a first active pattern on the center region and a second active pattern on the edge region;
a first channel pattern on the first active pattern and a second channel pattern on the second active pattern;
a first source/drain pattern connected to the first channel pattern and a second source/drain pattern connected to the second channel pattern; and
a first gate electrode on the first channel pattern and a second gate electrode on the second channel pattern, wherein
each of the first source/drain pattern and the second source/drain pattern include a buffer layer and a main layer on the buffer layer,
the buffer layer of the first source/drain pattern is in contact with the first channel pattern and the buffer layer of the second source/drain pattern is in contact with the second channel pattern,
in each of the first source/drain pattern and the second source/drain pattern, the main layer includes a first semiconductor layer and a second semiconductor layer on the first semiconductor layer,
the first semiconductor layer and the second semiconductor layer contain germanium,
a concentration of germanium in the first semiconductor layer on the center region is higher than a concentration of germanium in the first semiconductor layer on the edge region, and
a concentration of germanium in the second semiconductor layer on the center region is lower than a concentration of germanium in the second semiconductor layer on the edge region.

2. The semiconductor device of claim 1, wherein
the concentration of germanium in the first semiconductor layer on the center region ranges from 40 at % to 70 at %, and
the concentration of germanium in the first semiconductor layer on the edge region ranges from 30 at % to 60 at %.

3. The semiconductor device of claim 2, wherein
the concentration of germanium in the second semiconductor layer on the center region ranges from 30 at % to 60 at %, and
the concentration of germanium in the second semiconductor layer on the edge region ranges from 40 at % to 70 at %.

4. The semiconductor device of claim 1, wherein
the main layer on the center region has a first mean germanium concentration,
the main layer on the edge region has a second mean germanium concentration, and
the first mean germanium concentration is substantially equal to the second mean germanium concentration.

5. The semiconductor device of claim 1, wherein the first semiconductor layer and the second semiconductor layer contain an impurity,
a concentration of the impurity in the first semiconductor layer on the center region is lower than a concentration of the impurity in the first semiconductor layer on the edge region, and
a concentration of the impurity in the second semiconductor layer on the center region is higher than a concentration of the impurity in the second semiconductor layer on the edge region.

6. The semiconductor device of claim 5, wherein
the concentration of the impurity in the first semiconductor layer on the center region ranges from 1E18 atoms/cm$^3$ to 1E21 atoms/cm$^3$, and
the concentration of the impurity in the first semiconductor layer on the edge region ranges from 1E21 atoms/cm$^3$ to 5E22 atoms/cm$^3$.

7. The semiconductor device of claim 6, wherein
the concentration of the impurity in the second semiconductor layer on the center region ranges from 1E21 atoms/cm$^3$ to 5E22 atoms/cm$^3$, and
the concentration of the impurity in the second semiconductor layer on the edge region ranges from 1E18 atoms/cm$^3$ to 1E21 atoms/cm$^3$.

8. The semiconductor device of claim 5, wherein
the main layer on the center region has a first mean impurity concentration,
the main layer on the edge region has a second mean impurity concentration, and
the first mean impurity concentration is substantially equal to the second mean impurity concentration.

9. The semiconductor device of claim 5, wherein the impurity comprises boron, gallium, or indium.

10. A semiconductor device, comprising:
a substrate including a center region and an edge region;
a first active pattern on the center region and a second active pattern on the edge region;
a first channel pattern on the first active pattern and a second channel pattern on the second active pattern,
the first channel pattern and the second channel pattern each including a plurality of semiconductor patterns vertically stacked on each other and spaced apart from each other;
a first source/drain pattern connected to the plurality of semiconductor patterns of the first active pattern and a second source/drain pattern connected to the plurality of semiconductor patterns of the second active pattern; and
each of the first source/drain pattern and the second source/drain pattern including a buffer layer and a main layer on the buffer layer,
the buffer layer of the first source/drain pattern in contact with the first channel pattern and the buffer layer of the second source/drain pattern in contact with the second channel pattern,
the main layer of each of the first source/drain pattern and the second source/drain pattern including a first semiconductor layer and a second semiconductor layer on the first semiconductor layer,
the first semiconductor layer and the second semiconductor layer containing germanium, a concentration of germanium in the first semiconductor layer on the center region being lower than a concentration of germanium in the first semiconductor layer on the edge region, and a concentration of germanium in the second semiconductor layer on the center region being higher than a concentration of germanium in the second semiconductor layer on the edge region; and a gate electrode on the plurality of semiconductor patterns in a corresponding one of the first channel pattern and the second channel pattern, the gate electrode including a plurality of portions respectively provided between the plurality of semiconductor patterns in the corresponding one of the first channel pattern and the second channel pattern.

11. The semiconductor device of claim 10, wherein
the concentration of germanium in the first semiconductor layer on the center region ranges from 30 at % to 60 at %, and
the concentration of germanium in the first semiconductor layer on the edge region ranges from 40 at % to 70 at %.

12. The semiconductor device of claim 11, wherein
the concentration of germanium in the second semiconductor layer on the center region ranges from 40 at % to 70 at %, and
the concentration of germanium in the second semiconductor layer on the edge region ranges from 30 at % to 60 at %.

13. The semiconductor device of claim 10, wherein
the main layer on the center region has a first mean germanium concentration,
the main layer on the edge region has a second mean germanium concentration, and
the first mean germanium concentration is substantially equal to the second mean germanium concentration.

14. The semiconductor device of claim 10, wherein
in the main layer in each of the first channel pattern and the second channel pattern, the first semiconductor layer and the second semiconductor layer contain an impurity,
a concentration of the impurity in the first semiconductor layer on the center region is higher than a concentration of the impurity in the first semiconductor layer on the edge region, and
a concentration of the impurity in the second semiconductor layer on the center region is lower than a concentration of the impurity in the second semiconductor layer on the edge region.

15. The semiconductor device of claim 14, wherein
the main layer on the center region has a first mean impurity concentration,
the main layer on the edge region has a second mean impurity concentration, and
the first mean impurity concentration is substantially equal to the second mean impurity concentration.

16. The semiconductor device of claim 14, wherein the impurity comprises boron, gallium, or indium.

17. A method of fabricating a semiconductor device, comprising:
forming a stacking pattern on a substrate, the substrate including a center region and an edge region, the stacking pattern including active layers and sacrificial layers that are alternately stacked;
forming a sacrificial pattern on the stacking pattern;
forming a recess in the stacking pattern by etching the stacking pattern adjacent to one side of the sacrificial pattern;
forming a source/drain pattern in the recess, the forming the source/drain pattern including forming a buffer layer on an inner surface of the recess, forming a first semiconductor layer by performing a first selective epitaxial growth (SEG) process on the buffer layer, and forming a second semiconductor layer by performing a second SEG process on the first semiconductor layer; and
replacing the sacrificial pattern and the sacrificial layers with a gate electrode, wherein
a concentration of germanium in the first semiconductor layer is higher on the center region than on the edge region, and
a concentration of germanium of the second semiconductor layer is lower on the center region than on the edge region.

18. The method of claim 17, wherein
the first semiconductor layer and the second semiconductor layer constitute a main layer, and
a mean germanium concentration of the main layer has substantially a same value on the center region and the edge region.

19. The method of claim 17, wherein
an impurity concentration of the first semiconductor layer is lower on the center region than on the edge region, and
an impurity concentration of the second semiconductor layer is higher on the center region than on the edge region.

20. The method of claim 19, wherein
the first semiconductor layer and the second semiconductor layer constitute a main layer, and
a mean impurity concentration of the main layer has substantially a same value on the center region and the edge region.

* * * * *